United States Patent
Liu et al.

(10) Patent No.: US 12,456,423 B2
(45) Date of Patent: Oct. 28, 2025

(54) DISPLAY PANEL AND DEVICE WITH METAL SIGNAL LINES IN DISPLAY REGION OVERLAPPED WITH OPTICAL SENSOR

(71) Applicants: Chengdu BOE Optoelectronics Technology Co., Ltd., Sichuan (CN); BOE Technology Group Co., Ltd., Beijing (CN)

(72) Inventors: Changchang Liu, Beijing (CN); Yang Yao, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/293,776

(22) PCT Filed: May 10, 2023

(86) PCT No.: PCT/CN2023/093137
§ 371 (c)(1),
(2) Date: Jan. 31, 2024

(87) PCT Pub. No.: WO2024/229727
PCT Pub. Date: Nov. 14, 2024

(65) Prior Publication Data
US 2025/0124860 A1  Apr. 17, 2025

(51) Int. Cl.
*G09G 3/32* (2016.01)
*G09G 3/3233* (2016.01)
(Continued)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ......... G09G 3/3233; G09G 2300/0426; G09G 2300/0452; G09G 2300/0819;
(Continued)

(56) References Cited

U.S. PATENT DOCUMENTS

2021/0065625 A1* 3/2021 Wang .................... G09G 3/2003
2023/0052376 A1* 2/2023 Shin ........................ H10K 59/65
(Continued)

FOREIGN PATENT DOCUMENTS

CN 108287428 A 7/2018
CN 113053982 A 6/2021
(Continued)

*Primary Examiner* — Liliana Cerullo
(74) *Attorney, Agent, or Firm* — XSENSUS LLP

(57) ABSTRACT

Provided is a display panel. The display panel includes a base substrate provided with a first display region; a plurality of pixel circuit groups disposed in the pixel circuit regions, wherein each pixel circuit group includes a plurality of pixel circuits and first signal lines of a plurality of types, a minimum distance between adjacent pixel circuit groups is greater than a minimum distance between adjacent pixel circuits in the pixel circuit group; the first signal lines of some types include metal signal lines, and the first signal lines of other types include transparent signal lines; and a plurality of light-emitting units, wherein an orthographic projection of at least part of the light-emitting units onto the base substrate is overlapped with orthographic projections of at least part of line segments in the first signal lines of the plurality of types onto the base substrate.

19 Claims, 64 Drawing Sheets

(51) Int. Cl.
   *H10K 59/121* (2023.01)
   *H10K 59/131* (2023.01)
   *H10K 59/65* (2023.01)

(52) U.S. Cl.
   CPC ..... *H10K 59/65* (2023.02); *G09G 2300/0426* (2013.01); *G09G 2300/0452* (2013.01); *G09G 2300/0819* (2013.01); *G09G 2300/0842* (2013.01); *G09G 2300/0861* (2013.01)

(58) Field of Classification Search
   CPC ... G09G 2300/0842; G09G 2300/0861; H10K 59/1213; H10K 59/131; H10K 59/65
   See application file for complete search history.

(56) References Cited

U.S. PATENT DOCUMENTS

| | | |
|---|---|---|
| 2023/0067816 A1* | 3/2023 | Bok .................. G06V 40/1306 |
| 2023/0091142 A1 | 3/2023 | Huang et al. |
| 2023/0269985 A1 | 8/2023 | Chen et al. |

FOREIGN PATENT DOCUMENTS

| CN | 113764461 A | 12/2021 |
|---|---|---|
| CN | 114639698 A | 6/2022 |
| CN | 114914281 A | 8/2022 |
| CN | 115020461 A | 9/2022 |
| KR | 2015-0015606 A | 2/2015 |

* cited by examiner c a+b+c d e

L3 a+b+c+d+e+f+g a+b+c+d+e+f+g+h a+b+c+d+e+f+g+h+i+k+m a+b+c+d+e+f+g+h+i+k+m+n+p a+b+c+d+e+f+g+h+i+k+m+n+p+q+r+Anode layer a+b+c d a+b+c+d a+b+c+d+e+f a+b+c+d+e+f+g a+b+c+d+e+f+g+h+i+n+p a+b+c+d+e+f+g+h+i+n+p+q a+b+c+d+e+f+g+h+i+n+p+q+r a+b+c+d+e+f+g+h+i+n+p+q+r+Anode layer

DISPLAY PANEL AND DEVICE WITH METAL SIGNAL LINES IN DISPLAY REGION OVERLAPPED WITH OPTICAL SENSOR

CROSS-REFERENCE TO RELATED APPLICATION

The present disclosure is a U.S. national stage of international application No. PCT/CN2023/093137, filed on May 10, 2023, the disclosure of which is herein incorporated by reference in its entirety.

TECHNICAL FIELD

The present disclosure relates to the field of display technologies and particularly relates to a display panel and a display device.

BACKGROUND

Organic light-emitting diode (OLED) display panels have been widely used due to their advantages of self-luminescence, low driving voltages, fast response, and the like.

SUMMARY

Embodiments of the present disclosure provide a display panel and a display device. The technical solutions are as follows.

According to some embodiments of the present disclosure, a display panel is provided. The display panel includes:
  a base substrate provided with a first display region, wherein the first display region includes a plurality of pixel circuit regions and a light-transmitting region;
  a plurality of pixel circuit groups disposed in the plurality of pixel circuit regions, wherein each pixel circuit group includes a plurality of pixel circuits and first signal lines of a plurality of types connected to the plurality of pixel circuits, a minimum distance between adjacent pixel circuit groups is greater than a minimum distance between adjacent pixel circuits in the pixel circuit group, the first signal lines of some types in the first signal lines of the plurality of types include metal signal lines, the first signal lines of other types include transparent signal lines, and at least part of line segments in the first signal lines of the plurality of types are disposed in the light-transmitting region; and
  a plurality of light-emitting units disposed in the first display region, wherein the plurality of pixel circuit groups is configured to drive the plurality of light-emitting units to emit light, and orthographic projections of at least part of the plurality of light-emitting units onto the base substrate are overlapped with orthographic projections, onto the base substrate, of the at least part of line segments in the first signal lines of the plurality of types disposed in the light-transmitting region.

In some possible embodiments, at least part of line segments in the metal signal lines are disposed in the light-transmitting region, and the orthographic projections of at least part of the plurality of light-emitting units onto the base substrate are overlapped with orthographic projections of at least part of the line segments in the metal signal lines onto the base substrate.

In some possible embodiments, at least part of line segments in the transparent signal lines are disposed in the light-transmitting region, and the orthographic projections of at least part of the plurality of light-emitting units onto the base substrate are overlapped with orthographic projections of at least part of the line segments in the transparent signal lines onto the base substrate.

In some possible embodiments, the plurality of pixel circuit groups includes a plurality of first pixel circuit groups and a plurality of second pixel circuit groups, the plurality of first pixel circuit groups is arranged in rows, and the plurality of second pixel circuit groups is arranged in rows; one row of the second pixel circuit group is arranged between any two adjacent rows of the first pixel circuit groups; and in any row of the first pixel circuit group and one row of the second pixel circuit group adjacent to the row of the first pixel circuit group, an interval region between any two adjacent first pixel circuit groups corresponds to one second pixel circuit group.

In some possible embodiments, each of the pixel circuit groups includes at least one pixel circuit unit, each pixel circuit unit includes one first pixel circuit, one second pixel circuit and one third pixel circuit, and the second pixel circuit is disposed between the first pixel circuit and the third pixel circuit;
  each of the light-emitting units includes one first light-emitting element, two second light-emitting elements and one third light-emitting element;
  the first light-emitting element is connected to the first pixel circuit, and an orthographic projection of an anode of the first light-emitting element onto the base substrate is at least partially overlapped with an orthographic projection, onto the base substrate, of the pixel circuit group where the first pixel circuit is disposed;
  the two second light-emitting elements are both connected to the second pixel circuit, and orthographic projections of anodes of the two second light-emitting elements onto the base substrate are disposed on two opposite sides of an orthographic projection, onto the base substrate, of the pixel circuit group where the second pixel circuit is disposed, respectively; and
  the third light-emitting element is connected to the third pixel circuit, and an orthographic projection of an anode of the third light-emitting element onto the base substrate is at least partially overlapped with an orthographic projection, onto the base substrate, of the pixel circuit group where the third pixel circuit is disposed.

In some possible embodiments, the orthographic projection of the anode of the first light-emitting element onto the base substrate is disposed within the orthographic projection, onto the base substrate, of the pixel circuit group where the first pixel circuit is disposed;
  the orthographic projections of the anodes of the two second light-emitting elements onto the base substrate are not overlapped with an orthographic projection, onto the base substrate, of the pixel circuit group where the second pixel circuit is disposed; and
  the orthographic projection of the anode of the third light-emitting element onto the base substrate is disposed within the orthographic projection, onto the base substrate, of the pixel circuit group where the third pixel circuit is disposed.

In some possible embodiments, the first light-emitting element, the second light-emitting element, and the third light-emitting element are a blue light-emitting element, a green light-emitting element, and a red light-emitting element, respectively, and the first pixel circuit, the second pixel circuit and the third pixel circuit of the pixel circuit unit in the first pixel circuit group are a pixel circuit for driving the blue light-emitting element, a pixel circuit for driving the green light-emitting element and a pixel circuit for driving the red light-emitting element, respectively; and the first pixel circuit, the second pixel circuit, and the third pixel circuit of the pixel circuit unit in the second pixel circuit group are a pixel circuit for driving the blue light-emitting element, a pixel circuit for driving the green light-emitting element, and a pixel circuit for driving the red light-emitting element, respectively; or, the first pixel circuit, the second pixel circuit, and the third pixel circuit of the pixel circuit unit in the second pixel circuit group are a pixel circuit for driving the red light-emitting element, a pixel circuit for driving the green light-emitting element, and a pixel circuit for driving the blue light-emitting element, respectively.

In some possible embodiments, each of the metal signal lines in the first signal lines includes a first portion, a second portion, and a third portion disposed between the first portion and the second portion, and two ends of the third portion are connected to the first portion and the second portion, respectively; and the first portion and the second portion are connected to pixel circuits in two adjacent pixel circuit groups, respectively, and an orthographic projection of the third portion onto the base substrate is at least partially overlapped with the orthographic projections of the anodes of the second light-emitting elements onto the base substrate.

In some possible embodiments, the orthographic projection of the anode of one of the second light-emitting elements onto the base substrate is at least partially overlapped with orthographic projections of the third portions of at least two of the metal signal lines onto the base substrate, and overlapping portions between the third portions of the at least two metal signal lines and the anode of the second light-emitting element are arranged symmetrically along a symmetry axis of the anode of the second light-emitting element.

In some possible embodiments, shapes of the anodes of the first light-emitting element, the second light-emitting element, and the third light-emitting element are all circular.

In some possible embodiments, the anodes of the two second light-emitting elements are connected by a first connecting line, and the first connecting line is connected to the second pixel circuit.

In some possible embodiments, types of the first signal lines include a first reset signal line, a second reset signal line, a first reset power supply line, a second reset power supply line, a third reset power supply line, a first gate signal line, a second gate signal line, a data signal line, a light emission control signal line, and a driving power supply line;

each of the pixel circuits includes:

a first transistor, wherein a gate of the first transistor is connected to the first reset signal line, a first pole of the first transistor is connected to the first reset power supply line, and a second pole of the first transistor is connected to a first node;

a second transistor, wherein a gate of the second transistor is connected to the first gate signal line, a first pole of the second transistor is connected to the first node, and a second pole of the second transistor is connected to a second node;

a third transistor, wherein a gate of the third transistor is connected to the second node, a first pole of the third transistor is connected to the first node, and a second pole of the third transistor is connected to a third node;

a fourth transistor, wherein a gate of the fourth transistor is connected to the second gate signal line, a first pole of the fourth transistor is connected to the data signal line, and a second pole of the fourth transistor is connected to the third node;

a fifth transistor, wherein a gate of the fifth transistor is connected to the light emission control signal line, a first pole of the fifth transistor is connected to the third node, and a second pole of the fifth transistor is connected to the driving power supply line;

a sixth transistor, wherein a gate of the sixth transistor is connected to the light emission control signal line, a first pole of the sixth transistor is connected to the first node, and a second pole of the sixth transistor is connected to an anode of a light-emitting element;

a seventh transistor, wherein a gate of the seventh transistor is connected to the second reset signal line, a first pole of the seventh transistor is connected to the second reset power supply line, and a second pole of the seventh transistor is connected to the anode of the light-emitting element;

an eighth transistor, wherein a gate of the eighth transistor is connected to the second reset signal line, a first pole of the eighth transistor is connected to the third reset power supply line, and a second pole of the eighth transistor is connected to the third node; and a storage capacitor, wherein two ends of the storage capacitor are connected to the driving power supply line and the second node, respectively.

In some possible embodiments, the second transistor is an N-type transistor, and the first transistor, the third transistor, the fourth transistor, the fifth transistor, the sixth transistor, the seventh transistor, and the eighth transistor are all P-type transistors.

In some possible embodiments, the second transistor is an oxide thin-film transistor, and the first transistor, the third transistor, the fourth transistor, the fifth transistor, the sixth transistor, the seventh transistor, and the eighth transistor are all low-temperature polysilicon thin-film transistors.

In some possible embodiments, each pixel circuit unit corresponds to two first reset power supply lines, three second reset power supply lines, and one third reset power supply line;

for each pixel circuit unit, orthographic projections of the two first reset power supply lines onto the base substrate are at least partially overlapped with an orthographic projection of the first pixel circuit onto the base substrate and an orthographic projection of the third pixel circuit onto the base substrate, respectively, and the two first reset power supply lines are connected to the first pixel circuit and the third pixel circuit, respectively; the two first reset power supply lines are connected by a second connecting line, and the second connecting line is connected to the second pixel circuit, wherein an extending direction of the second connecting line is perpendicular to an extending direction of the first reset power supply lines;

orthographic projections of the three second reset power supply lines onto the base substrate are at least partially overlapped with the orthographic projection of the first pixel circuit onto the base substrate, the orthographic projection of the second pixel circuit onto the base substrate, and the orthographic projection of the third pixel circuit onto the base substrate, respectively, and the three second reset power supply lines are connected to the first pixel circuit, the second pixel circuit and the third pixel circuit, respectively; and an orthographic projection of the third reset power supply line onto the base substrate is at least partially overlapped with the orthographic projection of the second pixel circuit onto the base substrate, and the third reset power supply line is connected to the second pixel circuit, and is connected to the first pixel circuit and the third pixel circuit by a third connecting line, wherein an extending direction of the third connecting line is perpendicular to an extending direction of the third reset power supply line.

In some possible embodiments, the three second reset power supply lines are connected by a fourth connecting line, wherein an extending direction of the fourth connecting line is perpendicular to an extending direction of the second reset power supply lines.

In some possible embodiments, in arrangement directions of the first pixel circuit, the second pixel circuit, and the third pixel circuit, an orientation of the first pixel circuit faces an orientation of the second pixel circuit;

each pixel circuit unit corresponds to two driving power supply lines; and for each of the pixel circuit units, an orthographic projection of one of the driving power supply lines onto the base substrate is at least partially overlapped with the orthographic projection of the first pixel circuit onto the base substrate and the orthographic projection of the second pixel circuit onto the base substrate, and the driving power supply line is connected to the first pixel circuit and the second pixel circuit; and an orthographic projection of another driving power supply line onto the base substrate is at least partially overlapped with the orthographic projection of the third pixel circuit onto the base substrate, and the another driving power supply line is connected to the third pixel circuit.

In some possible embodiments, the two driving power supply lines are connected by a fifth connecting line, wherein an extending direction of the fifth connecting line is perpendicular to an extending direction of the driving power supply lines.

In some possible embodiments, types of the first signal lines include at least two of a gate signal line, a light emission control signal line, a first reset signal line, a second reset signal line, a data signal line, a reset power supply line, and a driving power supply line.

In some possible embodiments, the first signal lines of some types include at least one of a data signal line, a gate signal line, and a light emission control signal line.

In some possible embodiments, each first signal line in the first signal lines of some types is the metal signal line.

In some possible embodiments, each first signal line in the first signal lines of some types includes the metal signal line and the transparent signal line connected in parallel.

In some possible embodiments, the base substrate is further provided with a second display region adjacent to the first display region;

the display panel further includes second signal lines of a plurality of types disposed in the second display region; and for each type of a first reset signal line, a second reset signal line, a first reset power supply line, a second reset power supply line, a third reset power supply line, a first gate signal line, a second gate signal line, a data signal line, a light emission control signal line and a driving power supply line, at least one end of each second signal line of the type is connected to the first signal line of the type, wherein the second signal line is a metal signal line, and a width of the metal signal line included in the first signal line is less than a width of the second signal line.

In some possible embodiments, each of the metal signal lines is disposed at a gate layer or a source-drain layer.

According to some embodiments of the present disclosure, a display device is provided. The display device includes an optical sensor and the display panel according to any one of the above embodiments, wherein an orthogonal projection of the optical sensor onto the display panel is at least partially overlapped with a first display region in the display panel.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and those skilled in the art may still derive other drawings from these accompanying drawings without creative efforts.

DETAILED DESCRIPTION

For clearer descriptions of the objectives, technical solutions, and advantages of the present disclosure, the embodiments of the present disclosure are described in detail hereinafter with reference to the accompanying drawings.

A display panel is provided according to the embodiments of the present disclosure. The display panel includes a base substrate 1, a plurality of pixel circuit groups 2, first signal lines 3 of a plurality of types and a plurality of light-emitting units.

Figure 1:
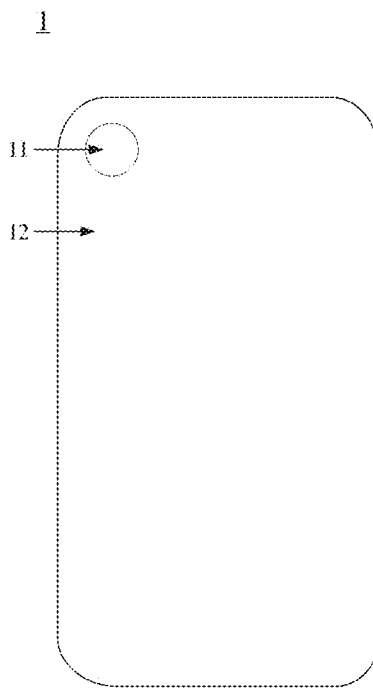
FIG. 1 is a top view of a display panel according to some embodiments of the present disclosure.

As shown in FIG. 1, the base substrate 1 is provided with a first display region 11, in which an optical sensor is provided. In some embodiments, the optical sensor is a front camera, and the first display region 11 is a full display with camera (FDC) region. The base substrate 1 is further provided with a second display region 12 adjacent to the first display region 11. In some embodiments, the second display region 12 is a display region other than the first display region 11 in the base substrate 1.

The first display region 11 includes a plurality of pixel circuit regions 111 and a light-transmitting region 112. A pixel circuit group 2 is provided in each pixel circuit region 111. The light-transmitting region 112 is a region without the pixel circuit group 2 and has a light transmittance higher than that of the pixel circuit regions 111.

Figure 2:
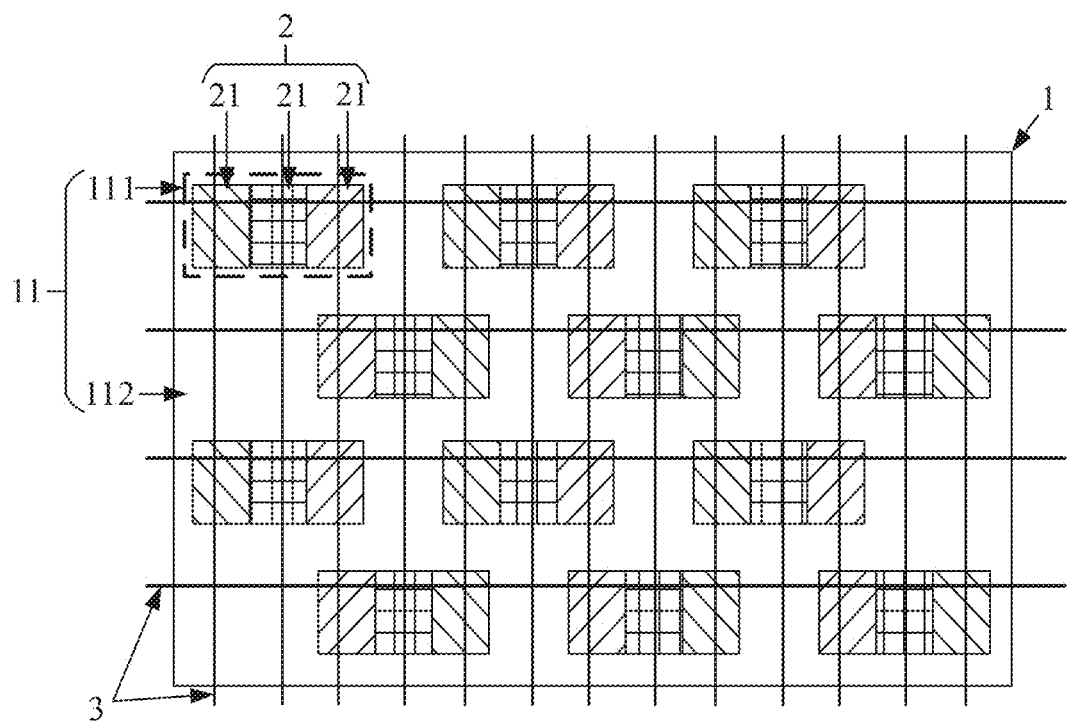
FIG. 2 is a schematic partial structural diagram of a first display region according to some embodiments of the present disclosure.

The plurality of pixel circuit groups 2 is disposed in the plurality of pixel circuit regions 111 in the first display region 11. As shown in FIG. 2, each pixel circuit group 2 includes a plurality of pixel circuits 21, and the minimum distance between adjacent pixel circuit groups 2 is greater than that between adjacent pixel circuits 21 in the pixel circuit group 2. In this way, compared with an arrangement mode that a plurality of pixel circuits is uniformly arranged in the second display region 12, gathering the plurality of pixel circuits 21 together in the first display region 11 to form the pixel circuit group 2 can reduce an area occupied by the plurality of pixel circuits 21, such that an area of the light-transmitting region 112 in the first display region 11 is increased, thereby improving the light transmittance of the first display region 11.

Figure 3:
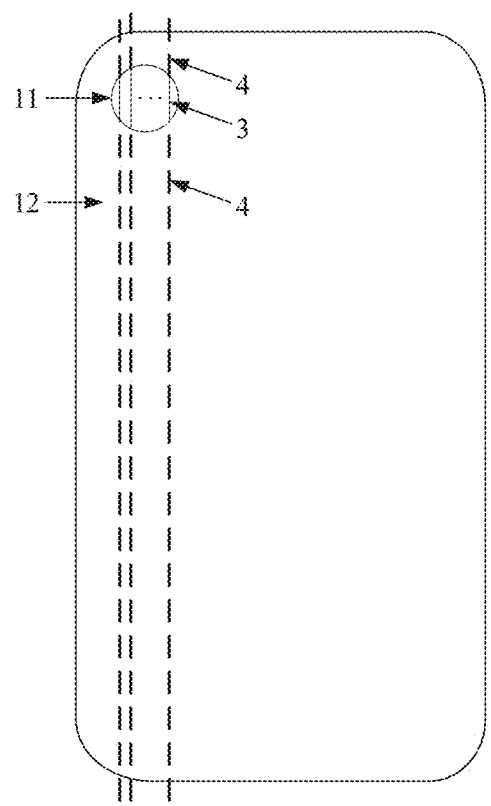
FIG. 3 is a schematic partial structural diagram of a first signal line and a second signal line according to some embodiments of the present disclosure.
Figure 4:
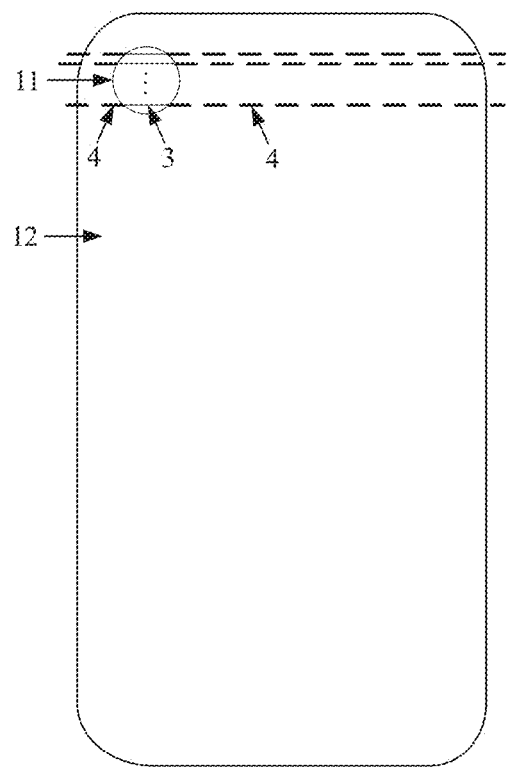
FIG. 4 is a schematic partial structural diagram of a first signal line and a second signal line according to some embodiments of the present disclosure.

First signal lines 3 of a plurality of types are connected to the pixel circuits 21 disposed in the first display region 11, so as to transmit signals to the pixel circuits 21. As shown in FIGS. 3 and 4, the display panel further includes second signal lines 4 of a plurality of types disposed in the second display region 12 besides the first signal lines 3 connected to the pixel circuits 21 disposed in the first display region 11. The second signal lines 4 are connected to the plurality of pixel circuits disposed in the second display region 12. For each type, such as a first reset signal line Preset, a second reset signal line Preset_H, a first reset power supply line vinit1, a second reset power supply line vinit2, a third reset power supply line vinit3, a first gate signal line Gate_N, a second gate signal line Gate_P, a data signal line Data, a light emission control signal line EM and a driving power supply line VDD, at least one end of each second signal line 4 of the type is connected to the first signal line 3 of this type. The second signal line 4 is configured to transmit a signal to the pixel circuit connected to the second signal line 4, and meanwhile, is also configured to transmit the signal to the first signal line 3 connected to the second signal line. After receiving the signal, the first signal line 3 transmits the signal to the pixel circuit 21 connected to the first signal line 3 and disposed in the first display region 11.

In some embodiments, the types of the first signal lines include at least two of the gate signal line Gate, the light emission control signal line EM, the first reset signal line Preset, the second reset signal line Preset_H, the data signal line Data, the reset power supply line vinit and the driving power supply line VDD. The data signal line Data, the reset power supply line vinit, and the driving power supply line VDD are vertical first signal lines 3 as shown in FIG. 3, and the gate signal line Gate, the light emission control signal line EM, the first reset signal line Preset and the second reset signal line Preset_H are horizontal first signal lines 3 as shown in FIG. 4.

The plurality of light-emitting units are disposed in the first display region 11, and the plurality of pixel circuit groups 2 is configured to drive the plurality of light-emitting units to emit light. In some embodiments, each light-emitting unit is electrically connected to one pixel circuit 21 in the pixel circuit group 2, and the pixel circuit 21 is configured to drive the light-emitting unit to emit light.

An orthographic projection of at least part of the light-emitting units in the plurality of light-emitting units onto the base substrate 1 is overlapped with an orthographic projection of at least part of line segments in the first signal lines 3 of the plurality of types disposed in the light-transmitting region 112 onto the base substrate 1. In this way, the shielding area of the light-emitting units and the first signal lines 3 to the light-transmitting region 112 is reduced, thereby improving the light transmittance of the first display region 11.

In some embodiments, the light-emitting units are disposed in the pixel circuit regions 111 or the light-transmitting region 112; or, one part of the light-emitting units are disposed in the pixel circuit regions 111 and the other part of the light-emitting units are disposed in the light-transmitting region 112, which is not limited in the embodiments of the present disclosure.

In the display panel in the related art, signal lines connected to pixel circuits in the FDC region are all transparent signal lines, and signal lines in a display region other than the FDC region are all metal signal lines. Since the resistance of the transparent signal line is far greater than that of the metal signal line, the difference value between the resistances of the transparent signal line and the metal signal line is relatively large. As a result, via hole defects around the FDC region are relatively obvious, causing uneven display of the display panel.

However, in the embodiments of the present disclosure, the first signal lines 3 of some types in the first display region 11 include metal signal lines, and the resistance of first signal lines 3 of these types is reduced by the metal signal lines, such that a difference value between the resistance of the first signal lines 3 and the resistance of the second signal lines 4 in the second display region 12 is reduced, thereby reducing via hole defects around the first display region 11 and improving the display uniformity of the display panel.

In the embodiments of the present disclosure, the resistance of the first signal lines 3 is reduced by setting the first signal line 3 to include the metal signal lines, and there are many ways to set the metal signal lines, two of which are introduced as examples below.

In the first mode of setting the metal signal lines, each first signal line 3 in the first signal lines 3 of some types is the metal signal line.

During implementation, in the first signal lines 3 of the plurality of types, the first signal lines 3 of some types that have a relatively great influence on the display brightness are set as the metal signal lines, and the rest of the first signal lines 3 are set as transparent signal lines. In this way, the difference value between the resistance of the first signal lines 3 of these types and the resistance of the second signal lines 4 connected to the first signal lines 3 is smaller, even reduced to zero, such that the light transmittance of the first display region 11 is improved, and meanwhile, the via hole defects around the first display region 11 are effectively reduced, thereby improving the display uniformity.

In a second mode of setting the metal signal lines, each first signal line 3 in the first signal lines 3 of some types includes the metal signal line and a transparent signal line connected in parallel.

During implementation, in the first signal lines 3 of the plurality of types, the first signal lines 3 of some types that have a relatively great influence on the display luminance are set as the metal signal lines and the transparent signal lines connected in parallel. That is, the first signal line 3 is connected to the pixel circuit 21 by using the transparent signal line, and meanwhile, the first signal line 3 is connected to the same pixel circuit 21 by using the metal signal line, such that the parallel connection between the transparent signal line and the metal signal line can be achieved. The resistance of the transparent signal line is reduced by the metal signal line, such that the difference value between the resistance of the first signal line 3 and the resistance of the second signal line 4 connected to the first signal line 3 is reduced, thereby reducing the via hole defects around the first display region 11.

In some embodiments, in order to improve the light transmittance of the first display region 11, the space occupied by the pixel circuit groups is reduced as much as possible. When the space occupied by the pixel circuit groups is relatively small, the width of each metal signal line included in the above the first signal lines 3 of some types is reduced to be smaller than the width of the second signal line 4, thereby ensuring the light transmittance of the first display region 11.

In this case, connecting the metal signal line with the slightly smaller width in parallel with the transparent signal line also reduces the resistance of the first signal line 3 to some extent, such that the difference value between the resistance of the first signal line 3 and the resistance of the second signal line 4 connected to the first signal line 3 is reduced, thereby reducing the via hole defects around the first display region 11.

In some embodiments, the material of the transparent signal line in the embodiments of the present disclosure is a conductive transparent material, such as indium tin oxide (ITO).

In the present disclosure, the type of the first signal line 3 including the metal signal line is a type that has a relatively great influence on the display brightness, and includes a vertical signal line or a horizontal signal line.

In some embodiments, the first signal lines 3 of some types may include at least one of the data signal line Data, the gate signal line Gate and the light emission control signal line EM.

The data signal line Data is a vertical signal line that has a relatively great influence on the display brightness. Therefore, if the data signal line Data in the first display region 11 is set to include the metal signal line, via hole defects in the vertical direction of the first display region 11 can be effectively reduced.

The gate signal line Gate and the light emission control signal line EM are horizontal signal lines that have a relatively great influence on the display brightness. During setting, only the gate signal line Gate in the first display region 11 is set to include the metal signal line, the light emission control signal line EM in the first display region 11 is also set to include the metal signal line, or both the gate signal line Gate and the light emission control signal line EM in the first display region 11 are set to include the metal signal lines, such that the via hole defects in the lateral direction of the first display region 11 can be reduced.

In the embodiments of the present disclosure, the first signal lines 3 are arranged in multiple ways. In some embodiments, at least part of line segments of the metal signal lines included in the first signal lines 3 are disposed in the light-transmitting region 112, and the orthographic projection of at least part of the light-emitting units onto the base substrate 1 is overlapped with an orthographic projection of at least part of the line segments in the metal signal lines onto the base substrate 1.

The metal signal lines and part of the light-emitting units shield the light-transmitting region 112, which reduces the light transmittance of the light-transmitting region 112. However, in the embodiments of the present disclosure, part of the line segments of the metal signal lines disposed in the light-transmitting region 112 and at least part of the light-emitting units are arranged in the same region, such that the light transmittance of the light-transmitting region 112 is improved.

In some embodiments, at least part of line segments of the transparent signal lines included in the first signal lines 3 are disposed in the light-transmitting region 112, and the orthographic projection of at least part of the light-emitting units onto the base substrate 1 is overlapped with an orthographic projection of at least part of the line segments in the transparent signal lines onto the base substrate 1. Similarly, part of the line segments of the transparent signal lines disposed in the light-transmitting region 112 and at least part of the light-emitting units are arranged in the same region, such that the light transmittance of the light-transmitting region 112 is improved.

Figure 5:
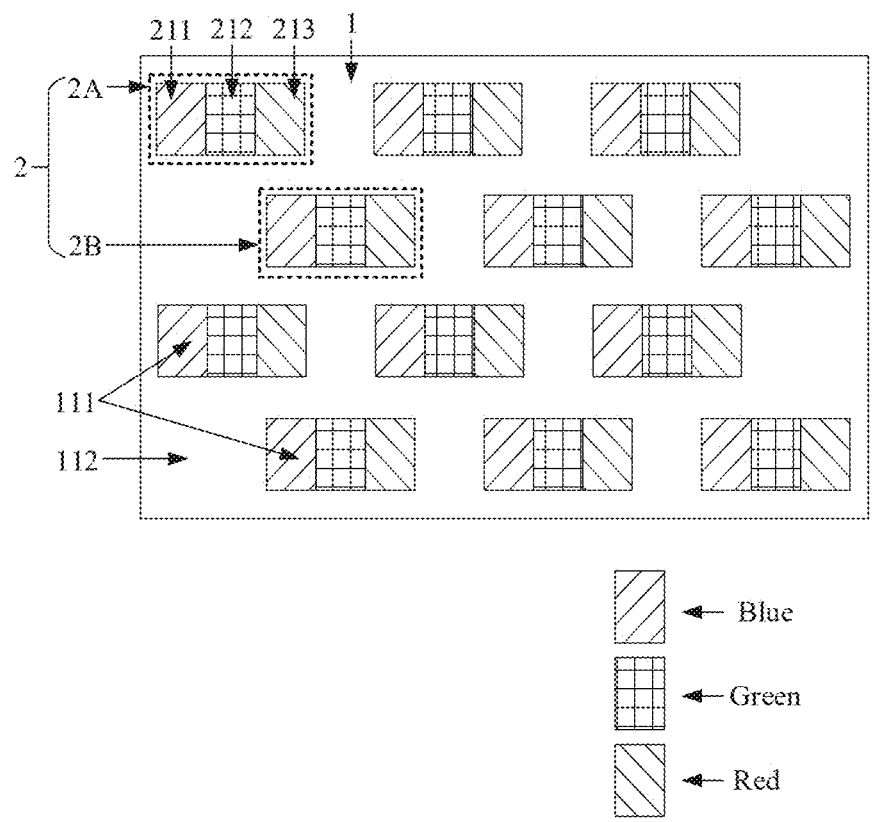
FIG. 5 is a schematic partial structural diagram of a first display region according to some embodiments of the present disclosure.

FIG. 5 is a schematic partial structural diagram of a plurality of pixel circuit groups 2 in a first display region 11 according to some embodiments of the present disclosure. Referring to FIG. 5, in the embodiment of the present disclosure, the plurality of pixel circuit groups 2 includes a plurality of first pixel circuit groups 2A and a plurality of second pixel circuit groups 2B. The plurality of first pixel circuit groups 2A is arranged in rows, and each row of the first pixel circuit group 2A includes a plurality of pixel circuits 21. The plurality of second pixel circuit groups 2B is arranged in rows, and each row of the second pixel circuit group 2B also includes a plurality of pixel circuits 21.

One row of second pixel circuit group 2B is arranged between any two adjacent rows of the first pixel circuit groups 2A. That is, in two adjacent rows of the pixel circuit groups 2 in the first display region 11, one row of the pixel circuit group 2 is the first pixel circuit group 2A, and the other row of the pixel circuit group 2 is the second pixel circuit group 2B. The plurality of rows of the first pixel circuit groups 2A and the plurality of rows of the second pixel circuit groups 2B are alternately arranged.

In addition, in any row of first pixel circuit group 2A and one row of second pixel circuit group 2B adjacent to this row of the pixel circuit group 2A, the position of an interval region between any two adjacent first pixel circuit groups 2A corresponds to the position of one second pixel circuit group 2B.

It can be understood that the row direction in which the plurality of first pixel circuit groups 2A are arranged in rows is regarded as a first direction parallel to a plane where the base substrate 1 is disposed, and the first direction may be any direction, which is not limited by the embodiments of the present disclosure.

Each pixel circuit group 2 in the above first pixel circuit groups 2A and second pixel circuit groups 2B has the following structure.

Each pixel circuit group 2 includes at least one pixel circuit unit. The pixel circuit unit includes one first pixel circuit 211, one second pixel circuit 212 and one third pixel circuit 213. That is, each pixel circuit group 2 includes one or more pixel circuit units. For example, the pixel circuit group 2 shown in FIG. 5 includes one pixel circuit unit including three pixel circuits (i.e., the first pixel circuit 211, the second pixel circuit 212 and third pixel circuit 213). Or, the pixel circuit group also includes six pixel circuits, nine pixel circuits, and so on, which is not limited by the embodiments of the present disclosure.

In each pixel circuit unit, the second pixel circuit 212 is disposed between the first pixel circuit 211 and the third pixel circuit 213. The first pixel circuit 211, the second pixel circuit 212 and the third pixel circuit 213 are arranged in the row direction of the plurality of pixel circuit groups 2. It can be understood that the row direction herein is the above first direction.

Figure 6:
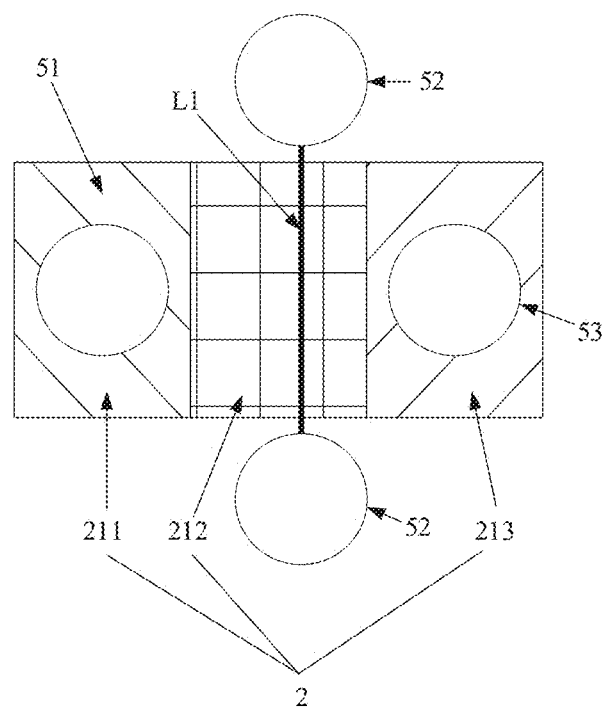
FIG. 6 is a schematic structural diagram of a pixel circuit group according to some embodiments of the present disclosure.

FIG. 6 is a schematic structural diagram of a pixel circuit group 2 according to some embodiments of the present disclosure. Referring to FIG. 6, the pixel circuit group 2 includes a pixel circuit unit, namely, includes one first pixel circuit 211, one second pixel circuit 212 and one third pixel circuit 213.

Each light-emitting unit includes one first light-emitting element, two second light-emitting elements and one third light-emitting element, and at least one light-emitting unit corresponds to one pixel circuit unit.

The first light-emitting element is connected to the first pixel circuit 211, that is, an anode of the first light-emitting element is connected to the first pixel circuit 211, and the first pixel circuit 211 drives the first light-emitting element to emit light. In the embodiment of the present disclosure, an orthographic projection of the anode 51 of the first light-emitting element onto the base substrate 1 is at least partially overlapped with the orthographic projection, onto the base substrate 1, of the pixel circuit group 2 where the first pixel circuit 211 is disposed. Since the anodes 51 of the first light-emitting elements shield light, enabling at least part of the anodes 51 of the first light-emitting elements to overlap with at least part of the pixel circuit groups 2 where first pixel circuits 211 are disposed can effectively reduce a shielding area of the anodes 51 of the first light-emitting elements to the first display region 11. Thus, the light transmittance of the first display region 11 is improved.

The two second light-emitting elements are both connected to the second pixel circuit 212, that is, the anodes 52 of the two second light-emitting elements are connected to the second pixel circuit 212. In this way, one second pixel circuit 212 drives the two second light-emitting elements to emit light, such that compared with a conventional pixel arrangement mode, the space of two second pixel circuits 212 is reduced to the space of one second pixel circuit 212, thereby improving the light transmittance of the first display region 11.

In addition, orthographic projections of the anodes 52 of the two second light-emitting elements onto the base substrate 1 are disposed on two opposite sides of the orthographic projection of the second pixel circuit 212 onto the base substrate 1, respectively. Referring to FIG. 6, the orthographic projections of the anodes 52 of the two second light-emitting elements onto the base substrate 1 are disposed on two side portions of the orthographic projection of the second pixel circuit 212 onto the base substrate 1. The orthographic projections of the anodes 52 onto the base substrate 1, the orthographic projection of the first pixel circuit 211 onto the base substrate 1 and the orthographic projection of the third pixel circuit 213 onto the base substrate 1 surround four side portions of the orthographic projection of the second pixel circuit 212 onto the base substrate 1. In some embodiments, the anodes 52 of the two second light-emitting elements are symmetrical, and a symmetry axis thereof is parallel to the first direction.

In some embodiments, the connection mode between the anodes 52 of the two second light-emitting elements and the second pixel circuit 212 is as follows: the anodes 52 of the two second light-emitting elements are connected by a first connecting line L1, and the first connecting line L1 is connected to the second pixel circuit 212. In some embodiments, a material of the first connecting line L1 is an anode material.

The third light-emitting element is connected to the third pixel circuit 213, that is, an anode 53 of the third light-emitting element is connected to the third pixel circuit 213, and the third pixel circuit 213 drives the third light-emitting element to emit light. In the embodiment of the present disclosure, an orthographic projection of the anode 53 of the third light-emitting element onto the base substrate 1 is at least partially overlapped with an orthographic projection, onto the base substrate 1, of the pixel circuit group 2 where the third pixel circuit 213 is disposed. Since the anode 53 of the third light-emitting element shields light, enabling at least part of the anode 53 of the third light-emitting element to overlap with at least part of the pixel circuit group 2 where the third pixel circuit 213 is disposed can effectively reduce a shielding area of the anode 53 of the third light-emitting element to the first display region 11. Thus, the light transmittance of the first display region 11 is improved.

The orthographic projection of the anode 53 of the third light-emitting element onto the base substrate 1 is disposed in the orthographic projection of the third pixel circuit 213 onto the base substrate 1. Since the anode 53 of the third light-emitting element shields light, arranging the anode 53 in a region of the third pixel circuit 213 that also shields light can reduce the shielding influence of the anode 53 of the third light-emitting element on the light-transmitting region in the first display region 11, thereby improving the light transmittance of the first display region 11.

In some embodiments, the orthographic projection of the anode 51 of the first light-emitting element onto the base substrate 1 is disposed in the orthographic projection, onto the base substrate 1, of the pixel circuit group 2 where the first pixel circuit 211 is disposed; the orthographic projections of the anodes 52 of the two second light-emitting elements onto the base substrate 1 are not overlapped with the orthographic projection, onto the base substrate 1, of the pixel circuit group 2 where the second pixel circuit 212 is disposed; and the orthographic projection of the anode 53 of the third light-emitting element onto the base substrate 1 is disposed in the orthographic projection, onto the base substrate 1, of the pixel circuit group 2 where the third pixel circuit 213 is disposed.

In this way, arranging the anode 51 of the first light-emitting element in a region of the pixel circuit group 2 where the first pixel circuit 211 that also shields light is disposed can maximally reduce a shielding influence of the anode 51 of the first light-emitting element on the light-transmitting region 112 in the first display region 11, thereby improving the light transmittance of the first display region 11.

It can be understood that the orthographic projection of the anode 51 of the above first light-emitting element onto the base substrate 1 being disposed in the orthographic projection of the first pixel circuit 211 onto the base substrate 1 means that the orthographic projection of the anode 51 of the first light-emitting element onto the base substrate 1 is disposed in the smallest square region where the orthographic projection of the first pixel circuit 211 onto the base substrate 1 is disposed, or in the smallest complete-shape region of another shape.

Similarly, arranging the anode 53 of the third light-emitting element in a region of the pixel circuit group 2 where the third pixel circuit 213 that also shields light is disposed can maximally reduce the shielding influence of the anode 53 of the third light-emitting element on the light-transmitting region 112 in the first display region 11, thereby improving the light transmittance of the first display region 11.

In order to uniformly arrange the plurality of light-emitting elements in the first display region 11, on the basis of providing the anodes 52 of the two second light-emitting elements on two sides of the second pixel circuit 212, it is also possible to set that the orthographic projections of the anodes 52 of the two second light-emitting elements onto the base substrate 1 do not overlap with the orthographic projection, onto the base substrate 1, of the pixel circuit group 2 where the second pixel circuit 212 is disposed, that is, the anodes 52 of the two second light-emitting elements are disposed in the light-transmitting region 112 of the first display region 11. In this way, the shielding of the anode 51 of the first light-emitting element and the anode 53 of the third light-emitting element to the light-transmitting region 112 is reduced, and meanwhile, the distribution uniformity of the anode 51 of the first light-emitting element, the anodes 52 of the second light-emitting elements and the anode 53 of the third light-emitting element is ensured.

In summary, in one pixel circuit group 2 described above, the set positions of the anode 51 of the first light-emitting element, the anodes 52 of the second light-emitting elements and the anode 53 of the third light-emitting element not only ensure the uniform arrangement of the plurality of light-emitting elements in the first display region 11 and the second display region 12 but also improve the light transmittance of the first display region 11.

In some embodiments, the shapes of the anode 51 of the first light-emitting element, the anodes 52 of the second light-emitting elements and the anode 53 of the third light-emitting element may all be circular; and under the same area, the aperture ratio of the circle is larger.

In some embodiments, based on the structural arrangement of the above pixel circuit group 2, the color distribution of the pixel circuits in the first pixel circuit group 2A and the second pixel circuit group 2B is set as follows.

The first light-emitting element, the second light-emitting element, and the third light-emitting element are a blue light-emitting element, a green light-emitting element, and a red light-emitting element, respectively, and an image is displayed by emitting blue light, green light, and red light.

Accordingly, as shown in FIG. 5, the first pixel circuit 211, the second pixel circuit 212, and the third pixel circuit 213 of each pixel circuit unit in the first pixel circuit group 2A are a pixel circuit for driving the blue light-emitting element, a pixel circuit for driving the green light-emitting element and a pixel circuit for driving the red light-emitting element, respectively, and are a blue pixel circuit Blue, a green pixel circuit Green, and a red pixel circuit Red, respectively. The first pixel circuit 211, the second pixel circuit 212, and the third pixel circuit 213 of each pixel circuit unit in the second pixel circuit group 2B is also a pixel circuit for driving the blue light-emitting element, a pixel circuit for driving the green light-emitting element, and a pixel circuit for driving the red light-emitting element, respectively.

Figure 7:
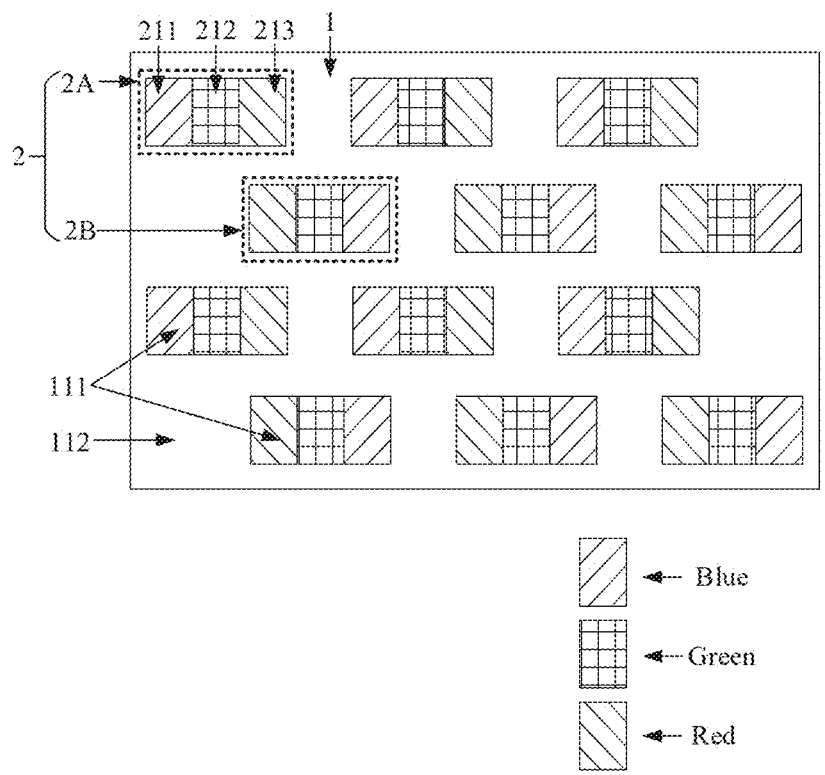
FIG. 7 is a schematic partial structural diagram of a first display region according to some embodiments of the present disclosure.

Or, as shown in FIG. 7, the first pixel circuit 211, the second pixel circuit 212, and the third pixel circuit 213 of each pixel circuit unit in the second pixel circuit group 2B are a pixel circuit for driving the red light-emitting element, a pixel circuit for driving the green light-emitting element and a pixel circuit for driving the blue light-emitting element, respectively.

Figure 8:
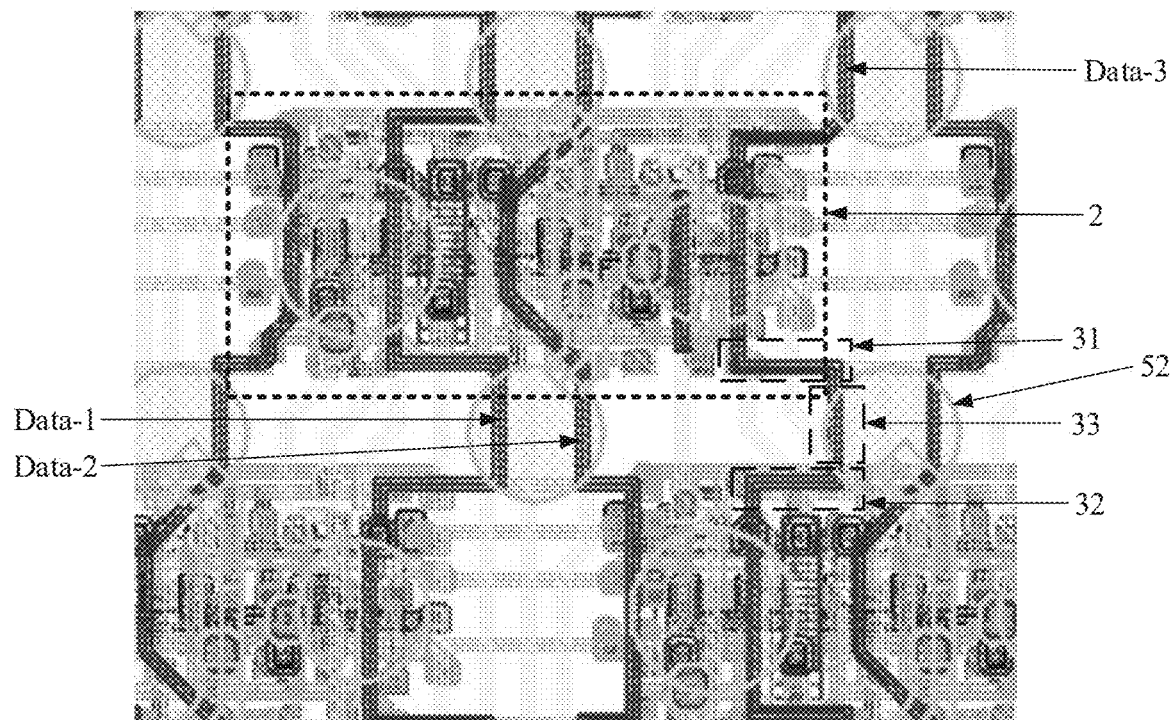
FIG. 8 is a schematic structural diagram of a pixel circuit group according to some embodiments of the present disclosure.

FIG. 8 is a schematic structural diagram of a pixel circuit group 2 in the display panel shown in FIG. 2. In FIG. 8, vertical signal lines of one type are set to include metal signal lines, and horizontal signal lines and vertical signal lines of other types are all transparent signal lines. Referring to FIG. 8, each metal signal line in the first signal lines 3 includes a first portion 31, a second portion 32, and a third portion 33. The third portion 33 is disposed between the first portion 31 and the second portion 32, and two ends of the third portion 33 are connected to the first portion 31 and the second portion 32, respectively.

The first portion 31 and the second portion 32 are connected to pixel circuits 21 in two adjacent pixel circuit groups 2, respectively. An orthographic projection of the third portion onto the base substrate 1 is at least partially overlapped with the orthographic projections of the anode 52 of the second light-emitting element onto the base substrate 1.

With this arrangement, the orthographic projection of a part of the metal signal line (the third portion 33) onto the base substrate 1 is at least partially overlapped with the orthographic projection of the anode 52 of the second light-emitting element onto the base substrate 1, such that the shielding of the metal signal line to the transparent region of the first display region 11 is reduced, thereby improving the light transmittance of the first display region 11.

In some embodiments, the orthographic projection of the anode 52 of the second light-emitting element onto the base substrate 1 is at least partially overlapped with orthographic projections of the third portions 33 of at least two of the metal signal lines onto the base substrate. In this way, the third portions 33 of multiple metal signal lines are overlapped with the anode 52 of the second light-emitting element, such that the light transmittance of the first display region 11 is further improved.

The overlapping portion between the third portions 33 of the at least two metal signal lines and the anode 52 of the second light-emitting element is symmetrical along the symmetry axis of the anode 52 of the second light-emitting element, thereby improving the flatness of the anode 52 of the second light-emitting element. For example, when the shape of the anode 52 of the second light-emitting element is circular, the two third portions 33 is symmetrical along a straight line passing through a circle center of the anode 52 of the second light-emitting element.

Figure 9:
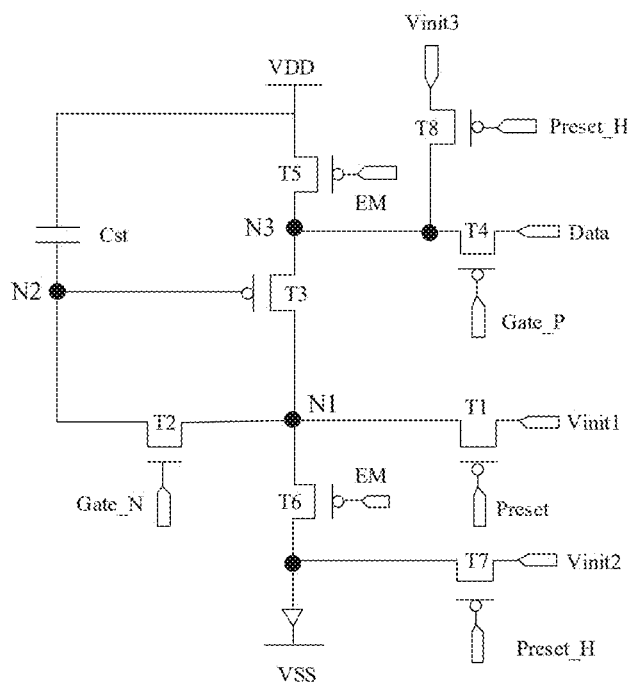
FIG. 9 is an equivalent circuit diagram of a pixel circuit according to some embodiments of the present disclosure.

In some embodiments, each pixel circuit 21 in each pixel circuit group 2 includes eight transistors and one storage capacitor Cst (i.e., 8T1C), for example, as shown in FIGS. 8 and 9.

FIG. 9 is an equivalent circuit diagram of a pixel circuit 21 in the display panel shown in FIG. 2. Referring to FIG. 9, the pixel circuit 21 includes a first transistor T1, a second transistor T2, a third transistor T3, a fourth transistor T4, a fifth transistor T5, a sixth transistor T6, a seventh transistor T7, an eighth transistor T8 and a storage capacitor Cst.

The types of the first signal lines include a first reset signal line Preset, a second reset signal line Preset_H, a first reset power supply line vinit1, a second reset power supply line vinit2, a third reset power supply line vinit3, a first gate signal line Gate_N, a second gate signal line Gate_P, a data signal line Data, a light emission control signal line EM and a driving power supply line VDD.

A gate of the first transistor T1 is connected to the first reset signal line Preset, a first pole of the first transistor T1 is connected to the first reset power supply line vinit1, and a second pole of the first transistor T1 is connected to a first node N1. The first transistor T1, is also called a reset transistor.

A gate of the second transistor T2 is connected to the first gate signal line Gate_N, a first pole of the second transistor T2 is connected to the first node N1, and a second pole of the second transistor is connected to a second node N2. The second transistor T2 is also called a compensating transistor.

A gate of the third transistor T3 is connected to the second node N2, a first pole of the third transistor T3 is connected to the first node N1, and a second pole of the third transistor T3 is connected to a third node N3. The third transistor T3 is also called a driving transistor.

A gate of the fourth transistor T4 is connected to the second gate signal line Gate_P, a first pole of the fourth transistor T4 is connected to the data signal line Data, and a second pole of the fourth transistor T4 is connected to the third node N3. The fourth transistor T4 is a data-writing transistor in the pixel circuit.

A gate of the fifth transistor T5 is connected to the light emission control signal line EM, a first pole of the fifth transistor T5 is connected to the third node N3, and a second pole of the fifth transistor T5 is connected to the driving power supply line VDD. Since the gate of the fifth transistor T5 is connected to the light emission control signal line EM, the fifth transistor T5 is also called a light emission control transistor.

A gate of the sixth transistor T6 is connected to the light emission control signal line EM, a first pole of the sixth transistor T6 is connected to the first node N1, and a second pole of the sixth transistor T6 is connected to an anode of a light-emitting element. Since the gate of the sixth transistor T6 is connected to the light emission control signal line EM, the sixth transistor T6 is also called a light emission control transistor.

A gate of the seventh transistor T7 is connected to the second reset signal line Preset_H, a first pole of the seventh transistor T7 is connected to the second reset power supply line vinit2, and a second pole of the seventh transistor T7 is connected to the anode of the light-emitting element. The seventh transistor T7 is a reset transistor in the pixel circuit.

A gate of the eighth transistor T8 is connected to the second reset signal line Preset H, a first pole of the eighth transistor T8 is connected to the third reset power supply line vinit3, and a second pole of the eighth transistor T8 is connected to the third node N3. The eighth transistor T8 is a reset transistor in the pixel circuit.

Two ends of the storage capacitor Cst are connected to the driving power supply line VDD and the second node N2, respectively.

In some embodiments, the storage capacitor Cst includes a first capacitor plate Cst1 and a second capacitor plate Cst2. In the embodiment of the present disclosure, the first capacitor plate Cst1 may be called one end, a first end or a first capacitance storage pole of the storage capacitor Cst, and correspondingly, the second capacitor plate Cst2 may be called the other end, a second end or a second capacitance storage pole of the storage capacitor Cst.

In the embodiments of the present disclosure, the types of the first signal lines 3 including the metal signal lines are the signal lines of some types in the above first reset signal line Preset, second reset signal line Preset_H, first reset power supply line vinit1, second reset power supply line vinit2, third reset power supply line vinit3, first gate signal line Gate_N, second gate signal line Gate_P, data signal line Data, light emission control signal line EM and driving power supply line VDD.

In some embodiments, the second transistor T2 is an N-type transistor. The first transistor T1, the third transistor T3, the fourth transistor T4, the fifth transistor T5, the sixth transistor T6, the seventh transistor T7 and the eighth transistor T8 are all P-type transistors.

In some embodiments, each N-type transistor in the embodiments of the present disclosure is an oxide thin-film transistor, and each P-type transistor is a low temperature poly-silicon (LTPS) thin-film transistor. An oxide material includes indium gallium zinc oxide (IGZO), that is, the oxide thin-film transistor is an IGZO thin-film transistor. The pixel circuit composed of these eight transistors is also called an LTPO pixel circuit. A display panel in which the pixel circuit is the LTPO pixel circuit is called an LTPO display panel.

Figure 10:
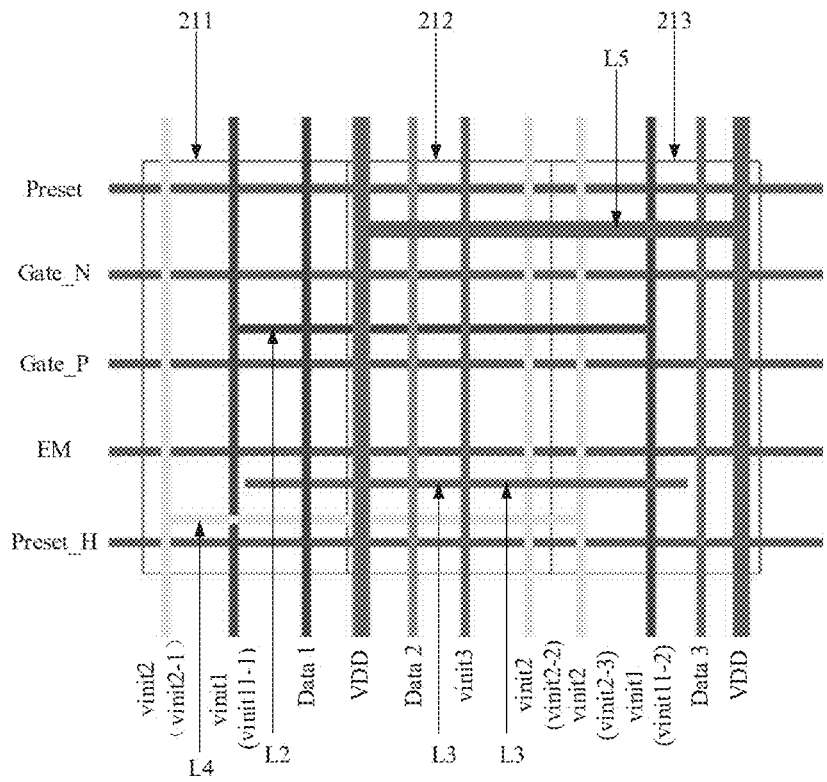
FIG. 10 is a schematic diagram of an arrangement of a first signal line according to some embodiments of the present disclosure.

FIG. 10 is a schematic diagram of the arrangement of first signal lines 3 of a plurality of types in a pixel circuit group 2 in the display panel shown in FIG. 2. Referring to FIG. 10, it can be seen that the pixel circuit group 2 includes one pixel circuit unit, namely, includes three pixel circuits 21.

Each type of horizontal signal lines (including the first reset signal line Preset, the second reset signal line Preset_H, the first gate signal line Gate_N, the second gate signal line Gate_P and the light emission control signal line EM) runs through the pixel circuit group 2, and is connected to each pixel circuit 21 in the pixel circuit group 2.

The data signal lines Data in the vertical signal lines include a data signal line Data-1, a data signal line Data-2 and a data signal line Data-3. As shown in FIGS. 8 and 10, the data signal line Data-1 runs through and is connected to the first pixel circuit 211, the data signal line Data-2 runs through and is connected to the second pixel circuit 212, and the data signal line Data-3 runs through and is connected to the third pixel circuit 213.

Referring to FIG. 10, the first reset power supply line vinit1, the second reset power supply line vinit2, and the third reset power supply line vinit3 in the vertical signal lines are set as follows.

Each pixel circuit unit corresponds to two first reset power supply lines vinit1 (including vinit1-1 and vinit1-2), three second reset power supply lines vinit2 (including vinit2-1, vinit2-2 and vinit2-3) and one third reset power supply line vinit3. That is, each pixel circuit unit is required to be connected to two first reset power supply lines vinit1, three second reset power supply lines vinit2 and one third reset power supply line vinit3.

For each pixel circuit unit, orthographic projections of the two first reset power supply lines vinit1 onto the base substrate 1 is at least partially overlapped with the orthographic projection of the first pixel circuit 211 onto the base substrate 1 and the orthographic projection of the third pixel circuit 213 onto the base substrate 1, respectively; and the two first reset power supply lines vinit1 are connected to the first pixel circuit 211 and the third pixel circuit 213, respectively. That is, the first reset power supply line vinit1-1 and the first reset power supply line vinit1-2 run through the first pixel circuit 211 and the third pixel circuit 213, respectively, and are connected to the first pixel circuit 211 and the third pixel circuit 213 by via holes.

In addition, the two first reset power supply lines vinit1 are connected by a second connecting line L2, and the second connecting line L2 is connected to the second pixel circuit 212. An extending direction of the second connecting line L2 is intersected with an extending direction of the first reset power supply line vinit1. For example, the extending direction of the second connecting line L2 is perpendicular to the extending direction of the first reset power supply line vinit1, or, forms an angle that is not 90 degrees with the extending direction of the first reset power supply line vinit1, and so on, which is set according to requirements and the arrangement of each first signal line 3, and is not limited by the embodiments of the present disclosure. Two ends of the second connecting line L2 are connected to the first reset power supply line vinit1 disposed on two sides of the second pixel circuit 212. The second connecting line L2 runs through and is connected to the second pixel circuit 212. The orthographic projections of the two first reset power supply lines vinit1 and an orthographic projection of the second connecting line L2 onto the base substrate 1 form an I shape.

In this way, the two first reset power supply lines vinit1 are connected by the second connecting line L2, and are connected to the first pixel circuit 211, the second pixel circuit 212 and the third pixel circuit 213, such that the first pixel circuit 211, the second pixel circuit 212 and the third pixel circuit 213 receive the same first reset power supply signal, thereby improving the stability of the first reset power supply signal received by each pixel circuit unit.

In some embodiments, the second connecting line L2 is a metal connecting line disposed in a metal layer in the pixel circuit 21.

Orthographic projections of the three second reset power supply lines vinit2 onto the base substrate 1 are at least partially overlapped with the orthographic projection of the first pixel circuit 211 onto the base substrate 1, the orthographic projection of the second pixel circuit 212 onto the base substrate 1 and the orthographic projection of the third pixel circuit 213 onto the base substrate 1, respectively, and are connected to the first pixel circuit 211, the second pixel circuit 212 and the third pixel circuit 213, respectively. That is, the three second reset power supply lines vinit2 run through the first pixel circuit 211, the second pixel circuit 212 and the third pixel circuit 213, respectively, and are connected to the first pixel circuit 211, the second pixel circuit 212 and the third pixel circuit 213 by via holes, respectively.

In some embodiments, as shown in FIG. 10, the three second reset power supply lines vinit2 are also connected by a fourth connecting line L4. An extending direction of the fourth connecting line L4 intersects with an extending direction of the second reset power supply line vinit2. For example, the extending direction of the fourth connecting line L4 is perpendicular to the extending direction of the second reset power supply line vinit2, or, forms an angle that is not 90 degrees with the extending direction of the second reset power supply line vinit2, and so on, which may be set according to requirements and the arrangement of each first signal line 3, and is not limited by the embodiments of the present disclosure. In this way, the first pixel circuit 211, the second pixel circuit 212 and the third pixel circuit 213 receive the same second reset power supply signal, thereby improving the stability of the second reset power supply signal received by each pixel circuit unit.

In some embodiments, the fourth connecting line L4 is a metal connecting line disposed in a metal layer in the pixel circuit 21.

The orthographic projection of the third reset power supply line vinit3 onto the base substrate 1 is at least partially overlapped with the orthographic projection of the second pixel circuit 212 onto the base substrate 1, and the third reset power supply line vinit3 is connected to the second pixel circuit 212. That is, the third reset power supply line vinit3 runs through the second pixel circuit 212 and is connected to the second pixel circuit 212 by a via hole.

In addition, the third reset power supply line vinit3 is connected to the first pixel circuit 211 and the third pixel circuit 213 by third connecting lines L3. An extending direction of the third connecting line L3 intersects with an extending direction of the third reset power supply line vinit3. For example, the extending direction of the third connecting line L3 is perpendicular to the extending direction of the third reset power supply line vinit3, or forms an angle that is not 90 degrees with the extending direction of the third reset power supply line vinit3, and so on, which may be set according to requirements and the arrangement of each first signal line 3, and is not limited by the embodiments of the present disclosure. The third connecting lines L3 respectively extend in two directions perpendicular to and opposite to the extending direction of the third reset power supply lines vinit3, such that the orthographic projections of the third connecting lines L3 onto the base substrate 1 and the orthographic projection of the third reset power supply line vinit3 onto the base substrate 1 are cross-shaped.

The third connecting lines L3 are connected to the third reset power supply line vinit3, and meanwhile, two ends of each third connecting line L3 are connected to the first pixel circuit 211 and the third pixel circuit 213, respectively, such that the first pixel circuit 211, the second pixel circuit 212 and the third pixel circuit 213 can receive the same third reset power supply signal, thereby improving the stability of the third reset power supply signal received by each pixel circuit unit.

In some embodiments, the third connecting line L3 is a metal connecting line disposed in a metal layer in the pixel circuit 21.

The above arrangement of the first reset power supply lines vinit1, the second reset power supply lines vinit2 and the third reset power supply line vinit3 not only reduces the space occupied by the pixel circuit group 2, but also improves the stability of the first, second and third reset power supply signals received by each pixel circuit unit.

Referring to FIG. 10, the driving power supply lines VDD in the vertical signal lines is set as follows: each pixel circuit unit corresponds to two driving power supply lines VDD.

Figure 11:
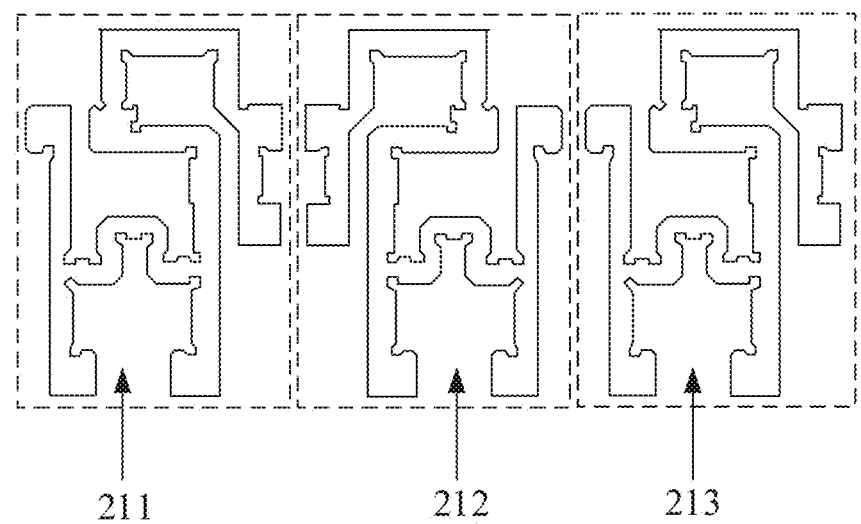
FIG. 11 is a schematic structural diagram of a pixel circuit group according to some embodiments of the present disclosure.

Correspondingly, referring to FIG. 11, a structural arrangement of the three pixel circuits 21 in the pixel circuit unit is as follows: in arrangement directions of the first pixel circuit 211, the second pixel circuit 212 and the third pixel circuit 213, an orientation of the first pixel circuit 211 faces that of the second pixel circuit 212. That is, at least a part of a pattern of the first pixel circuit 211 and at least a part of a pattern of the second pixel circuit 212 are symmetrical.

Figure 12:
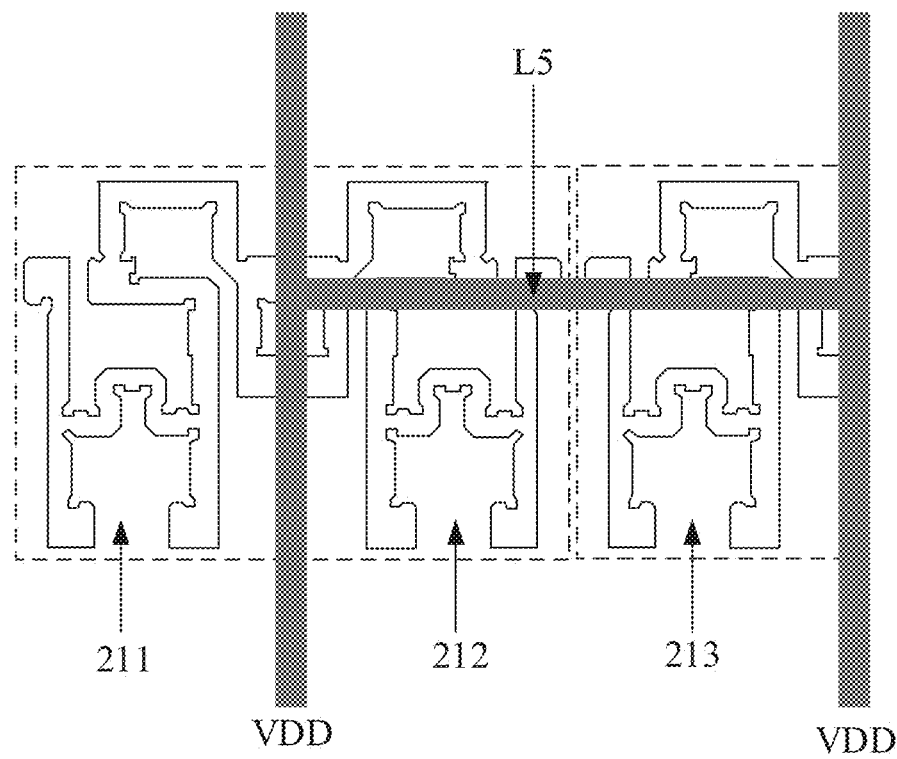
FIG. 12 is a schematic diagram of an arrangement of a driving signal line according to some embodiments of the present disclosure.

Referring to FIGS. 10 and 12, in this case, for each pixel circuit unit, an orthographic projection of one of the driving power supply lines VDD onto the base substrate 1 is at least partially overlapped with the orthographic projection of the first pixel circuit 211 onto the base substrate 1 and the orthographic projection of the second pixel circuit 212 onto the base substrate 1, and is connected to the first pixel circuit

211 and the second pixel circuit 212. That is, the driving power supply line VDD runs through the first pixel circuit 211 and the second pixel circuit 212, and is connected to the first pixel circuit 211 and the third pixel circuit 212 by via holes.

Since the orientation of the first pixel circuit 211 faces the orientation of the second pixel circuit 212, the driving power supply line VDD is arranged between the first pixel circuit 211 and the second pixel circuit 212 to achieve a solution that one driving power supply line VDD drives the two pixel circuits 21. Therefore, the number of the driving power supply lines VDD is reduced, thereby improving the light transmittance of the first display region 11.

It can be understood that a connection point of the first pixel circuit 211 where the first pixel circuit 211 is connected to the driving power supply line VDD is required to be set to a position proximal to the second pixel circuit 212, and similarly, a connection point of the second pixel circuit 212 where the second pixel circuit 212 is connected to the driving power supply line VDD is required to be set to a position proximal to the first pixel circuit 211. In this way, the connection point on the first pixel circuit 211 and the connection point on the second pixel circuit 212 are conveniently connected to the same driving power supply line VDD.

An orthographic projection of the other driving power supply line VDD onto the base substrate 1 is at least partially overlapped with the orthographic projection of the third pixel circuit 213 onto the base substrate 1, and the other driving power supply line VDD is connected to the third pixel circuit 213. That is, the other driving power supply line VDD runs through the third pixel circuit 213 and is connected to the third pixel circuit 213 by a via hole. In some embodiments, the orientation of the third pixel circuit 213 is the same as that of the first pixel circuit 211, or is the same as that of the second pixel circuit 212, which is not limited by the embodiments of the present disclosure.

In some embodiments, the orientation of the second pixel circuit 212 faces the orientation of the third pixel circuit 213. The orthographic projection of one driving power supply line VDD onto the base substrate 1 is at least partially overlapped with the orthographic projection of the second pixel circuit 212 onto the base substrate 1 and the orthographic projection of the third pixel circuit 213 onto the base substrate 1, and the driving power supply line VDD is connected to the second pixel circuit 212 and the third pixel circuit 213. The orthographic projection of the other driving power supply line VDD onto the base substrate 1 is at least partially overlapped with the orthographic projection of the first pixel circuit 211 onto the base substrate 1, and the other driving power supply line VDD is connected to the first pixel circuit 211.

In some embodiments, the two driving power supply lines VDD is connected by a fifth connecting line L5. An extending direction of the fifth connecting line L5 intersects with the extending direction of the driving power supply lines VDD, and for example, the two directions are perpendicular to each other. In this way, the first pixel circuit 211, the second pixel circuit 212 and the third pixel circuit 213 receive the same driving power signal, thereby improving the stability of the driving power signal received by each pixel circuit unit.

Figure 13:
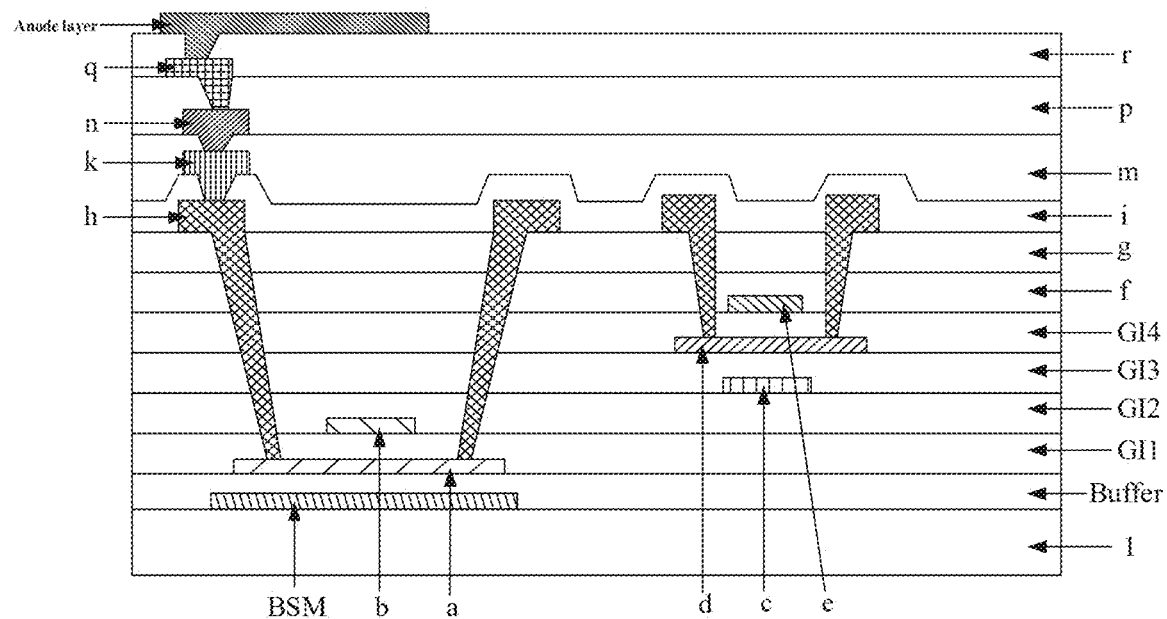
FIG. 13 is a cross-sectional view of a display panel according to some embodiments of the present disclosure.

FIG. 13 is a cross-sectional view of a display panel according to some embodiments of the present disclosure. Referring to FIG. 13, in the embodiments of the present disclosure, the display panel includes part or all of film layers that constitute a pixel circuit 21, the layers, for example, include a bottom shielding metal (BSM) layer, a buffer layer buffer, an active layer a, a first gate insulating layer GI1, a first gate layer b, a second gate insulating layer GI2, a second gate layer c, a third gate insulating layer GI3, an oxide layer d, a fourth gate insulating layer GI4, a third gate layer e, a first interlayer dielectric layer f, a second interlayer dielectric layer g, a first source-drain layer h, a passivation layer i, a first transparent wiring layer k, a first planarization layer m, a second transparent wiring layer n, a second planarization layer p, a second source-drain layer q and a third planarization layer r which are sequentially stacked in a direction distal from the base substrate 1.

It should be noted that FIG. 13 is only for illustrating a stacking relationship of the all film layers.

In the embodiments of the present disclosure, the second transistor T2 is an oxide thin-film transistor. Thus, the second transistor T2 consists of the second gate layer c, an oxide layer d, and the third gate layer e. The material of the oxide layer d is IGZO.

In some embodiments, the second transistor T2 is a double-gate transistor, the second gate layer c includes a gate pattern of a bottom gate of the second transistor T2, the oxide layer d includes an oxide pattern of the second transistor T2, and the third gate layer e includes a gate pattern of atop gate of the second transistor T2.

Furthermore, the first transistor T1, the third transistor T3, the fourth transistor T4, the fifth transistor T5, the sixth transistor T6, the seventh transistor T7, and the eighth transistor T8 are all LTPS thin-film transistors. Thus, each of the first transistor T1, the third transistor T3, the fourth transistor T4, the fifth transistor T5, the sixth transistor T6, the seventh transistor T7 and the eighth transistor T8 consists of the active layer a, the first gate layer b and the first source-drain layer h.

In some embodiments, the active layer a includes an active pattern of the first transistor T1, an active pattern of the third transistor T3, an active pattern of the fourth transistor T4, an active pattern of the fifth transistor T5, an active pattern of the sixth transistor T6, an active pattern of the seventh transistor T7 and an active pattern of the eighth transistor T8.

The first gate layer b includes a gate pattern of the first transistor T1, a gate pattern of the third transistor T3, a gate pattern of the fourth transistor T4, a gate pattern of the fifth transistor T5, a gate pattern of the sixth transistor T6, a gate pattern of the seventh transistor T7 and a gate pattern of the eighth transistor T8.

In the embodiments of the present disclosure, the BSM layer is disposed between the base substrate 1 and the active layer a; and an orthographic projection of the active pattern of the third transistor T3 onto the base substrate 1 is disposed in an orthographic projection of a pattern in the BSM layer onto the base substrate 1, such that the base substrate 1 is insulated from the driving transistor (the third transistor T3), avoiding the influence of the energization of the base substrate 1 on the characteristics of the driving transistor per se.

The buffer layer buffer is disposed on a side, distal from the base substrate 1, of the bottom shielding metal layer, and is configured to insulate the bottom shielding metal layer from the active layer a.

In the embodiments of the present disclosure, transparent signal lines in the horizontal signal lines (including the first reset signal line Preset, the second reset signal line Preset_H, the first gate signal line Gate_N, the second gate signal line Gate_P, and the light emission control signal line EM) among the first signal lines 3 of the plurality of types are disposed in the first transparent wiring layer k. Metal signal lines in the horizontal signal lines among the first signal lines 3 of the plurality of types are disposed in the first source-drain layer h. Transparent signal lines in the vertical signal lines (including the first reset power supply line vinit1, the second reset power supply line vinit2, the third reset power supply line vinit3, the driving power supply line VDD, and the data signal line Data) among the first signal lines 3 of the plurality of types are disposed in the second transparent wiring layer n. Metal signal lines in the vertical signal lines among the first signal lines 3 of the plurality of types are disposed in the second source-drain layer q.

The second connecting line L2 is disposed in the first source-drain layer h, and the third connecting line L3 is disposed in the third gate layer e. It can be understood that a fourth connecting line L4 and a fifth connecting line L5 are not provided in this example. If the fourth connecting line L4 and the fifth connecting line L5 are provided, they are provided in any one layer having placing space among the first gate layer b, the second gate layer c, the third gate layer, and the first source-drain layer h, which is not limited by the embodiments of the present disclosure.

To clearly identify each film layer, each film layer when the pixel circuit 21 includes eight transistors is described below in a fashion of a single layer and layer stacking step by step.

I. A solution that each data signal line Data (including Data-1 connected to the first pixel circuit 211, Data-2 connected to the second pixel circuit 212 and Data-3 connected to the third pixel circuit 213) includes a metal signal line and a transparent signal line connected in parallel, and the first signal lines 3 of the other types are transparent signal lines is taken as an example for introduction.

In this case, the display panel includes an active layer a, a first gate insulating layer, a first gate layer b, a second gate insulating layer, a second gate layer c, a third gate insulating layer, an oxide layer d, a fourth gate insulating layer, a third gate layer e, a first interlayer dielectric layer f, a second interlayer dielectric layer g, a first source-drain layer h, a passivation layer i, a first transparent wiring layer k, a first planarization layer m, a second transparent wiring layer n, a second planarization layer p, a second source-drain layer q and a third planarization layer r which constitute a pixel circuit 21 and are sequentially stacked in a direction distal from the base substrate 1.

It should be noted that the pixel circuit group 2 consisting of patterns of all film layers described below includes one pixel circuit unit. The pixel circuit unit includes a first pixel circuit 211, a second pixel circuit 212, and a third pixel circuit 213 arranged from left to right. In the arrangement direction of the first pixel circuit 211, the second pixel circuit 212 and the third pixel circuit 213, the orientation of the first pixel circuit 211 faces that of the second pixel circuit 212, and the orientation of the third pixel circuit 213 is the same as that of the first pixel circuit 211. The face-to-face arrangement means that at least part of a pattern of the first pixel circuit 211 and at least part of a pattern of the second pixel circuit 212 are symmetrical.

Figure 14:
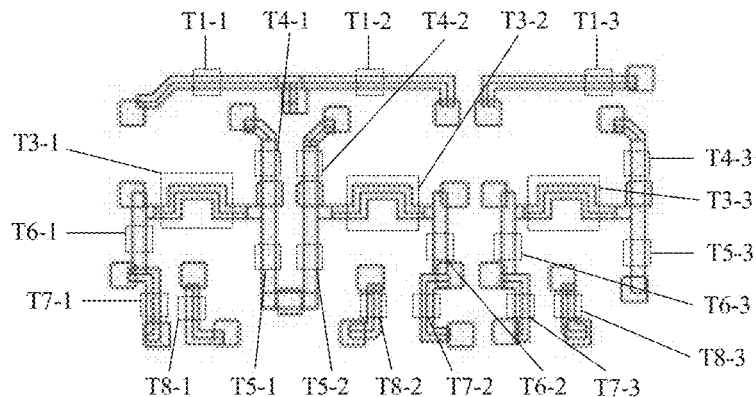
FIG. 14 is a schematic partial structural diagram of an active layer in a display panel according to some embodiments of the present disclosure.
Figure 14:
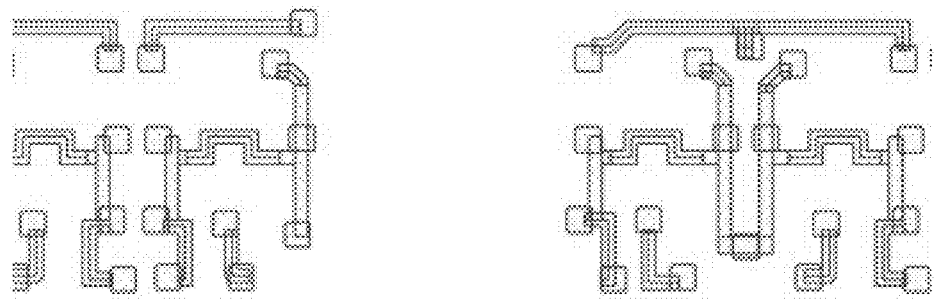

FIG. 14 is a schematic partial diagram of an active layer a in a display panel according to some embodiments of the present disclosure. Referring to FIG. 14, the active layer a has a curving or bending shape, and includes active patterns (channel regions) and doped region (source-drain doped region) patterns of the first transistor T1, the third transistor T3, the fourth transistor T4, the fifth transistor T5, the sixth transistor T6, the seventh transistor T7 and the eighth transistor T8, and the active patterns and the doped region patterns of the above all transistors in the same pixel circuit 21 are integrally arranged.

The first pixel circuit 211 includes active patterns (channel regions) of a first transistor T1-1, a third transistor T3-1, a fourth transistor T4-1, a fifth transistor T5-1, a sixth transistor T6-1, a seventh transistor T7-1 and an eighth transistor T8-1, and source-drain doped region patterns disposed on two sides of the active pattern of each transistor.

The second pixel circuit 212 includes active patterns (channel regions) and doped region (source-drain doped region) patterns of a first transistor T1-2, a third transistor T3-2, a fourth transistor T4-2, a fifth transistor T5-2, a sixth transistor T6-2, a seventh transistor T7-2 and an eighth transistor T8-2.

The third pixel circuit 213 includes active patterns (channel regions) and doped region (source-drain doped region) patterns of a first transistor T1-3, a third transistor T3-3, a fourth transistor T4-3, a fifth transistor T5-3, a sixth transistor T6-3, a seventh transistor T7-3 and an eighth transistor T8-3.

It should be noted that the active layer a includes an integrally formed low-temperature polysilicon layer, and a source region and a drain region are conductive by doping and the like to achieve electrical connection of all structures. In other words, a semiconductor layer of each transistor in each pixel circuit is an integral pattern formed by p-silicon; and each transistor in the same pixel circuit includes a doped region (i.e., the source region and the drain region) pattern and an active pattern, and active patterns of different transistors are separated.

The active layer a is made of amorphous silicon, polysilicon, an oxide semiconductor material, etc. It should be noted that the source region and the drain region are regions doped with n-type impurities or p-type impurities.

The display panel further includes a first gate insulating layer disposed on a side of the active layer a distal from the base substrate 1, and the first gate insulating layer is configured to insulate the above active layer a from a first gate layer b formed subsequently.

Figure 15:
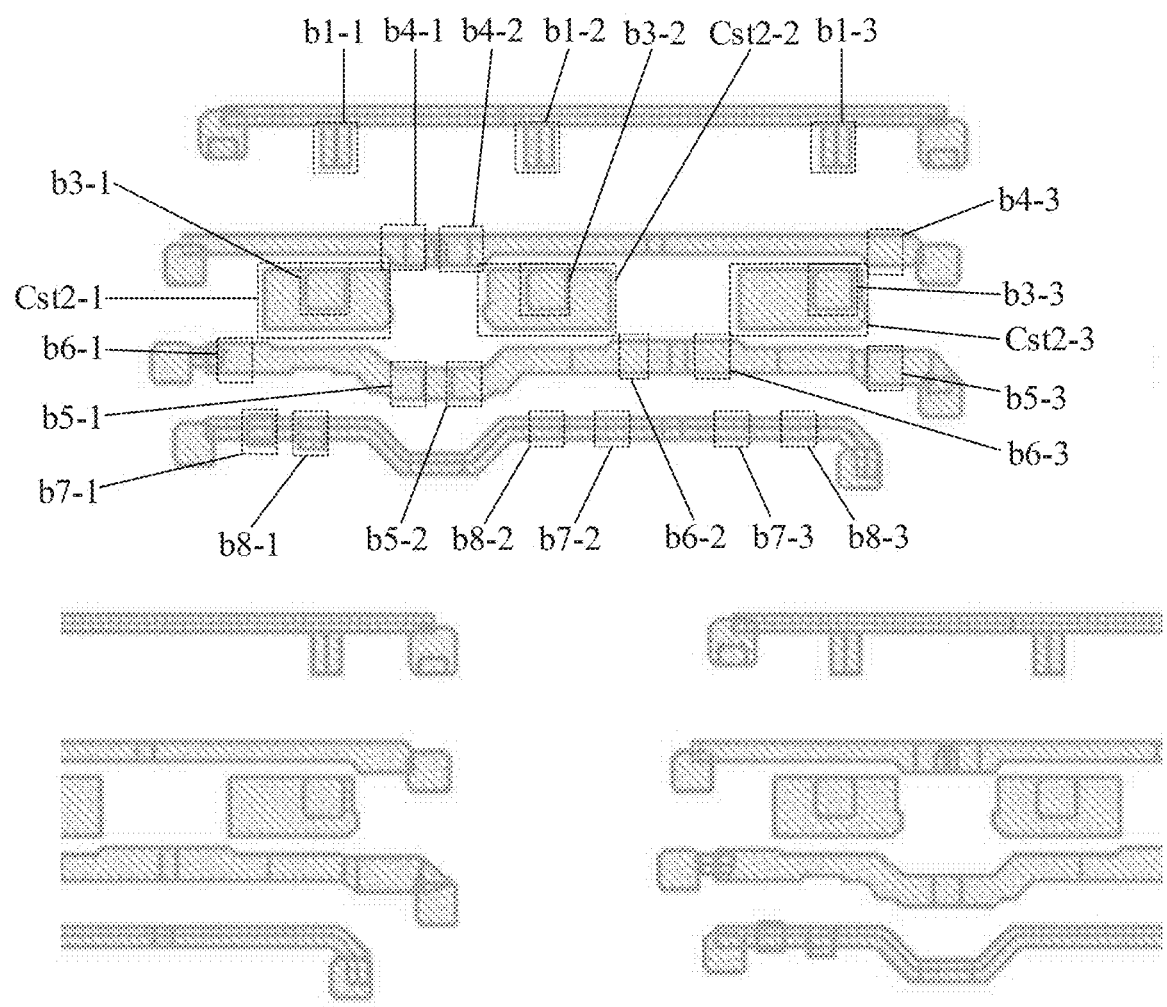
FIG. 15 is a schematic partial structural diagram of a first gate layer in a display panel according to some embodiments of the present disclosure.
Figure 16:
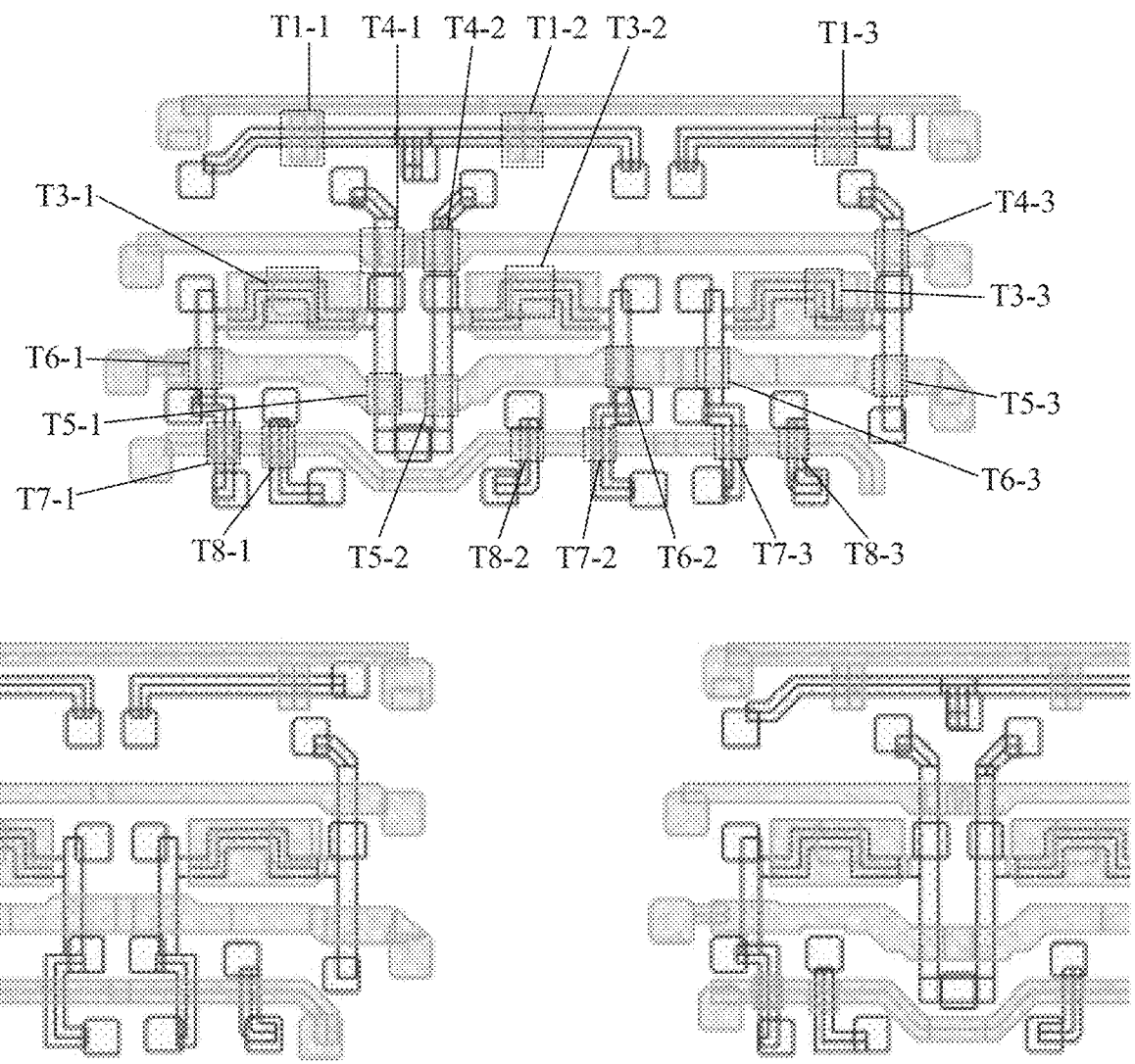
FIG. 16 is a schematic diagram of partial superposition of an active layer and a first gate layer in a display panel according to some embodiments of the present disclosure.

FIG. 15 is a schematic partial diagram of a first gate layer b in a display panel according to some embodiments of the present disclosure, and FIG. 16 is a schematic diagram of partial superposition of an active layer a and the first gate layer b in a display panel according to some embodiments of the present disclosure. The first gate layer b is disposed on a side of the first gate insulating layer distal from the base substrate 1. Referring to FIGS. 15 and 16, the first gate layer b includes a second capacitor plate Cst2, a first gate pattern b1 of a first transistor T1, a third gate pattern b3 of a third transistor T3, a fourth gate pattern b4 of a fourth transistor T4, a fifth gate pattern b5 of a fifth transistor T5, a sixth gate pattern b6 of a sixth transistor T6, a seventh gate pattern b7 of a seventh film transistor T7 and an eighth gate pattern b8 of an eighth transistor T8.

The first pixel circuit 211 includes a second capacitor plate Cst2-1, a first gate pattern b1-1 of the first transistor T1-1, a third gate pattern b3-1 of the third transistor T3-1, a fourth gate pattern b4-1 of the fourth transistor T4-1, a fifth gate pattern b5-1 of the fifth transistor T5-1, a sixth gate pattern b6-1 of the sixth transistor T6-1, a seventh gate pattern b7-1 of the seventh film transistor T7-1 and an eighth gate pattern b8-1 of the eighth transistor T8-1. The third gate pattern b3-1 of the third transistor T3-1 and the second capacitor plate Cst2-1 are considered as an integrated structure.

The second pixel circuit 212 includes a second capacitor plate Cst2-2, a first gate pattern b1-2 of the first transistor T1-2, a third gate pattern b3-2 of the third transistor T3-2, a fourth gate pattern b4-2 of the fourth transistor T4-2, a fifth gate pattern b5-2 of the fifth transistor T5-2, a sixth gate pattern b6-2 of the sixth transistor T6-2, a seventh gate pattern b7-2 of the seventh film transistor T7-2 and an eighth gate pattern b8-2 of the eighth transistor T8-2. The third gate pattern b3-2 of the third transistor T3-2 and the second capacitor plate Cst2-2 are considered as an integrated structure.

The third pixel circuit 213 includes a second capacitor plate Cst2-3, a first gate pattern b1-3 of the first transistor T1-3, a third gate pattern b3-3 of the third transistor T3-3, a fourth gate pattern b4-3 of the fourth transistor T4-3, a fifth gate pattern b5-3 of the fifth transistor T5-3, a sixth gate pattern b6-3 of the sixth transistor T6-3, a seventh gate pattern b7-3 of the seventh film transistor T7-3 and an eighth gate pattern b8-3 of the eighth transistor T8-3. The third gate pattern b3-3 of the third transistor T3-3 and the second capacitor plate Cst2-3 are considered as an integrated structure.

It should be noted that each rectangular dashed frame in FIG. 16 shows each portion where the first gate layer b and the active layer a are overlapped. For the channel region of each transistor, the active layers a on two sides of each channel region are conductive by ion doping and other processes to be used as the first and second poles of each transistor. The source and drain of the transistor are symmetrical in structure, and thus, no difference exists between the source and drain in physical structures. In the embodiments of the present disclosure, in order to distinguish the transistors, other than the gate as a control pole, one of poles is directly described as the first pole and the other pole as the second pole. Therefore, the first poles and the second poles of all or part of the transistors in the embodiments of the present disclosure are interchangeable as required.

The display panel further includes a second gate insulating layer disposed on a side of the first gate layer b distal from the base substrate 1, and the second gate insulating layer is configured to insulate the first gate layer b from the second gate layer c formed subsequently.

Figure 17:
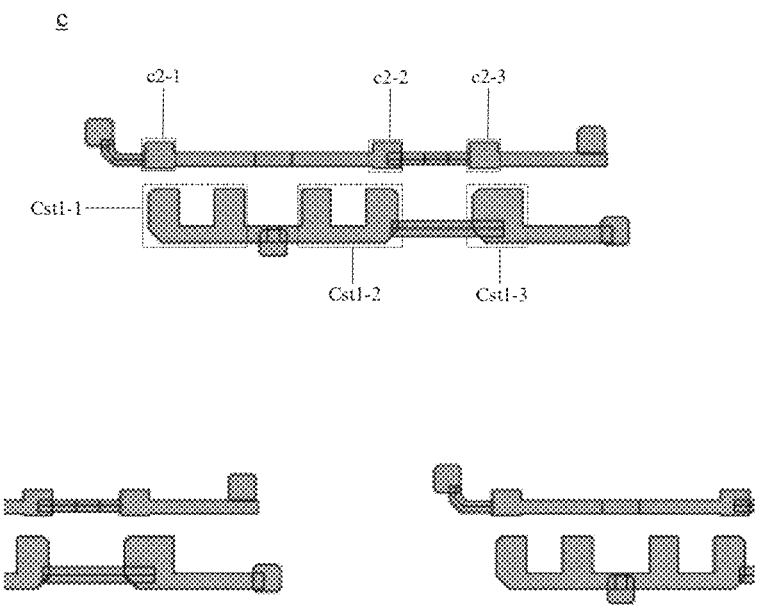
FIG. 17 is a schematic partial diagram of a second gate layer in a display panel according to some embodiments of the present disclosure.
Figure 18:
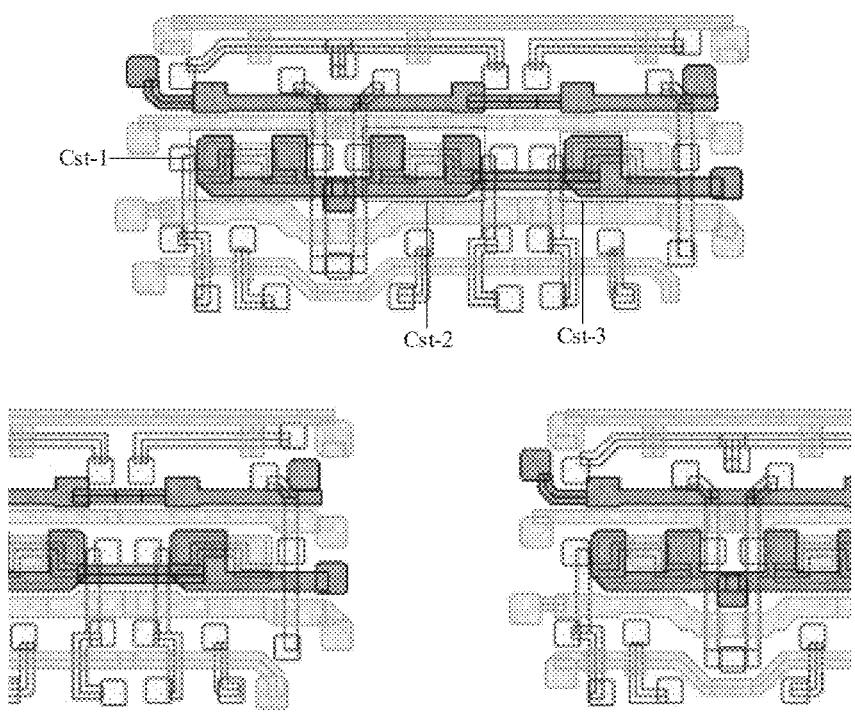
FIG. 18 is a schematic partial diagram of partial superposition of an active layer, a first gate layer, and a second gate layer in a display panel according to some embodiments of the present disclosure.

FIG. 17 is a schematic partial diagram of a second gate layer c in a display panel according to some embodiments of the present disclosure, and FIG. 18 is a schematic diagram of partial superposition of an active layer a, a first gate layer b and a second gate layer c in a display panel according to some embodiments of the present disclosure. The second gate layer c is disposed on a side of the second gate insulating layer distal from the base substrate 1. Referring to FIGS. 17 and 18, the second gate layer c includes a first capacitor plate Cst1 and a bottom gate pattern c2 disposed on a second gate layer c in the second transistor T2.

The first pixel circuit 211 includes the first capacitor plate Cst1-1 and a bottom gate pattern c2-1 disposed on the second gate layer c in the second transistor T2-1. The storage capacitor Cst-1 is formed by at least partially overlapping the first capacitor plate Cst1-1 disposed in the second gate layer c with the second capacitor plate Cst2-1 disposed in the first gate layer b. The bottom gate pattern c2-1 is also used as a portion disposed on the second gate layer c in the first gate signal line Gate_N.

The second pixel circuit 212 includes the first capacitor plate Cst1-2 and a bottom gate pattern c2-2 disposed on the second gate layer c in the second transistor T2-2. The storage capacitor Cst-2 is formed by at least partially overlapping the first capacitor plate Cst1-2 disposed in the second gate layer c with the second capacitor plate Cst2-2 disposed in the first gate layer b. The bottom gate pattern c2-2 is also used as a portion disposed on the second gate layer c in the first gate signal line Gate_N.

The third pixel circuit 213 includes the first capacitor plate Cst1-3 and a bottom gate pattern c2-3 disposed on the second gate layer c in the second transistor T2-3. The storage capacitor Cst-3 is formed by at least partially overlapping the first capacitor plate Cst1-3 disposed in the second gate layer c with the second capacitor plate Cst2-3 disposed in the first gate layer b. The bottom gate pattern c2-3 is also used as a portion disposed on the second gate layer c in the first gate signal line Gate_N.

In addition, a third gate insulating layer is formed on the above second gate layer c, and is configured to insulate the second gate layer c from an oxide layer d formed subsequently.

Figure 19:
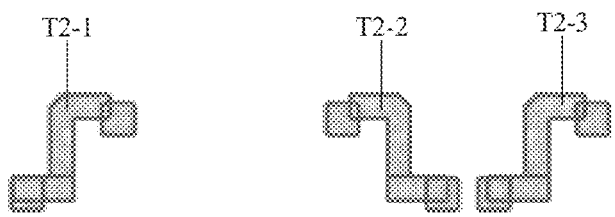
FIG. 19 is a schematic partial diagram of an oxide layer in a display panel according to some embodiments of the present disclosure.
Figure 19:
Figure 20:
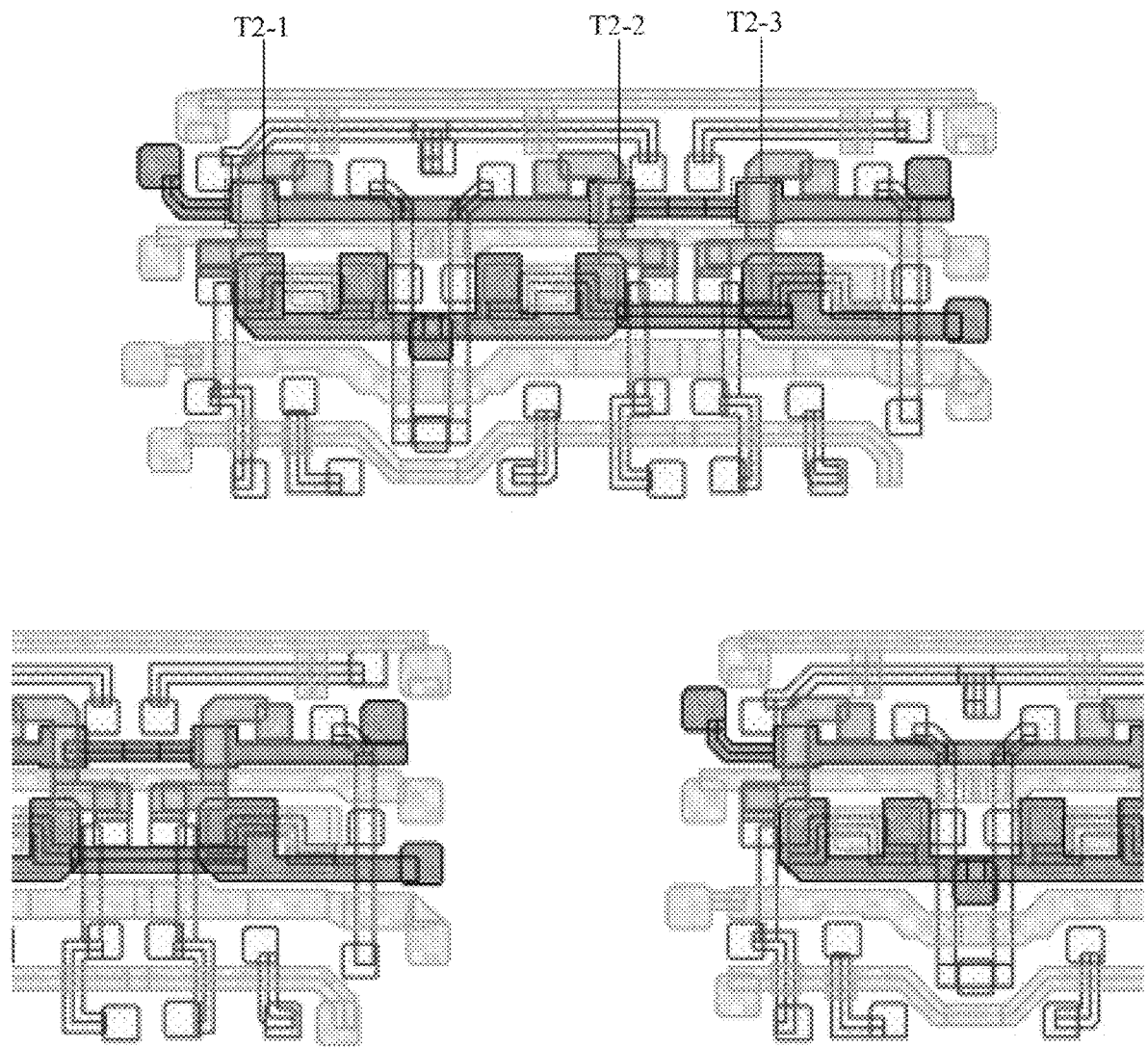
FIG. 20 is a schematic diagram of partial superposition of an active layer, a first gate layer, a second gate layer, and an oxide layer in a display panel according to some embodiments of the present disclosure.

FIG. 19 is a schematic partial diagram of an oxide layer d in a display panel according to some embodiments of the present disclosure, and FIG. 20 is a schematic diagram of partial superposition of an active layer a, a first gate layer b, a second gate layer c, and an oxide layer d in a display panel according to some embodiments of the present disclosure. The oxide layer d is disposed on a side of the third gate insulating layer distal from the base substrate 1. Referring to FIGS. 19 and 20, the oxide layer d includes an oxide pattern for forming the second transistor T2-1 in the first pixel circuit 211, an oxide pattern for forming the second transistor T2-2 in the second pixel circuit 212, and an oxide pattern for forming the second transistor T2-3 in the third pixel circuit 213.

In addition, a fourth gate insulating layer is formed on the oxide layer d, and is configured to insulate the oxide layer d from a third gate layer e formed subsequently.

Figure 21:
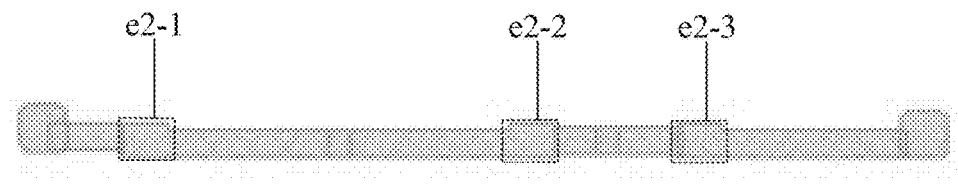
FIG. 21 is a schematic partial diagram of a third gate layer in a display panel according to some embodiments of the present disclosure.
Figure 21:
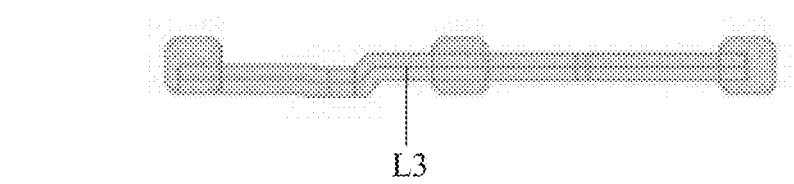
Figure 21:
Figure 21:
Figure 21:
Figure 21:
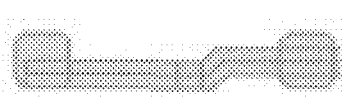
Figure 22:
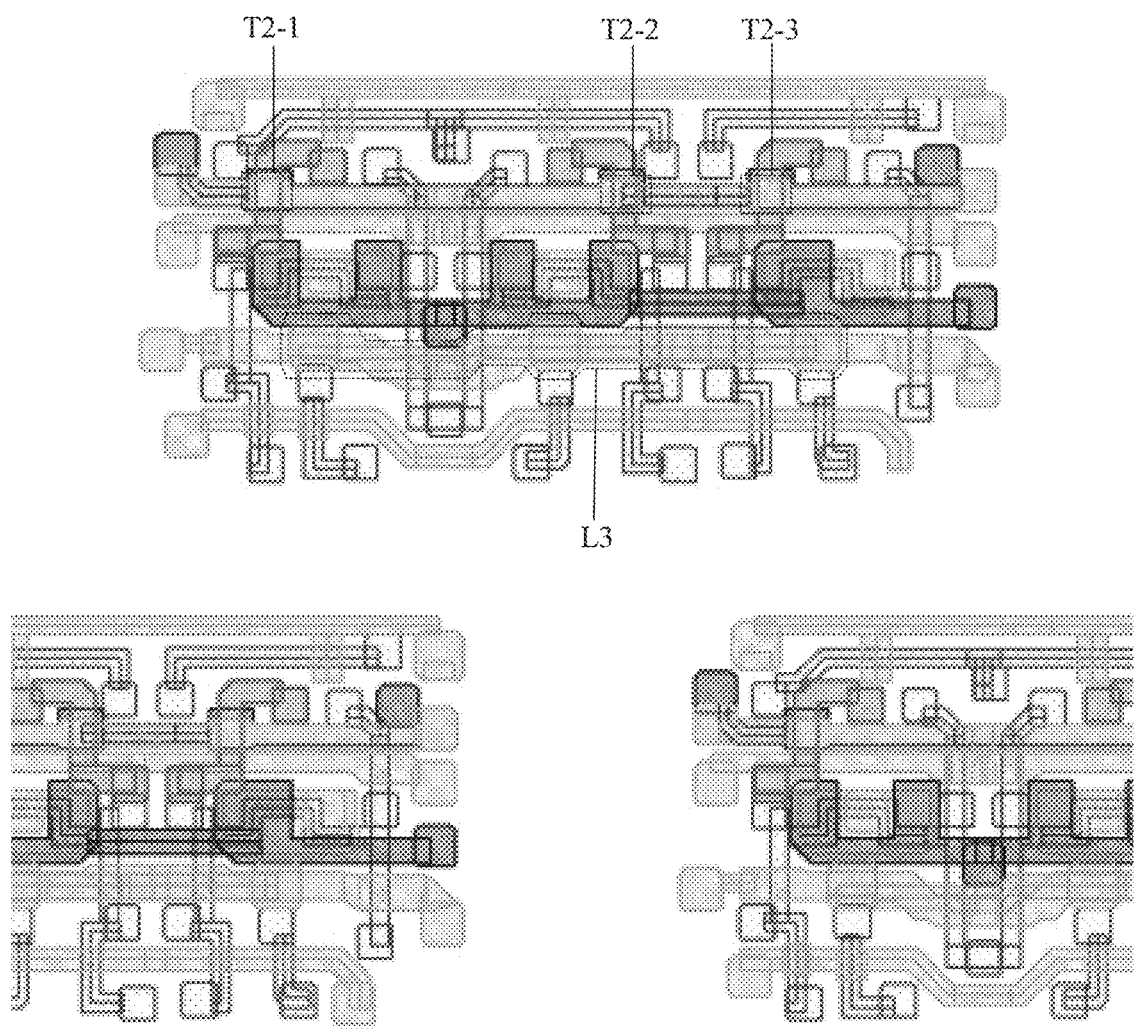
FIG. 22 is a schematic diagram of partial superposition of an active layer, a first gate layer, a second gate layer, an oxide layer, and a third gate layer in a display panel according to some embodiments of the present disclosure.

FIG. 21 is a schematic partial diagram of a third gate layer e in a display panel according to some embodiments of the present disclosure, and FIG. 22 is a schematic diagram of partial superposition of an active layer a, a first gate layer b, a second gate layer c, an oxide layer d and a third gate layer e in a display panel according to some embodiments of the present disclosure. The third gate layer e is disposed on a side of the fourth gate insulating layer distal from the base substrate 1. Referring to FIGS. 21 and 22, the third gate layer e includes a top gate pattern e2-1 of the second transistor T2-1 in the first pixel circuit 211, a top gate pattern e2-2 of the second transistor T2-2 in the second pixel circuit 212, a top gate pattern e2-3 of the second transistor T2-3 in the third pixel circuit 213, and a third connecting line L3. The second transistor T2-1 in the first pixel circuit 211 is formed by at least partially overlapping the top gate pattern e2-1 of the second transistor T2-1 with the bottom gate pattern c2-1 disposed on the second gate layer c in the second transistor T2-1. The second transistor T2-2 in the second pixel circuit 212 is formed by at least partially overlapping the top gate pattern e2-2 of the second transistor T2-2 with the bottom gate pattern c2-2 disposed on the second gate layer c in the second transistor T2-2. The second transistor T2-3 in the second pixel circuit 213 is formed by at least partially overlapping the top gate pattern e2-3 of the second transistor T2-3 with the bottom gate pattern c2-3 disposed on the second gate layer c in the second transistor T2-3.

In addition, two interlayer dielectric layers, namely, a first interlayer dielectric layer f and a second interlayer dielectric layer g, are formed on the third gate layer e, and are configured to insulate the third gate layer e from a first source-drain layer h formed subsequently.

Figure 23:
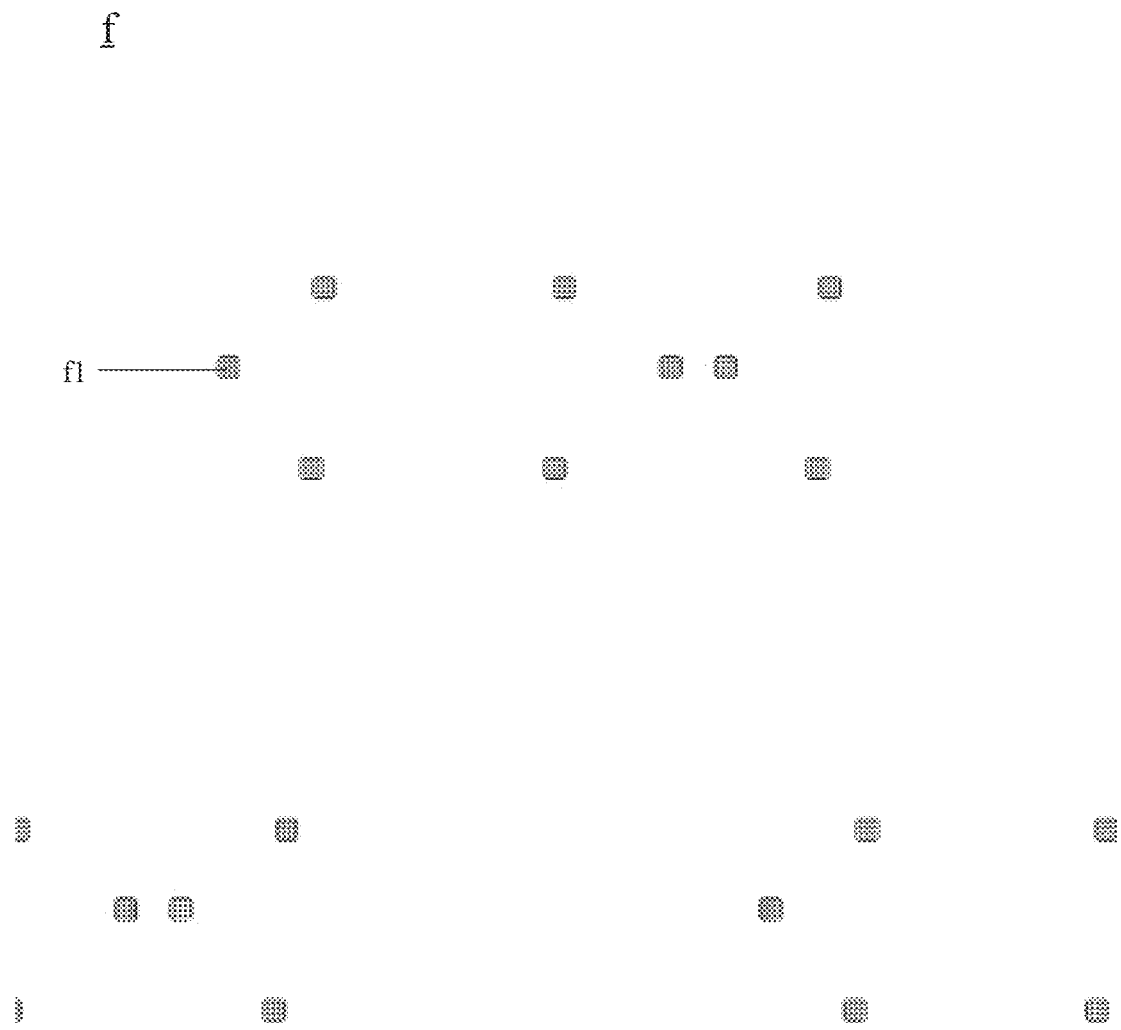
FIG. 23 is a schematic partial structural diagram of a first interlayer dielectric layer in a display panel according to some embodiments of the present disclosure.
Figure 24:
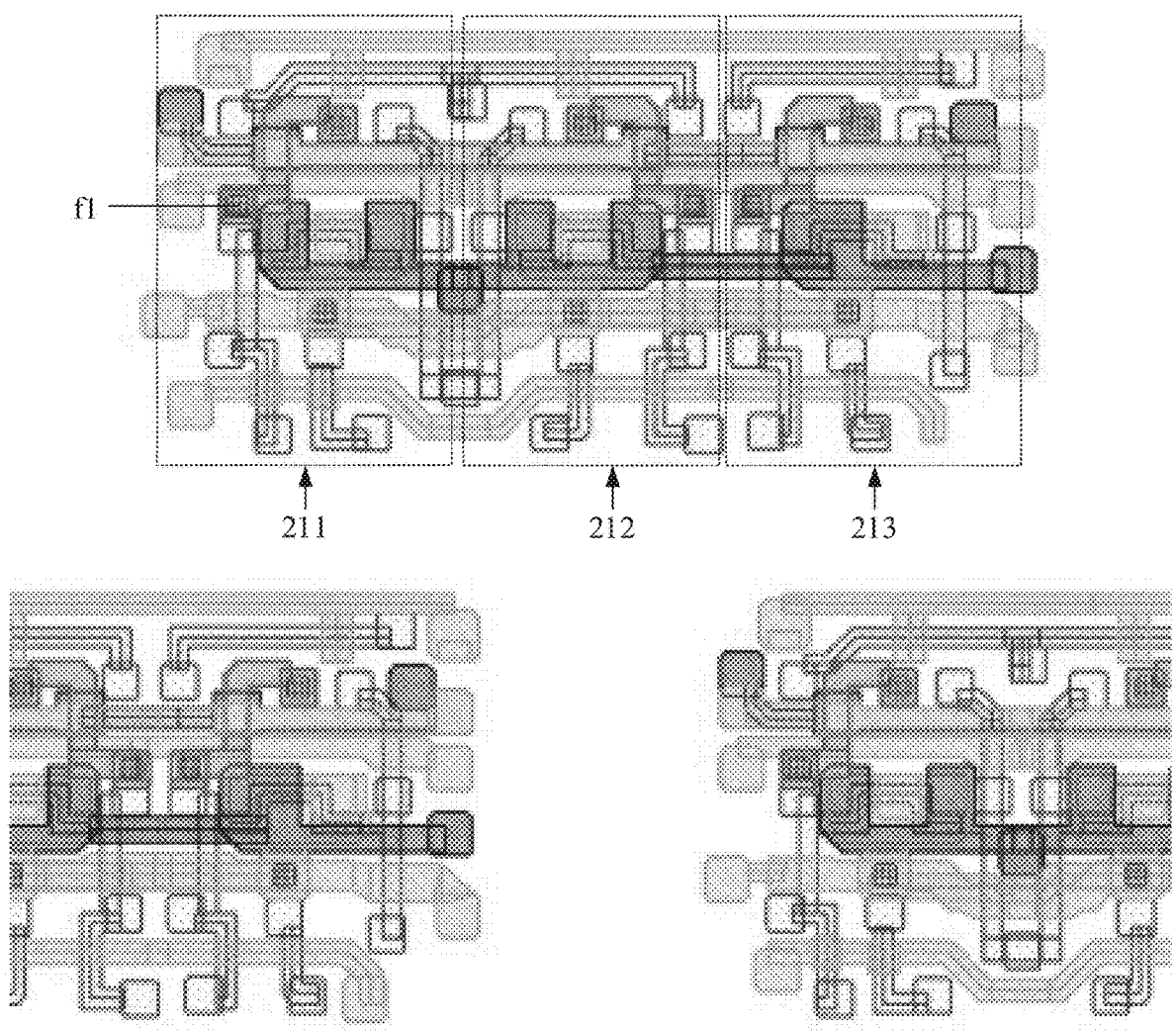
FIG. 24 is a schematic diagram of partial superposition of an active layer, a first gate layer, a second gate layer, an oxide layer, a third gate layer, and a first interlayer dielectric layer in a display panel according to some embodiments of the present disclosure.

FIG. 23 is a schematic partial diagram of a first interlayer dielectric layer f in a display panel according to some embodiments of the present disclosure, and FIG. 24 is a schematic diagram of partial superposition of an active layer a, a first gate layer b, a second gate layer c, an oxide layer d, a third gate layer e and a first interlayer dielectric layer f in a display panel according to some embodiments of the present disclosure.

Figure 25:
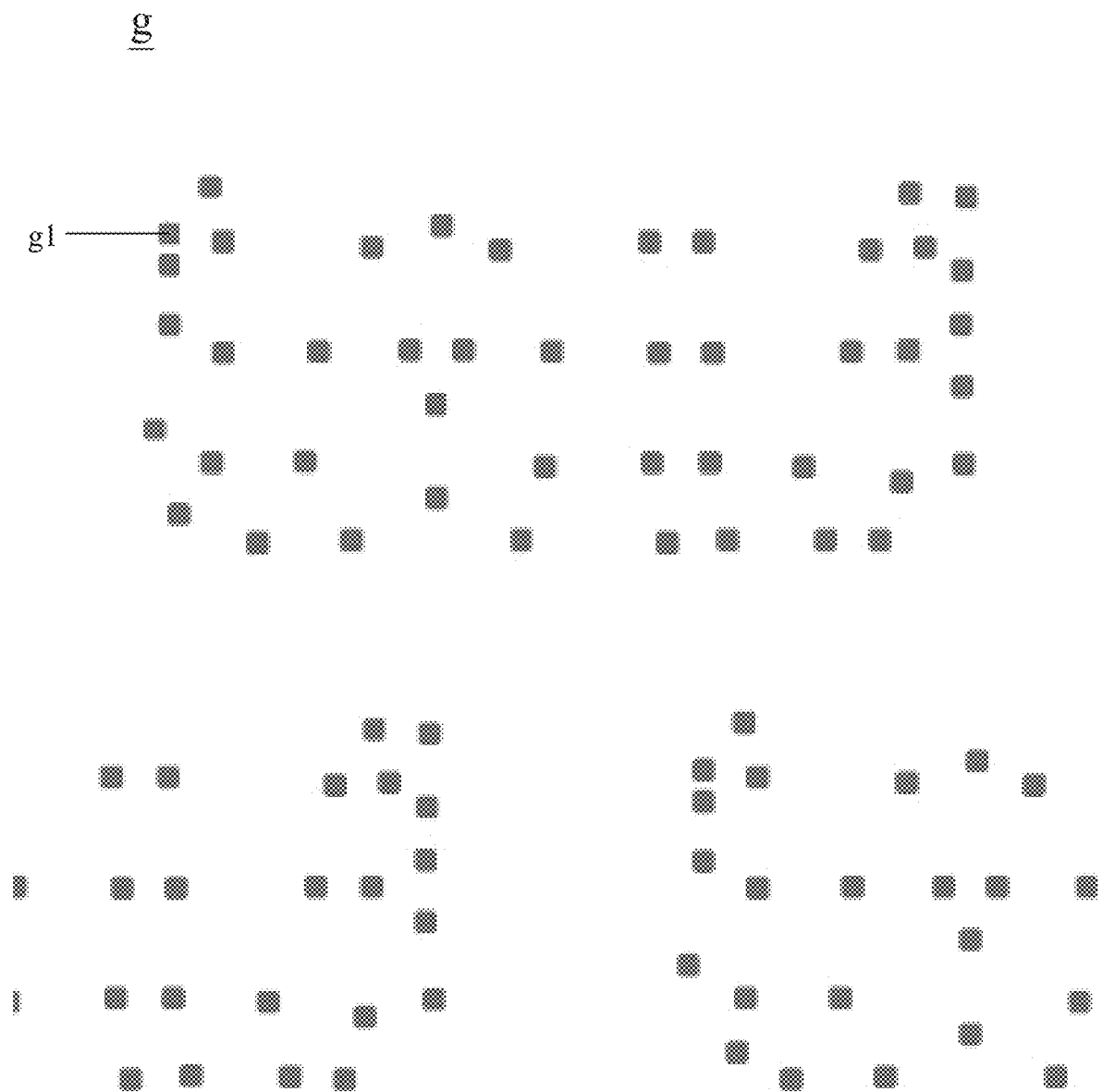
FIG. 25 is a schematic partial diagram of a second interlayer dielectric layer in a display panel according to some embodiments of the present disclosure.
Figure 26:
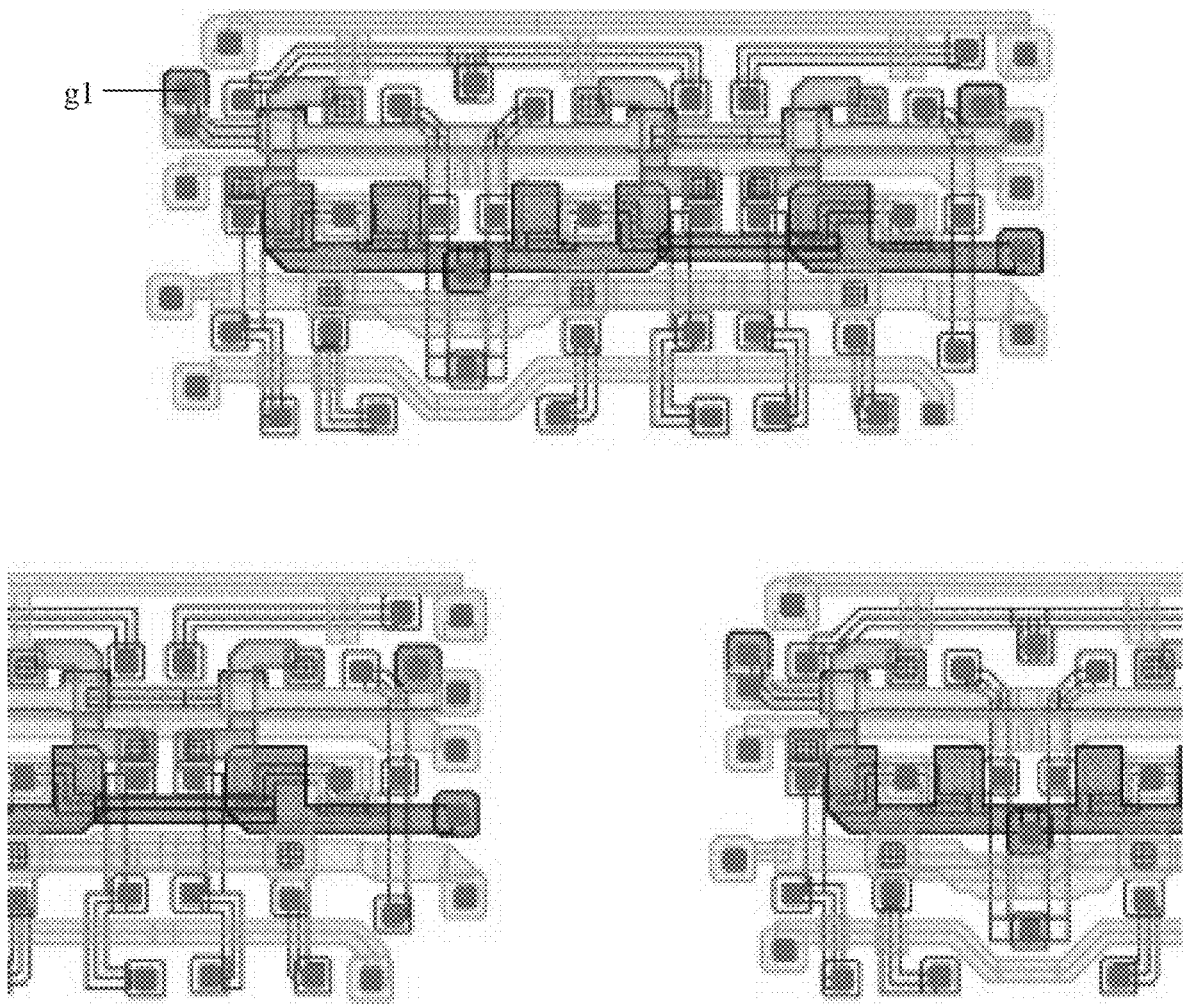
FIG. 26 is a schematic diagram of partial superposition of an active layer, a first gate layer, a second gate layer, an oxide layer, a third gate layer, a first interlayer dielectric layer, and a second interlayer dielectric layer in a display panel according to some embodiments of the present disclosure.

FIG. 25 is a schematic partial diagram of a second interlayer dielectric layer g in a display panel according to some embodiments of the present disclosure, and FIG. 26 is a schematic diagram of partial superposition of an active layer a, a first gate layer b, a second gate layer c, an oxide layer d, a third gate layer e, a first interlayer dielectric layer f and a second interlayer dielectric layer g in a display panel according to some embodiments of the present disclosure.

To conveniently show each first via hole f1 in the first interlayer dielectric layer f and each second via hole g1 in the second interlayer dielectric layer g, in FIGS. 23 to 26, the first via holes f1 and the second via hole g1 are represented by filled patterns, and other regions without filled patterns are configured to represent regions where the first interlayer dielectric layer f and the second interlayer dielectric layer f have solid materials.

It should be noted that each via hole formed in the interlayer dielectric layer is configured to connect a subsequently formed film layer to a film layer on a side of the interlayer dielectric layer proximal to the base substrate 1. That is, each via hole is a via hole for connecting the film layers.

Figure 27:
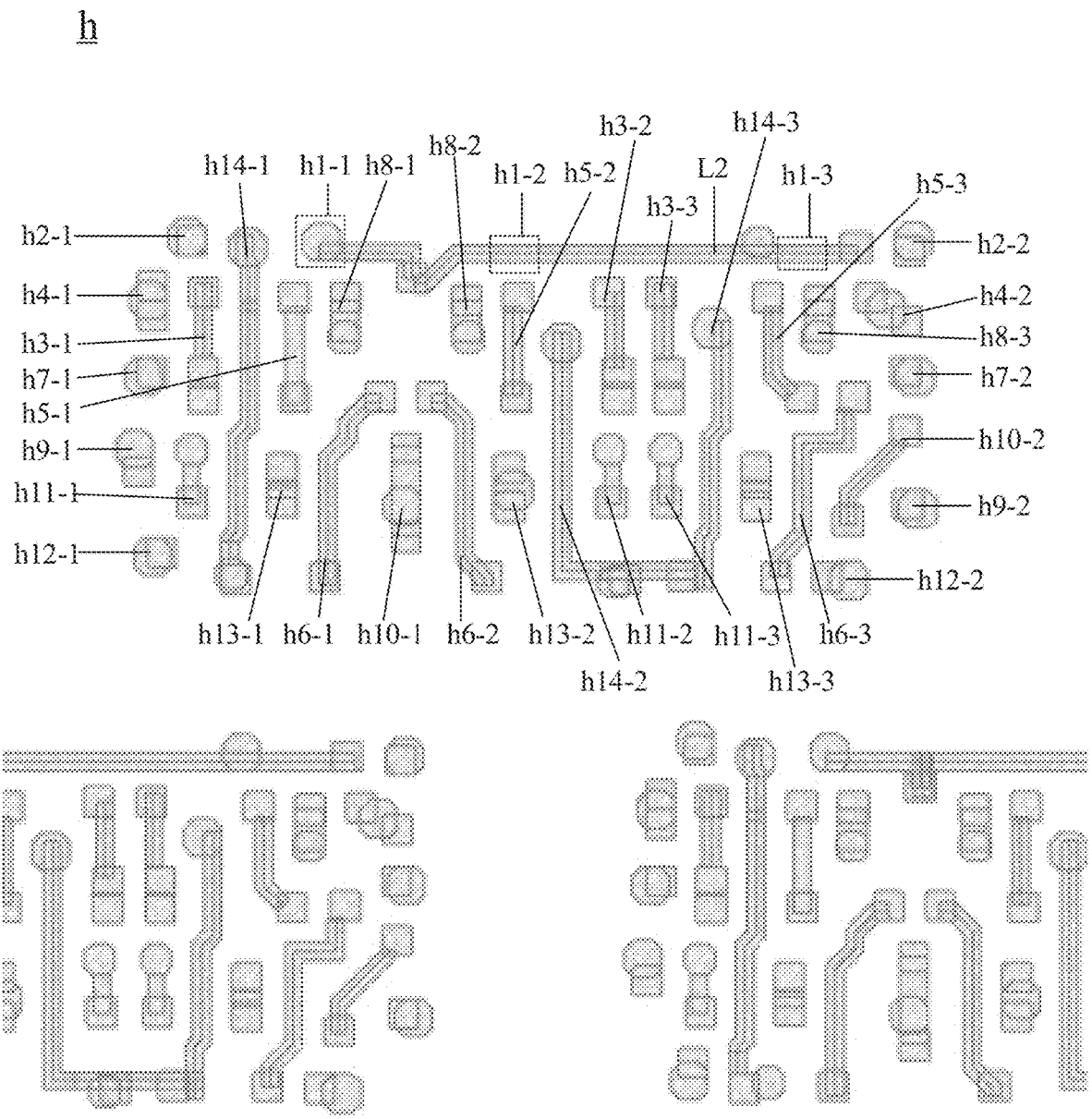
FIG. 27 is a schematic partial structural diagram of a first source-drain layer in a display panel according to some embodiments of the present disclosure.
Figure 28:
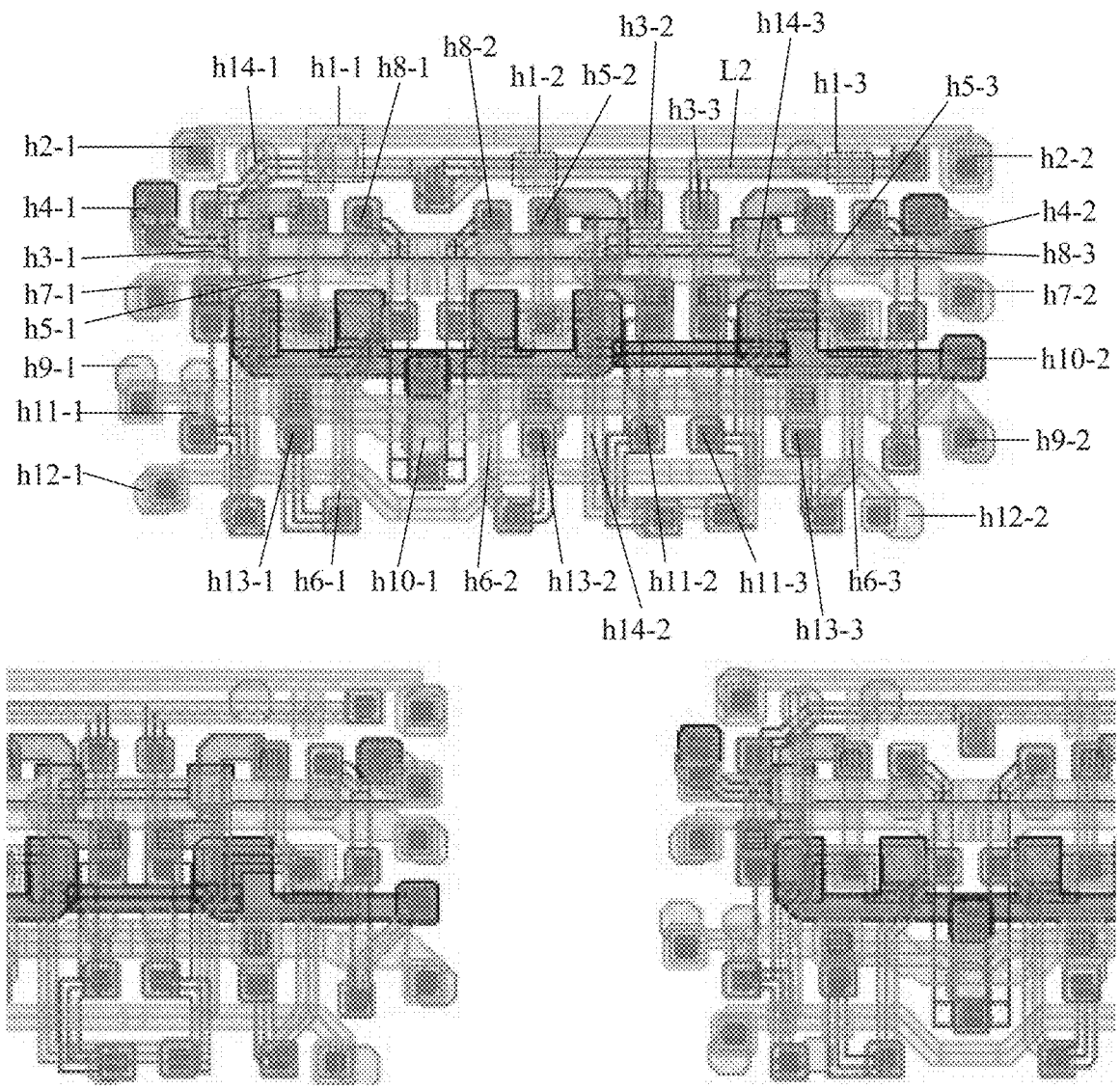
FIG. 28 is a schematic diagram of partial superposition of an active layer, a first gate layer, a second gate layer, an oxide layer, a third gate layer, a first interlayer dielectric layer, a second interlayer dielectric layer, and a first source-drain layer in a display panel according to some embodiments of the present disclosure.

FIG. 27 is a schematic partial diagram of a first source-drain layer h in a display panel according to some embodiments of the present disclosure, and FIG. 28 is a schematic diagram of partial superposition of an active layer a, a first gate layer b, a second gate layer c, an oxide layer d, a third gate layer e, a first interlayer dielectric layer f, a second interlayer dielectric layer g and a first source-drain layer h in a display panel according to some embodiments of the present disclosure. Referring to FIGS. 27 and 28, the first source-drain layer h includes:

a second connecting line L2;

a first source-drain pattern h1-1, a second source-drain pattern h2-1, a third source-drain pattern h3-1, a fourth source-drain pattern h4-1, a fifth source-drain pattern h5-1, a sixth source-drain pattern h6-1, a seventh source-drain pattern h7-1, an eighth source-drain pattern h8-1, a ninth source-drain pattern h9-1, a tenth source-drain pattern h10-1, an eleventh source-drain pattern h11-1, a twelfth source-drain pattern h12-1, a thirteenth source-drain pattern h13-1 and a fourteenth source-drain pattern h14-1 which are included in the first pixel circuit 211;

a first source-drain pattern h1-2, a third source-drain pattern h3-2, a fifth source-drain pattern h5-2, a sixth source-drain pattern h6-2, an eighth source-drain pattern h8-2, a tenth source-drain pattern h10-1, an eleventh source-drain pattern h11-2, a thirteenth source-drain pattern h13-2 and a fourteenth source-drain pattern h14-2 which are included in the second pixel circuit 212; and a first source-drain pattern h1-3, a second source-drain pattern h2-2, a third source-drain pattern h3-3, a fourth source-drain pattern h4-2, a fifth source-drain pattern h5-3, a sixth source-drain pattern h6-3, a seventh source-drain pattern h7-2, an eighth source-drain pattern h8-3, a ninth source-drain pattern h9-2, a tenth source-drain pattern h10-2, an eleventh source-drain pattern h11-3, a twelfth source-drain pattern h12-2, a thirteenth source-drain pattern h13-3 and a fourteenth source-drain pattern h14-3 which are included in the third pixel circuit 213.

For the first pixel circuit 211, the first source-drain pattern h1-1 is configured to connect the first pole of the first transistor T1-1, the second connecting line L2 and a first transparent wiring pattern k1 disposed on the first transparent wiring layer k to be introduced later, wherein the first source-drain pattern h1-1 and the second connecting line L2 are of an integrated structure;

the second source-drain pattern h2-1 is configured to connect the first gate pattern b1-1 disposed on the first gate layer b in the first transistor T1-1 and a first reset signal line Preset disposed in the first transparent wiring layer k to be introduced later.

the third source-drain pattern h3-1 is configured to connect the second pole of the first transistor T1-1, the first pole of the second transistor T2-1, the first pole of the third transistor T3-1 and the first pole of the sixth transistor T6-1;

the fourth source-drain pattern h4-1 is configured to connect the bottom gate pattern c2-1 disposed on the second gate layer c in the second transistor T2-1, the top gate pattern e2-1 disposed on the third gate layer e in the second transistor T2-1, and a first gate signal line Gate_N disposed in the first transparent wiring layer k to be introduced later;

the fifth source-drain pattern h5-1 is configured to connect the second pole of the second transistor T2-1, the second capacitor plate Cst2-1 of the storage capacitor Cst-1 disposed in the first gate layer b, and a third gate pattern b3-1 of the third transistor T3-1 disposed on the first gate layer b;

the sixth source-drain pattern h6-1 is configured to connect the second pole of the third transistor T3-1, the second pole of the fourth transistor T4-1, the first pole of the fifth transistor T5-1 and the second pole of the eighth transistor T8-1;

the seventh source-drain pattern h7-1 is configured to connect the fourth gate pattern b4-1 of the fourth transistor T4-1 disposed on the first gate layer b and a second gate signal line Gate_P disposed in the first transparent wiring layer k to be introduced later;

the eighth source-drain pattern h8-1 is configured to connect the first pole of the fourth transistor T4-1 and a second transparent wiring pattern k2 disposed in the first transparent wiring layer k to be introduced later;

the ninth source-drain pattern h9-1 is configured to connect the fifth gate pattern b5-1 of the fifth transistor T5-1 disposed on the first gate layer b, the sixth gate pattern b6-1 of the sixth transistor T6-1 disposed on the first gate layer b, and a light emission control signal EM disposed in the first transparent wiring layer k to be introduced later;

the tenth source-drain pattern h10-1 is configured to connect the second pole of the fifth transistor T5-1, the first capacitor plate Cst1-1 of the storage capacitor Cst-1 disposed in the second gate layer c, and a third transparent wiring pattern k3 disposed in the first transparent wiring layer k to be introduced later;

the eleventh source-drain pattern h1-1 is configured to connect the second pole of the sixth transistor T6-1, the second pole of the seventh transistor T7-1, and a seventh transparent wiring pattern k7 disposed on the first transparent wiring layer k to be introduced later;

the twelfth source-drain pattern h12-1 is configured to connect the seventh gate pattern b7-1 of the seventh transistor T7-1 disposed on the first gate layer b, the eighth gate pattern b8-1 of the eighth transistor T8-1 disposed on the first gate layer b, and a second reset signal line Preset_H disposed in the first transparent wiring layer k to be described later;

the thirteenth source-drain pattern h13-1 is configured to connect the first pole of the eighth transistor T8-1 and a third connecting line L3 disposed in the third gate layer e; and the fourteenth source-drain pattern h14-1 is configured to connect the first pole of the seventh transistor T7-1, and the fifth transparent wiring pattern k5 and the sixth transparent wiring pattern k6 which are disposed on the first transparent wiring layer k to be described later. The first transparent wiring layer k is described in detail below.

For the second pixel circuit 212, the first source-drain pattern h1-2 is configured to connect the first pole of the first transistor T1-2 and the second connecting line L2, wherein the first source-drain pattern h1-2 and the second connecting line L2 are of an integrated structure;

the third source-drain pattern h3-2 is configured to connect the second pole of the first transistor T1-2, the first pole of the second transistor T2-2, the first pole of the third transistor T3-2 and the first pole of the sixth transistor T6-2;

the fifth source-drain pattern h5-2 is configured to connect the second pole of the second transistor T2-2, the second capacitor plate Cst2-2 of the storage capacitor Cst-2 disposed in the first gate layer b, and a third gate pattern b3-2 of the third transistor T3-2 disposed on the first gate layer b;

the sixth source-drain pattern h6-2 is configured to connect the second pole of the third transistor T3-2, the second pole of the fourth transistor T4-2, the first pole of the fifth transistor T5-2 and the second pole of the eighth transistor T8-2;

the eighth source-drain pattern h8-2 is configured to connect the first pole of the fourth transistor T4-2 and a ninth transparent wiring pattern k9 disposed on the first transparent wiring layer k to be introduced later;

the tenth source-drain pattern h10-1 is configured to connect the second pole of the fifth transistor T5-2, the first capacitor plate Cst1-2 of the storage capacitor Cst-2 disposed in the second gate layer c, and a third transparent wiring pattern k3 disposed in the first transparent wiring layer k to be introduced later;

the eleventh source-drain pattern h11-2 is configured to connect the second pole of the sixth transistor T6-2, the second pole of the seventh transistor T7-2, and a twelfth transparent wiring pattern k12 disposed in the first transparent wiring layer k to be introduced later;

the thirteenth source-drain pattern h13-2 is configured to connect the first pole of the eighth transistor T8-2, the third connecting line L3 disposed in the third gate layer e, and a fourth transparent wiring pattern k4 disposed on the first transparent wiring layer k to be introduced later; and the fourteenth source-drain pattern h14-2 is configured to connect the first pole of the seventh transistor T7-2, a tenth transparent wiring pattern k10, and an eleventh transparent wiring pattern k11 which are disposed on the first transparent wiring layer k to be introduced later. The first transparent wiring layer k is described in detail below.

In the embodiments of the present disclosure, the first gate patterns b1-1, b1-2 and b1-3 disposed on the first gate layer b are set as an integrated structure. In this way, for the second pixel circuit 212, the first gate pattern b1-2 disposed on the first gate layer b in the first transistor T1-2 and the first gate pattern b1-2 disposed on the first gate layer b in the first transistor T1-2 are connected to the first reset signal line Preset disposed in the first transparent wiring layer k to be introduced later by the integrated structure of the first gate patterns.

The bottom gate patterns c2-1, c2-2, and c2-3 disposed on the second gate layer c are also set as an integrated structure, and the top gate patterns e2-1, e2-2, and e2-3 disposed on the third gate layer e are also set as an integrated structure. In this way, for the second pixel circuit 212, the bottom gate pattern c2-2 disposed on the second gate layer c in the second transistor T2-2, and the top gate pattern e2-2 disposed on the third gate layer e in the second transistor T2-2 are connected, respectively by the integrated structure of the bottom gate patterns and the integrated structure of the top gate patterns, to the first gate signal line Gate_N disposed in the first transparent wiring layer k to be introduced later.

The fourth gate patterns b4-1, b4-2, and b4-3 disposed on the first gate layer b are also set as an integrated structure. In this way, for the second pixel circuit 212, the fourth gate pattern b4-2 of the fourth transistor T4-2 disposed on the first gate layer b is connected to a second gate signal line Gate_P disposed in the first transparent wiring layer k to be introduced later by the integrated structure of the fourth gate patterns.

The fifth gate patterns b5-1, b6-1, and b5-2 and the sixth gate patterns b6-2, b5-3, and b6-3 which are disposed on the second gate layer b are also set as integrated structures. In this way, for the second pixel circuit 212, the fifth gate pattern b5-2 of the fifth transistor T5-2 disposed on the second gate layer b and the sixth gate pattern b6-2 of the sixth transistor T6-2 disposed on the first gate layer b are connected, by the integrated structure of the fifth gate patterns and the integrated structure of the sixth gate patterns, to a light emission control signal EM disposed in the first transparent wiring layer k to be introduced later.

The seventh gate patterns b7-1, b7-2, and b7-3 and the eighth gate patterns b8-1, b8-2, and b8-3 which are disposed on the first gate layer b are also set as integrated structures. In this way, for the second pixel circuit 212, the seventh gate pattern b7-2 of the seventh transistor T7-2 disposed on the first gate layer b and the eighth gate pattern b8-2 of the eighth transistor T8-2 disposed on the first gate layer b are connected, by the integrated structure of the seventh gate patterns and the integrated structure of the eighth gate patterns, to a second reset signal line Preset H disposed in the first transparent wiring layer k to be introduced later.

For the third pixel circuit 213, the first source-drain pattern h1-3 is configured to connect the first pole of the first transistor T1-3 and the second connecting line L2, wherein the first source-drain pattern h1-3 and the second connecting line L2 are of an integrated structure;

the second source-drain pattern h2-2 is configured to connect the first gate pattern b1-3 disposed on the first gate layer b in the first transistor T1-3 and a first reset signal line Preset disposed in the first transparent wiring layer k to be introduced later;

the third source-drain pattern h3-3 is configured to connect the second pole of the first transistor T1-3, the first pole of the second transistor T2-3, the first pole of the third transistor T3-3 and the first pole of the sixth transistor T6-3;

the fourth source-drain pattern h4-2 is configured to connect the bottom gate pattern c2-3 disposed on the second gate layer c in the second transistor T2-3, the top gate pattern e2-3 disposed on the third gate layer e in the second transistor T2-3, and a first gate signal line Gate_N disposed in the first transparent wiring layer k to be introduced later;

the fifth source-drain pattern h5-3 is configured to connect the second pole of the second transistor T2-3, the second capacitor plate Cst2-3 of the storage capacitor Cst-3 disposed in the first gate layer b, and a third gate pattern b3-3 of the third transistor T3-3 disposed on the first gate layer b;

the sixth source-drain pattern h6-3 is configured to connect the second pole of the third transistor T3-3, the second pole of the fourth transistor T4-3, the first pole of the fifth transistor T5-3 and the second pole of the eighth transistor T8-3;

the seventh source-drain pattern h7-2 is configured to connect the fourth gate pattern b4-3 of the fourth transistor T4-3 disposed on the first gate layer b and a second gate signal line Gate_P disposed in the first transparent wiring layer k to be introduced later;

the eighth source-drain pattern h8-3 is configured to connect the first pole of the fourth transistor T4-3 and a sixteenth transparent wiring pattern k16 disposed on the first transparent wiring layer k to be introduced later;

the ninth source-drain pattern h9-2 is configured to connect the fifth gate pattern b5-3 of the fifth transistor T5-3 disposed on the first gate layer b, the sixth gate pattern b6-3 of the sixth transistor T6-3 disposed on the first gate layer b, and a light emission control signal EM disposed in the first transparent wiring layer k to be introduced later;

the tenth source-drain pattern h10-2 is configured to connect the second pole of the fifth transistor T5-3, the first capacitor plate Cst1-3 of the storage capacitor Cst-3 disposed in the second gate layer c, and a driving power supply line VDD-2 disposed in a second transparent wiring layer n to be introduced later, wherein the driving power supply line VDD-2 is a driving power supply line connected to the third pixel circuit 213;

the eleventh source-drain pattern h11-3 is configured to connect the second pole of the sixth transistor T6-3, the second pole of the seventh transistor T7-3, and a fifteenth transparent wiring pattern k15 disposed on the first transparent wiring layer k to be introduced later;

the twelfth source-drain pattern h12-2 is configured to connect the seventh gate pattern b7-3 of the seventh transistor T7-3 disposed on the first gate layer b, the eighth gate pattern b8-3 of the eighth transistor T8-3 disposed on the first gate layer b, and a second reset signal line Preset_H disposed in the first transparent wiring layer k to be described later;

the thirteenth source-drain pattern h13-3 is configured to connect the first pole of the eighth transistor T8-3 and a third connecting line L3 disposed in the third gate layer e. In this way, by the above thirteenth source-drain pattern h13-2, the first pole of the eighth transistor T8-2 for constituting the second pixel circuit 212, the third connecting line L3 and a fourth transparent wiring pattern k4 disposed on the first transparent wiring layer k to be described later are connected, and further, the first pole of the eighth transistor T8-2 for constituting the second pixel circuit 212, the third connecting line L3 and a third reset power supply line vinit3 disposed in the second transparent wiring layer n to be described later are connected by the fourth transparent wiring k4. Meanwhile, respectively by the above thirteenth source-drain patterns h13-1 and h13-3, the first pole of the eighth transistor T8-1 for constituting the first pixel circuit 211 and the third connecting line L3 are also connected, and the first pole of the eighth transistor T8-3 of the third pixel circuit 213 and the third connecting line L3 are also connected. In summary, the connection between the three pixel circuits 21 and the third reset power supply line vinit3 are achieved by one third reset power supply line vinit3 and one third connecting line L3; and the fourteenth source-drain pattern h14-3 is configured to connect the first pole of the seventh transistor T7-3 and a fifth transparent wiring pattern k5-1, a six transparent wiring, a thirteenth transparent wiring pattern k13, and a fourteenth transparent wiring pattern k14 which are disposed on the first transparent wiring layer k to be described later. The first transparent wiring layer k is described in detail below. The fourteenth source-drain patterns h14-3 and h14-2 are of an integrated structure.

In addition, a passivation layer i is formed on the first source-drain layer h, and is configured to insulate the first source-drain layer h from the first transparent wiring layer k formed subsequently.

Figure 29:
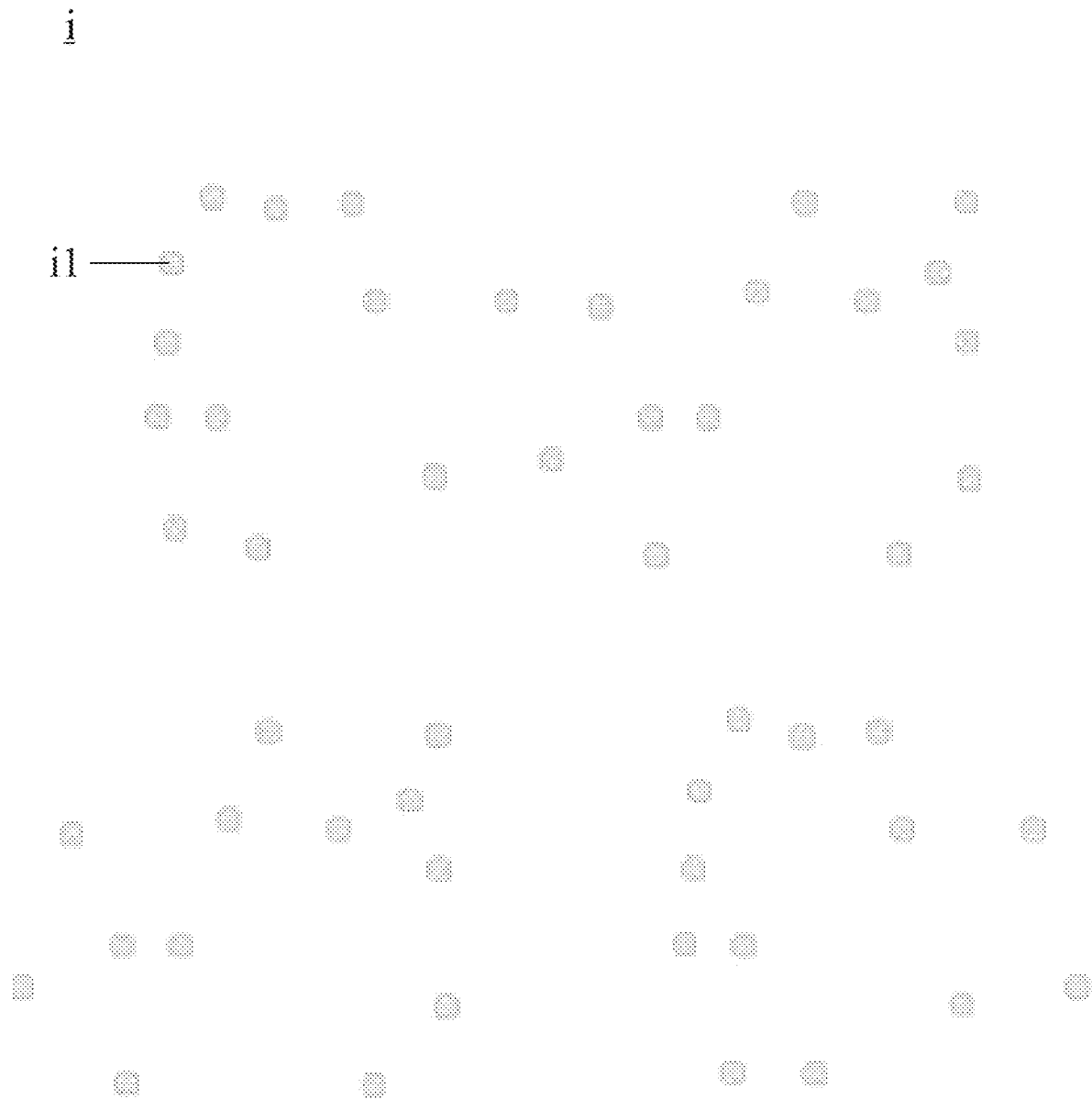
FIG. 29 is a schematic partial diagram of a passivation layer in a display panel according to some embodiments of the present disclosure.
Figure 30:
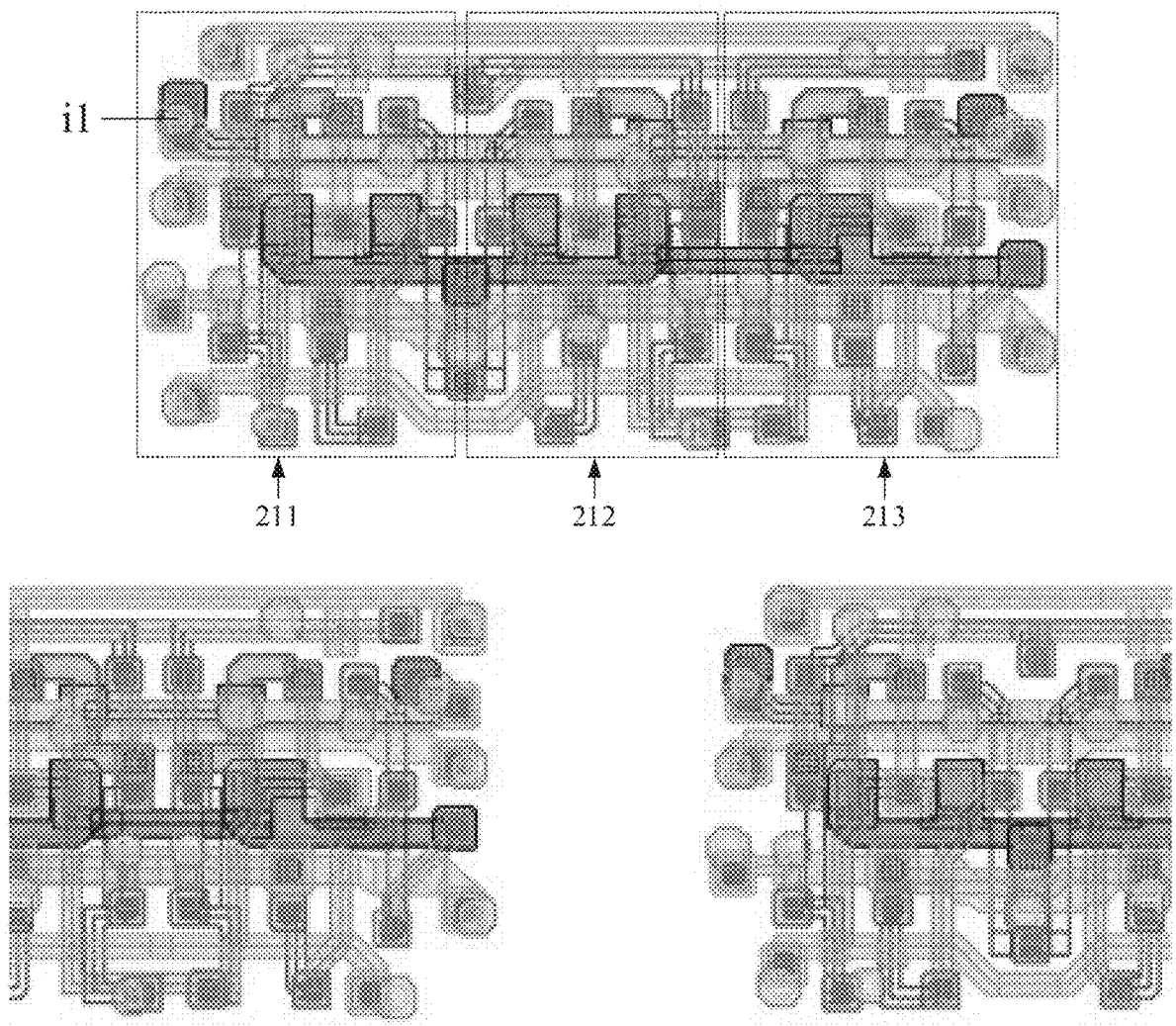
FIG. 30 is a schematic diagram of partial superposition of an active layer, a first gate layer, a second gate layer, an oxide layer, a third gate layer, a first interlayer dielectric layer, a second interlayer dielectric layer, a first source-drain layer and a passivation layer in a display panel according to some embodiments of the present disclosure.

FIG. 29 is a schematic partial diagram of a passivation layer i in a display panel according to some embodiments of the present disclosure, and FIG. 30 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h and a passivation layer i in a display panel according to some embodiments of the present disclosure. The passivation layer i is disposed on a side of the first source-drain layer h distal from the base substrate 1.

To conveniently show each third via hole i1 in the passivation layer, in FIGS. 29 and 30, the via holes are represented by filled patterns, and other regions without filled patterns are configured to represent regions where the passivation layer has a solid material. It should be noted that each third via hole i1 formed in the passivation layer is configured to connect a subsequently formed film layer to a film layer on a side of the passivation layer proximal to the base substrate 1. That is, each third via hole i1 is a via hole for connecting the film layers.

Figure 31:
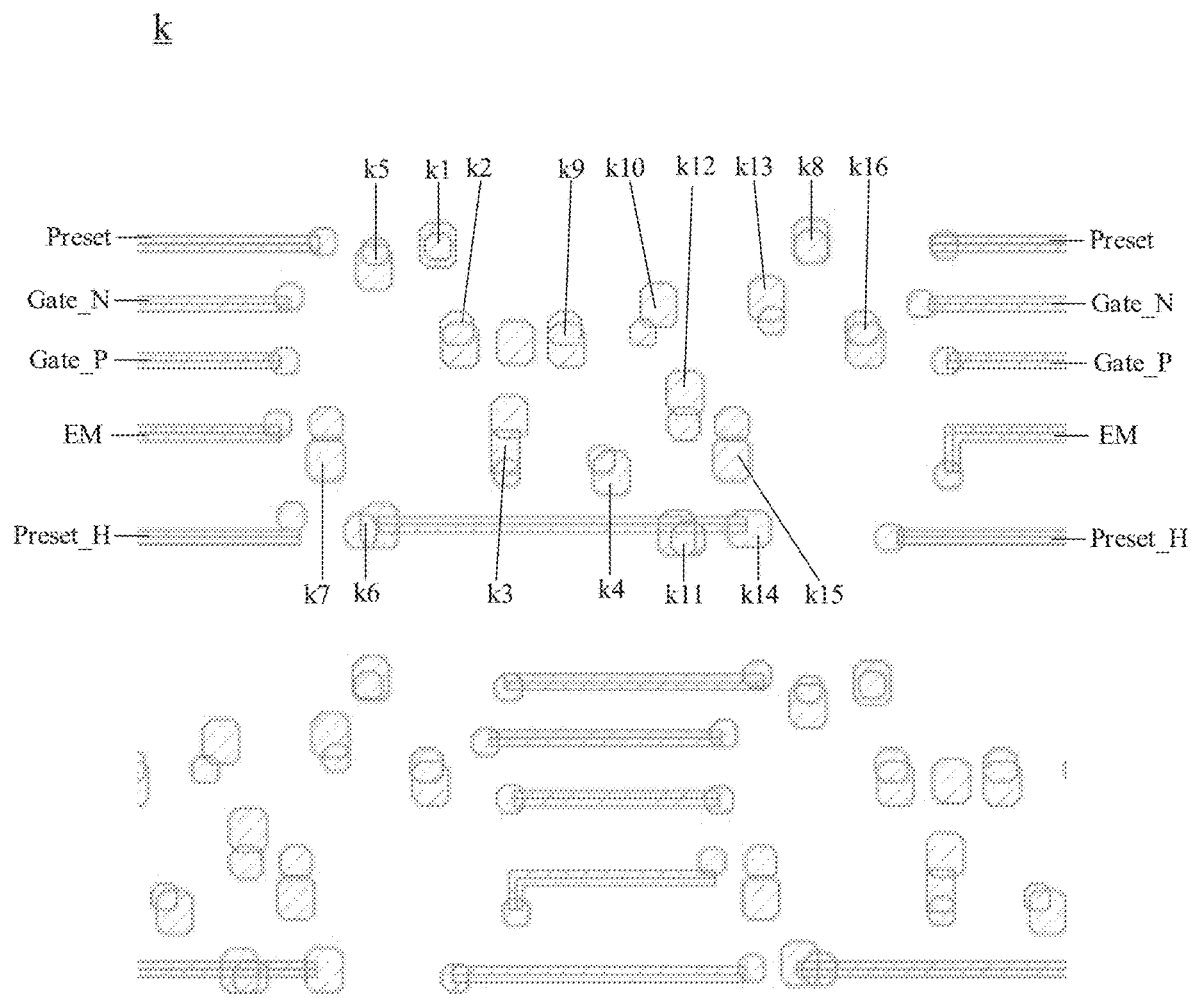
FIG. 31 is a schematic partial structural diagram of a first transparent wiring layer in a display panel according to some embodiments of the present disclosure.
Figure 32:
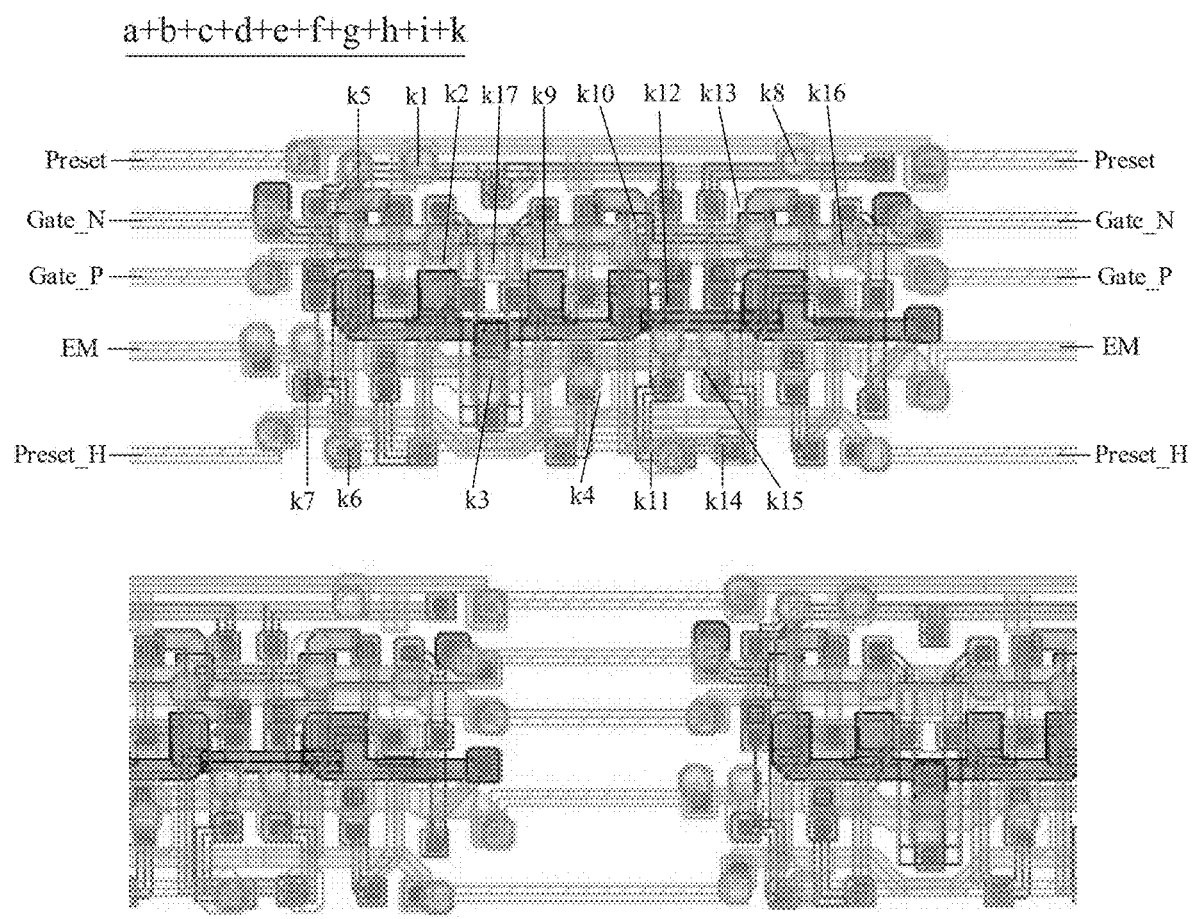
FIG. 32 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer and a first transparent wiring layer in a display panel according to some embodiments of the present disclosure.

FIG. 31 is a schematic partial diagram of a first transparent wiring layer k in a display panel according to some embodiments of the present disclosure, and FIG. 32 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i and a first transparent wiring layer k in a display panel according to some embodiments of the present disclosure. The first transparent wiring layer k is disposed on a side of the passivation layer i distal from the base substrate 1. Referring to FIGS. 31 and 32, the first transparent wiring layer k includes:

a first reset signal line Preset, a second reset signal line Preset_H, a first gate signal line Gate_N, a second gate signal line Gate_P, and a light emission control signal line EM. It can be understood that two sides of each pixel circuit group 2 in the first direction are provided with line segments corresponding to the first reset signal line Preset, line segments corresponding to the second reset signal line Preset_H, line segments corresponding to the first gate signal line Gate_N, line segments corresponding to the second gate signal line Gate_P and line segments corresponding to the light emission control signal line EM, and these line segments are configured to connect two adjacent pixel circuit groups 2 in the first direction;

a first transparent wiring pattern k1, configured to connect the first source-drain pattern h1-1 disposed on the first source-drain layer h and a first reset power supply line vinit1-1 disposed on the second transparent wiring layer n to be introduced later, wherein the first reset power supply line vinit1-1 is one first reset power supply line vinit1 that runs through and is connected to the first pixel circuit 211;

a second transparent wiring pattern k2, configured to connect the eighth source-drain pattern h8-1 disposed on the first source-drain layer h and the data signal line Data-1 disposed in the second transparent wiring layer n to be introduced later, wherein the data signal line Data-1 is one data signal line Data connected to the first pixel circuit 211;

a third transparent wiring pattern k3, configured to connect the tenth source-drain pattern h10-1 disposed on the first source-drain layer h and a driving power signal line VDD-1 disposed in the second transparent wiring layer n to be introduced later, wherein the driving power signal line VDD-1 is one driving power signal line VDD that runs through and is connected to the first pixel circuit 211 and the second pixel circuit 212;

a fourth transparent wiring pattern k4, configured to connect the thirteenth source-drain pattern h13-2 disposed on the first source-drain layer h and the third reset power supply line vinit3 disposed in the second transparent wiring layer n to be introduced later;

a fifth transparent wiring pattern k5 and a sixth transparent wiring pattern k6, configured to connect two ends of the fourteenth source-drain pattern h14-1 disposed on the first source-drain layer h and second reset power supply lines vinit2-1 disposed in the second transparent wiring layer n to be introduced later, wherein the two second reset power supply lines vinit2-1 disposed above and below the first pixel circuit 211 are connected by the fourteenth source-drain pattern h14-1, such that the two second reset power supply lines vinit2-1 disposed above and below the first pixel circuit 211 and the fourteenth source-drain pattern h14-1 form the second reset power supply line vinit2 that runs through the first pixel circuit 211;

a seventh transparent wiring pattern k7, configured to connect the eleventh source-drain pattern h11 disposed on the first source-drain layer h and a seventeenth transparent wiring pattern N1 disposed on the second transparent wiring layer n to be introduced later;

an eighth transparent wiring pattern k8, configured to connect the second connecting line L2 disposed in the first source-drain layer h and a second reset power supply line vinit1-2 disposed in the second transparent wiring layer n to be introduced later;

a ninth transparent wiring pattern k9, configured to connect the eighth source-drain pattern h8-2 disposed on the first source-drain layer h and the data signal line Data-2 disposed in the second transparent wiring layer n to be introduced later, wherein the data signal line Data-2 is one data signal line Data connected to the second pixel circuit 212;

a tenth transparent wiring pattern k10 and an eleventh transparent wiring pattern k11, configured to connect two ends of the fourteenth source-drain pattern h14-2 disposed on the first source-drain layer h and second reset power supply lines vinit2-2 disposed in the second transparent wiring layer n to be introduced later, wherein the two second reset power supply lines vinit2-2 disposed above and below the second pixel circuit 212 may be connected by the fourteenth source-drain pattern h14-2, such that the two second reset power supply lines vinit2-2 disposed above and below the second pixel circuit 212 and the fourteenth source-drain pattern h14-2 form the second reset power supply line vinit2 that runs through the second pixel circuit 212;

a twelfth transparent wiring pattern k12, configured to connect the eleventh source-drain pattern h11-2 disposed on the first source-drain layer h and an eighteenth transparent wiring pattern n2 disposed on the second transparent wiring layer n to be introduced later;

a thirteenth transparent wiring pattern k13 and a fourteenth transparent wiring pattern k14, configured to connect two ends of the fourteenth source-drain pattern h14-3 disposed on the first source-drain layer h and second reset power supply lines vinit2-3 disposed in the second transparent wiring layer n to be introduced later, wherein the two second reset power supply lines vinit2-3 disposed above and below the third pixel circuit 213 are connected by the fourteenth source-drain pattern h14-3, such that the two second reset power supply lines vinit2-3 disposed above and below the third pixel circuit 213 and the fourteenth source-drain pattern h14-3 form the second reset power supply line vinit2 that runs through the third pixel circuit 213;

a fifteenth transparent wiring pattern k15, configured to connect the eleventh source-drain pattern h11-3 disposed on the first source-drain layer h and a nineteenth transparent wiring pattern n3 disposed on the second transparent wiring layer n to be introduced later; and a sixteenth transparent wiring pattern k16, configured to connect the eighth source-drain pattern h8-3 disposed on the first source-drain layer h and the data signal line Data-3 disposed in the second transparent wiring layer n, wherein the data signal line Data-3 is one data signal line Data connected to the third pixel circuit 213.

In addition, a first planarization layer m is formed on the first transparent wiring layer k, and is configured to insulate the first transparent wiring layer k from the second transparent wiring layer n formed subsequently.

Figure 33:
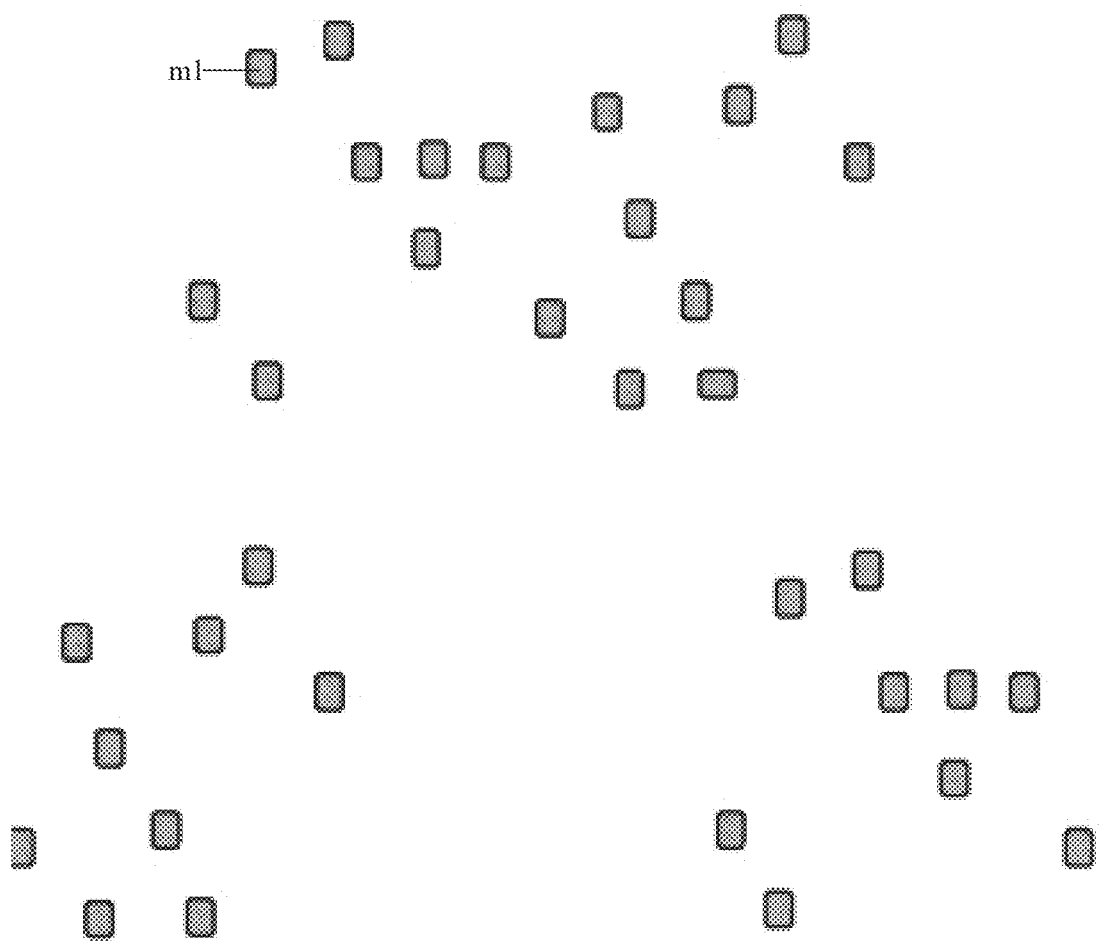
FIG. 33 is a schematic partial structural diagram of a first planarization layer in a display panel according to some embodiments of the present disclosure.
Figure 34:
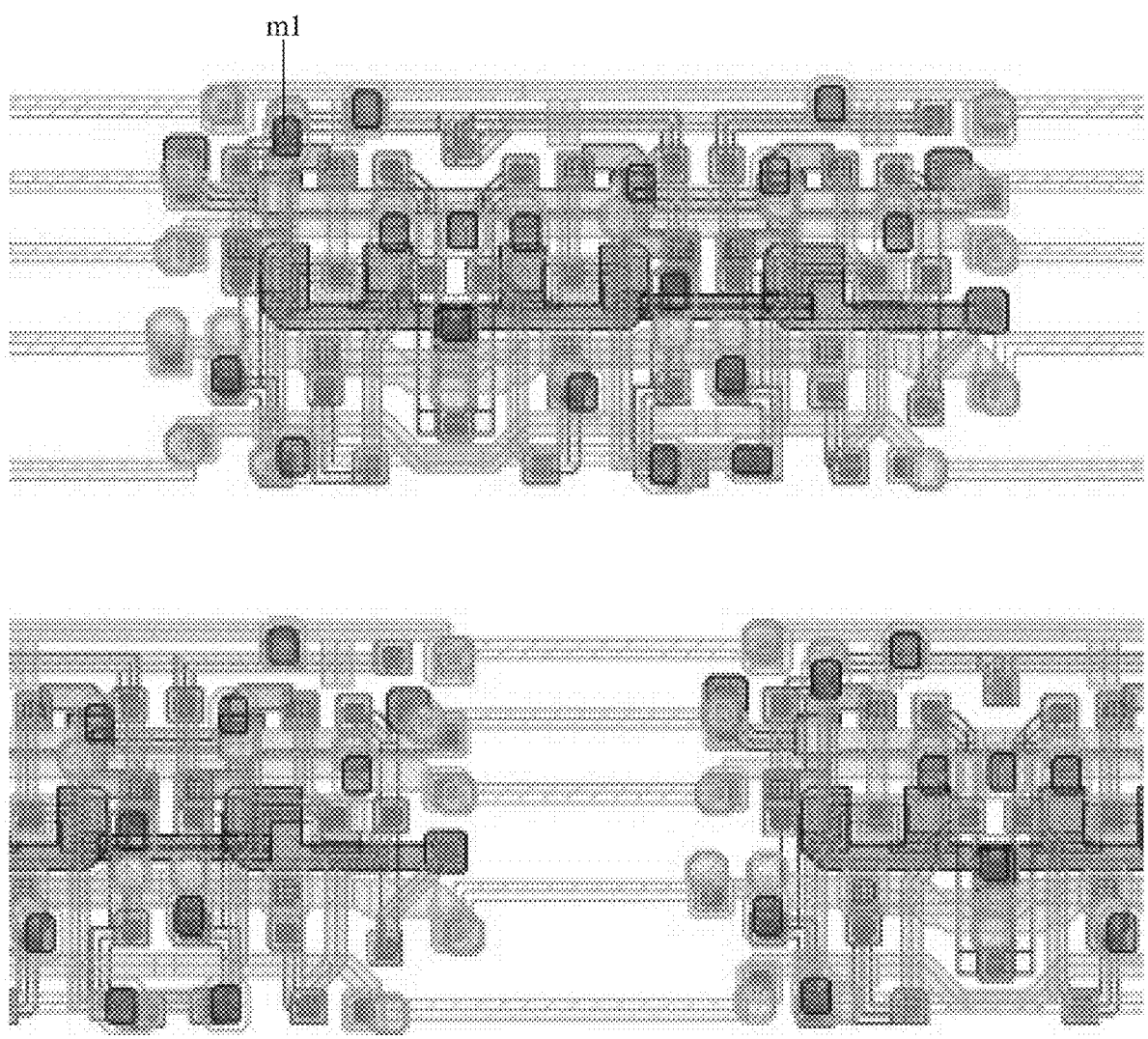
FIG. 34 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer and a first planarization layer in a display panel according to some embodiments of the present disclosure.

FIG. 33 is a schematic partial diagram of a first planarization layer m in a display panel according to some embodiments of the present disclosure, and FIG. 34 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k and a first planarization layer m in a display panel according to some embodiments of the present disclosure. The first planarization layer m is disposed on a side of the first transparent wiring layer k distal from the base substrate 1.

To conveniently show each fourth via hole ml in the first planarization layer m, in FIGS. 33 and 34, the fourth via holes m1 are represented by filled patterns, and other regions without filled patterns are configured to represent regions where the first planarization layer m has a solid material. It should be noted that each fourth via hole m1 formed in the first planarization layer m is configured to connect a subsequently formed film layer to a film layer on a side of the first planarization layer m proximal to the base substrate 1. That is, each fourth via hole m1 is a via hole for connecting the film layers.

Figure 35:
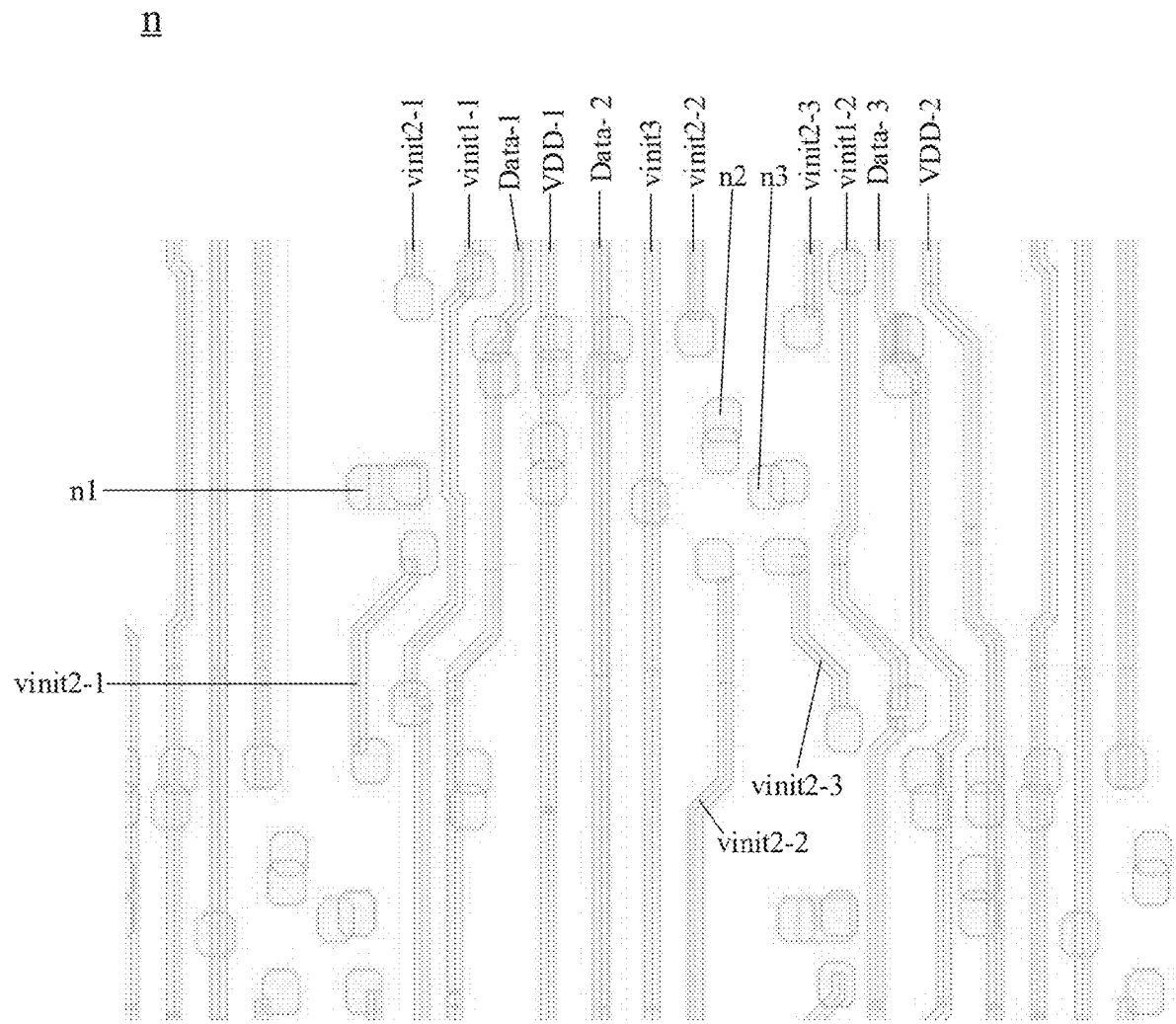
FIG. 35 is a schematic partial structural diagram of a second transparent wiring layer in a display panel according to some embodiments of the present disclosure.
Figure 36:
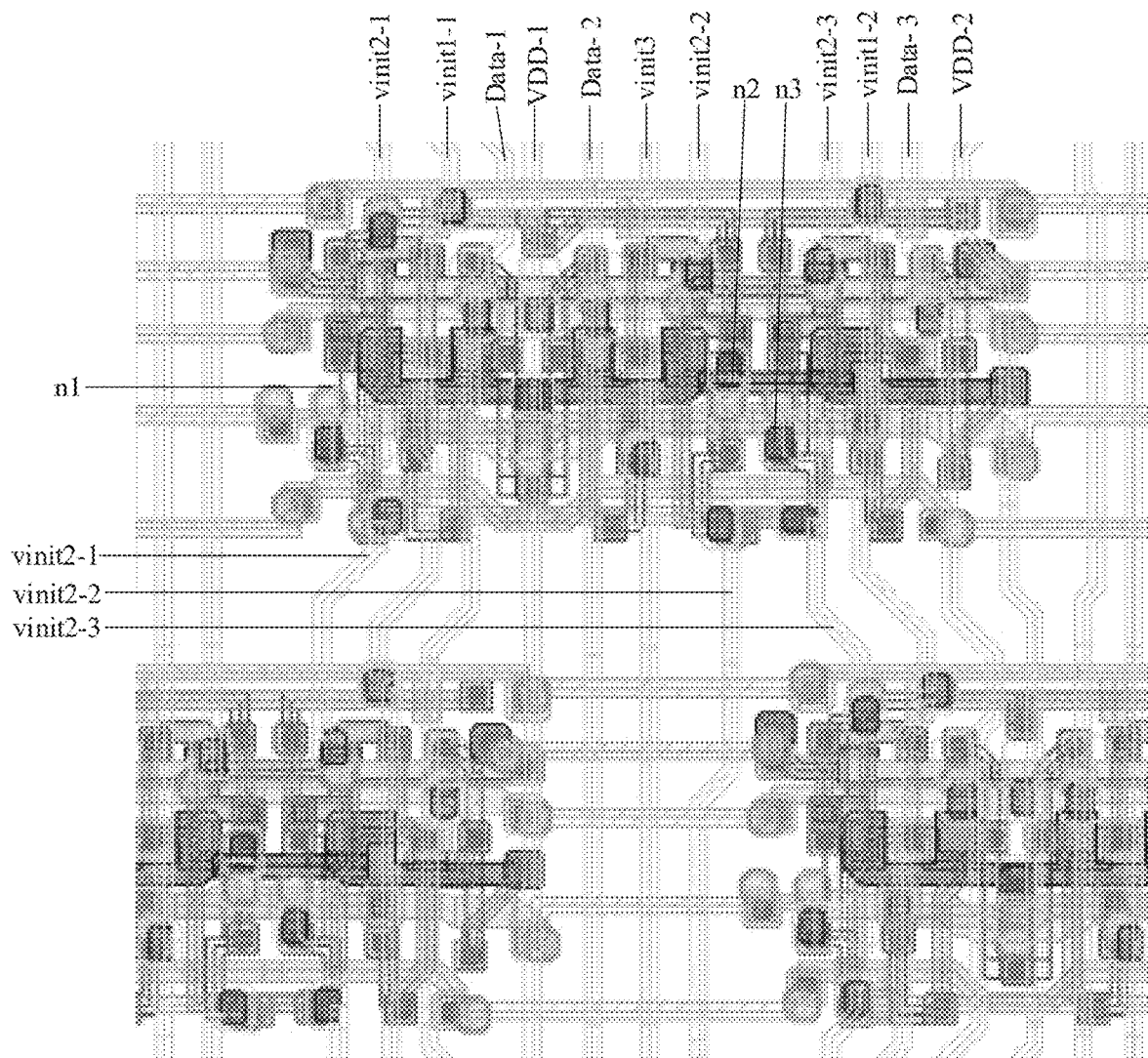
FIG. 36 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer and a second transparent wiring layer in a display panel according to some embodiments of the present disclosure.

FIG. 35 is a schematic partial diagram of a second transparent wiring layer n in a display panel according to some embodiments of the present disclosure, and FIG. 36 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k, a first planarization layer m and a second transparent wiring layer n in a display panel according to some embodiments of the present disclosure. The second transparent wiring layer n is disposed on a side of the first planarization layer m distal from the base substrate 1. Referring to FIGS. 35 and 36, the second transparent wiring layer n includes:

first reset power supply lines vinit1, including vinit1-1 and vinit1-2, wherein vinit1-1 and vinit1-2 are connected by the second connecting line L2 in the first source-drain layer h, vinit1-1 is connected to the first pixel circuit 211, vinit1-2 is connected to the third pixel circuit 213, and the second connecting line L2 is connected to the second pixel circuit 212;

second reset power supply lines vinit2, including vinit2-1, vinit2-2 and vinit2-3, wherein vinit2-1 is connected to the first pixel circuit 211, vinit2-2 is connected to the second pixel circuit 212, and vinit2-3 is connected to the third pixel circuit 213;

a third reset power supply line vinit3 connected to the second pixel circuit 212 and the third connecting line L3, wherein the third connecting line L3 is connected to the first pixel circuit 211 and the third pixel circuit 213;

driving power supply lines VDD, including VDD-1 and VDD-2, wherein VDD-1 is connected to the first pixel circuit 211 and the second pixel circuit 212, and VDD-2 is connected to the third pixel circuit 213;

data signal lines Data, including Data-1, Data-2 and Data-3, wherein Data-1 is connected to the first pixel circuit 211, Data-2 is connected to the second pixel circuit 212, and Data-3 is connected to the third pixel circuit 213;

a seventeenth transparent wiring pattern n1, configured to connect the seventh transparent wiring pattern k7 disposed on the first transparent wiring layer k and a fifteenth source-drain pattern q1 disposed on the second source-drain layer q to be introduced later;

an eighteenth transparent wiring pattern n2, configured to connect the twelfth transparent wiring pattern k12 disposed on the first transparent wiring layer k and a seventeenth source-drain pattern q3 disposed on the second source-drain layer q to be introduced later; and a nineteenth transparent wiring pattern n3, configured to connect the fifteenth transparent wiring pattern k15 disposed on the first transparent wiring layer k and an eighteenth source-drain pattern q4 disposed on the second source-drain layer q described later.

In addition, a second planarization layer p is formed on the second transparent wiring layer n, and is configured to insulate the second transparent wiring layer n from the second source-drain layer q formed subsequently.

Figure 37:
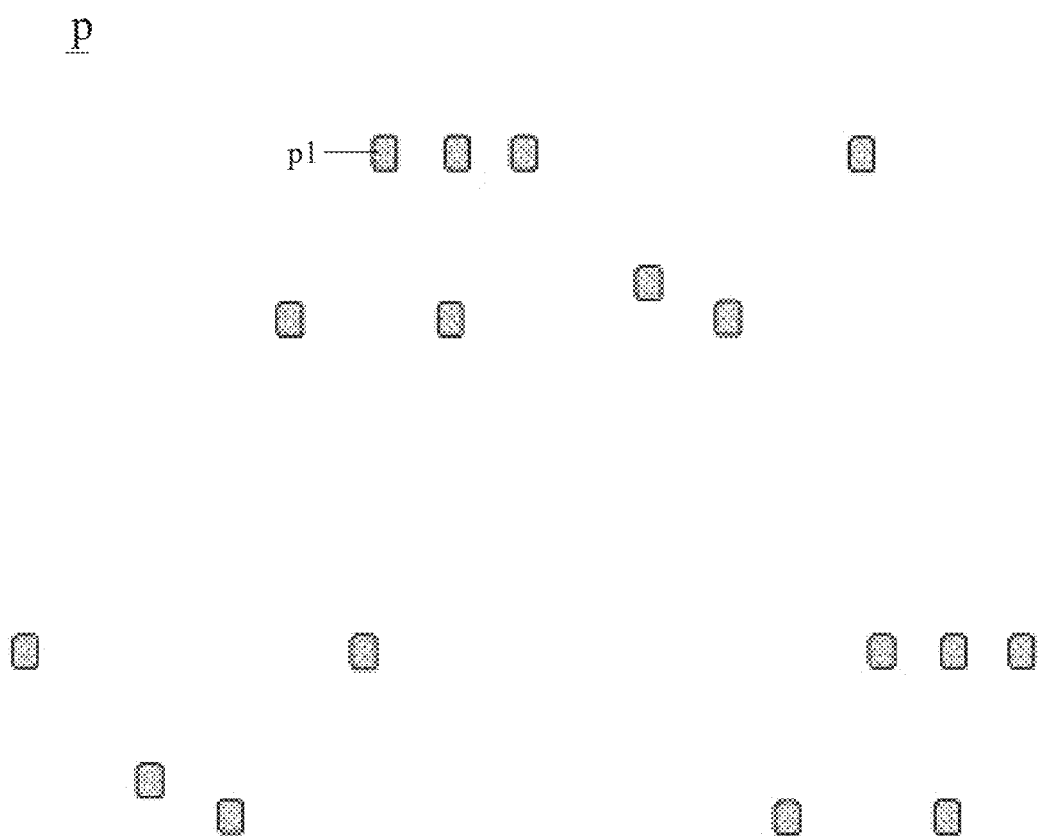
FIG. 37 is a schematic partial structural diagram of a second planarization layer in a display panel according to some embodiments of the present disclosure.
Figure 38:
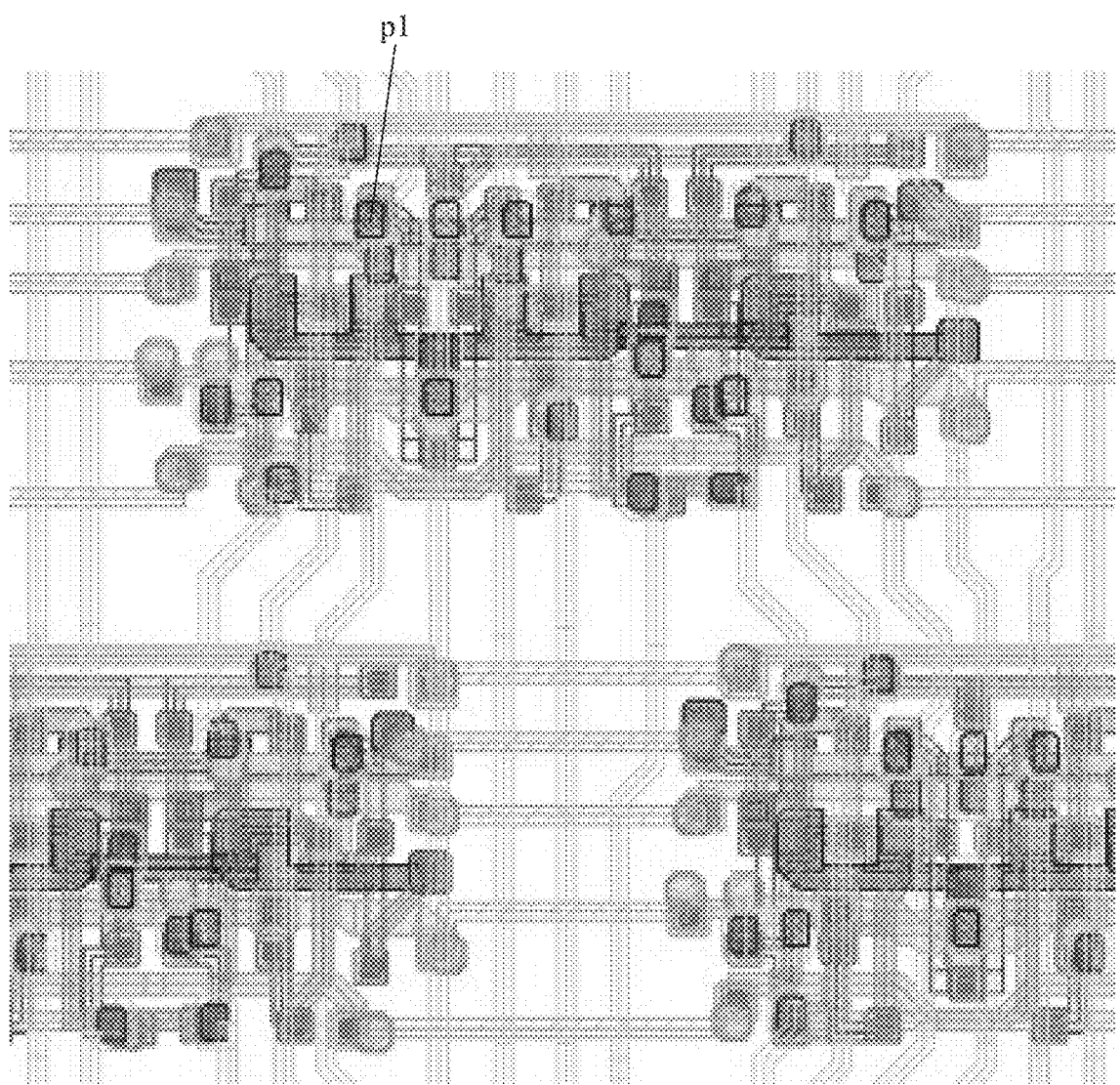
FIG. 38 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer and a second planarization layer in a display panel according to some embodiments of the present disclosure.

FIG. 37 is a schematic partial diagram of the second planarization layer p in a display panel according to some embodiments of the present disclosure, and FIG. 38 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k, a first planarization layer m, a second transparent wiring layer n and a second planarization layer p in a display panel according to some embodiments of the present disclosure. The second planarization layer p is disposed on a side of the second transparent wiring layer n distal from the base substrate 1.

To conveniently show each fifth via hole p1 in the second planarization layer p, in FIGS. 37 and 38, the fifth via holes p1 are represented by filled patterns, and other regions without filled patterns are configured to represent regions where the second planarization layer p has a solid material. It should be noted that each fifth via hole p1 formed in the second planarization layer p is configured to connect a subsequently formed film layer to a film layer on a side of the second planarization layer p proximal to the base substrate 1. That is, each fifth via hole p1 is a via hole for connecting the film layers.

Figure 39:
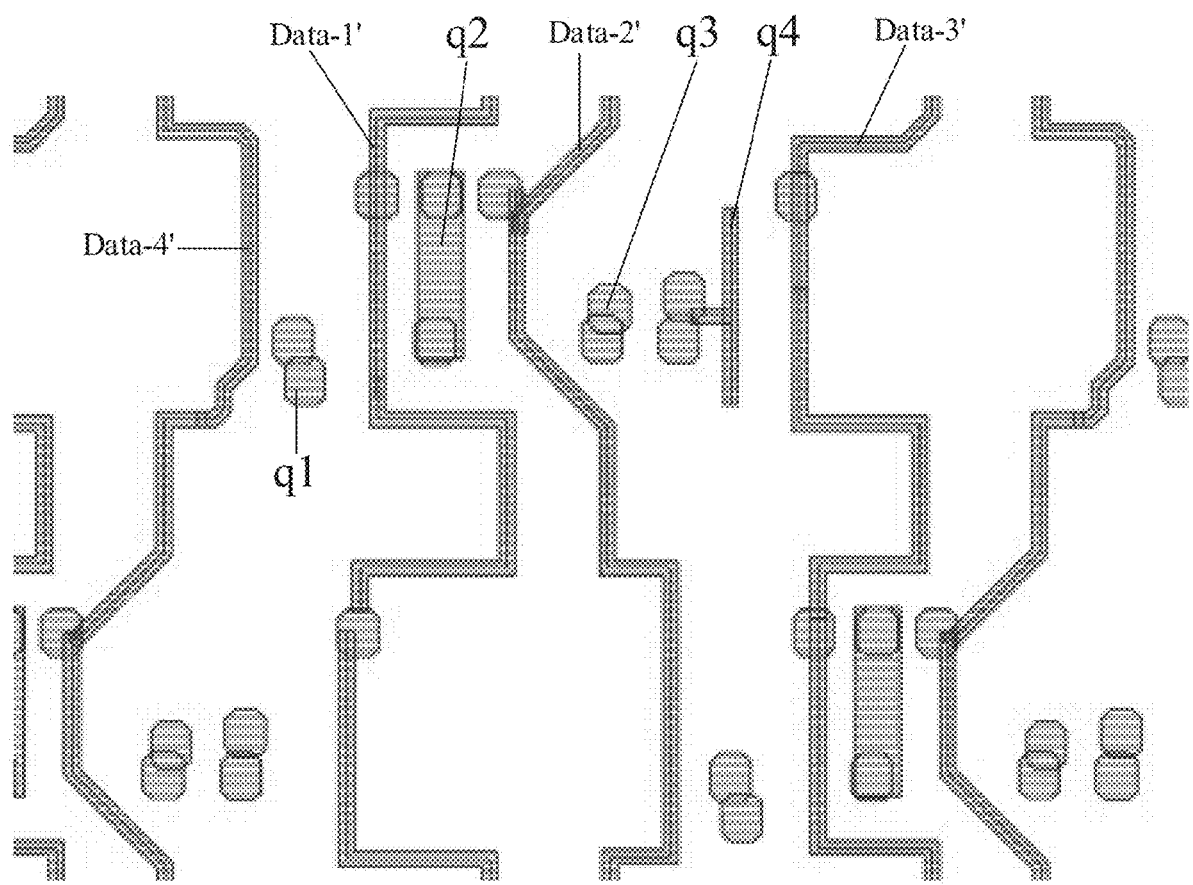
FIG. 39 is a schematic partial structural diagram of a second source-drain layer in a display panel according to some embodiments of the present disclosure.
Figure 40:
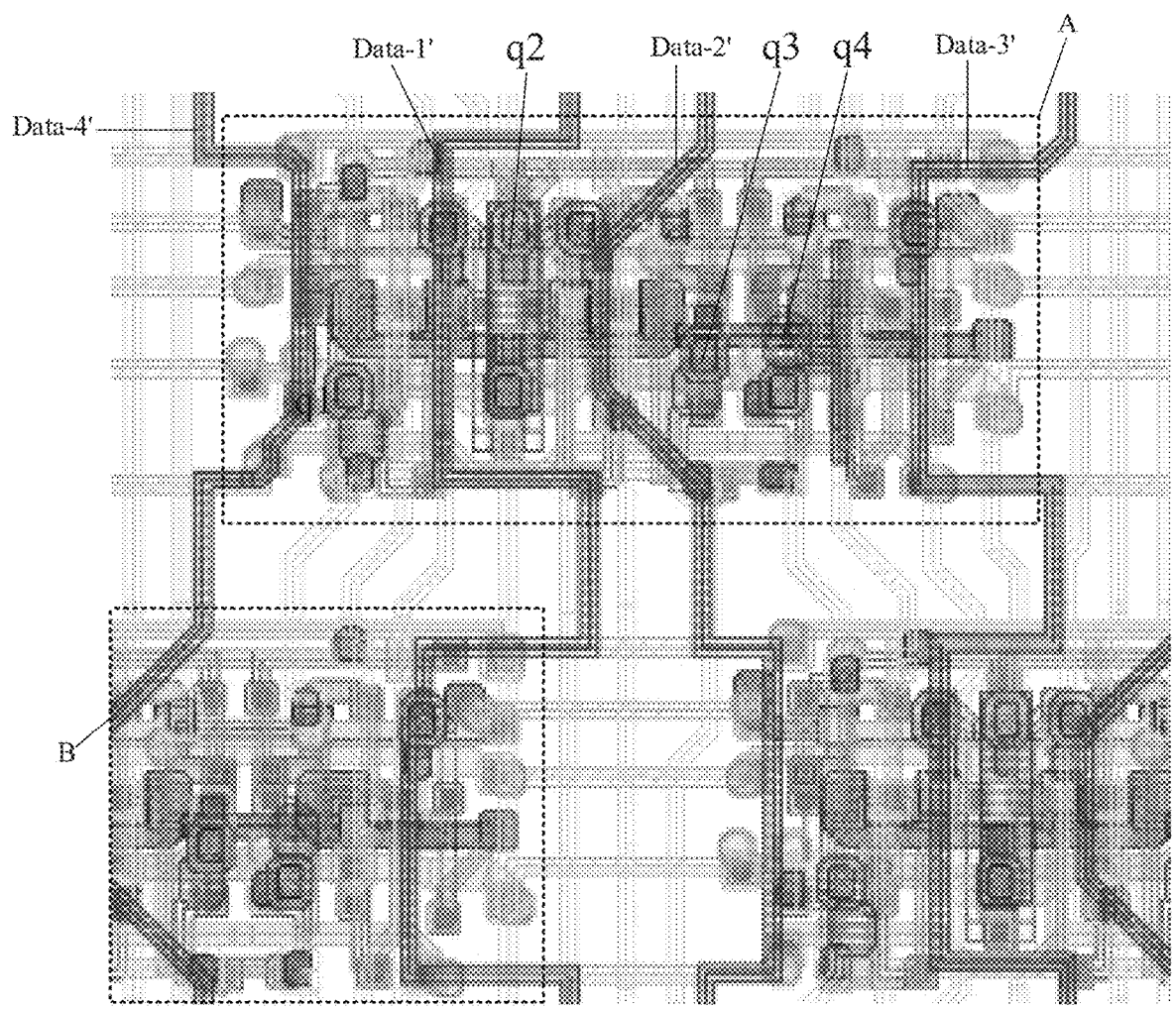
FIG. 40 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, a second planarization layer and a second source-drain layer in a display panel according to some embodiments of the present disclosure.

FIG. 39 is a schematic partial diagram of a second source-drain layer q in a display panel according to some embodiments of the present disclosure, and FIG. 40 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k, a first planarization layer m, a second transparent wiring layer n, a second planarization layer p and a second source-drain layer q in a display panel according to some embodiments of the present disclosure. The second source-drain layer q is disposed on a side of the second planarization layer p distal from the base substrate 1. Referring to FIGS. 39 and 40, the second source-drain layer q includes:

a fifteenth source-drain pattern q1, configured to connect the seventeenth transparent wiring pattern n1 disposed on the second transparent wiring layer n and the anode 51 of the first light-emitting element disposed in the anode layer to be introduced later;

a sixteenth source-drain pattern q2, wherein the sixteenth source-drain pattern q2 is configured to be connected to the driving power signal line VDD-1 disposed in the second transparent wiring layer n to achieve the parallel connection of a section of circuit, such that the resistance of the driving power signal line VDD-1 is reduced by connecting a section of metal signal line in parallel with the transparent signal line in the driving power signal line VDD-1, thereby reducing phenomena of defective via holes in the first display region 11 in the vertical direction and improving the display uniformity;

a seventeenth source-drain pattern q3, configured to connect the eighteenth transparent wiring pattern n2 disposed on the second transparent wiring layer n and the first connecting line L1 disposed in the anode layer to be introduced later, so as to achieve the connection, by the first connecting line L1, between the seventeenth source-drain pattern q3 and the anode 52 of the second light-emitting element disposed in the anode layer to be introduced later;

an eighteenth source-drain pattern q4, configured to connect the nineteenth transparent wiring pattern n3 disposed on the second transparent wiring layer n and the anode 53 of the third light-emitting element disposed in the anode layer to be introduced later, wherein the eighteenth source-drain pattern q4 includes a line segment, an orthographic projection of the line segment onto the base substrate 1 and an orthographic projection of a data signal line Data-3' introduced below onto the base substrate 1 are both at least partially overlapped with an orthographic projection of the anode 53 of the third light-emitting element onto the base substrate 1, and an overlapping portion between the line segment and the anode 53 of the third light-emitting element and an overlapping portion between the data signal line Data-3' and the anode 53 of the of the third light-emitting element may be symmetrical along the symmetry axis of the anode 53 of the third light-emitting element, thereby improving the flatness of the anode 53 of the third light-emitting element; and data signal lines, including Data-1', Data-2' and Data-3', wherein Data-1' is connected to Data-1 disposed in the second transparent wiring layer n, Data-2' is connected to Data-2 disposed in the second transparent wiring layer n, and Data-3' is connected to Data-3 disposed in the second transparent wiring layer n, such that the metal signal lines and the transparent signal lines are connected in parallel.

It should be noted that Data-4' marked in FIGS. 39 and 40 is not connected to the pixel circuit group A in FIG. 40, but is connected to the pixel circuit group B below Data-4'. In the embodiments of the present disclosure, an orthographic projection of metal signal lines onto the base substrate 1 is at least partially overlapped with an orthographic projection, onto the base substrate 1, of the pixel circuit group 2 adjacent to the metal signal line. For example, in FIG. 40, the orthographic projection of Data-4' onto the base substrate 1 is at least partially overlapped with the orthographic projection of pixel circuit group A onto the base substrate 1, such that the shielding effect of the metal signal lines on the transparent area in the first display region 11 can be reduced, thereby improving the light transmittance of the first display region 11.

In addition, a third planarization layer r is formed on the second source-drain layer q, and is configured to insulate the above second source-drain layer q from the anode layer of the light-emitting element.

Figure 41:
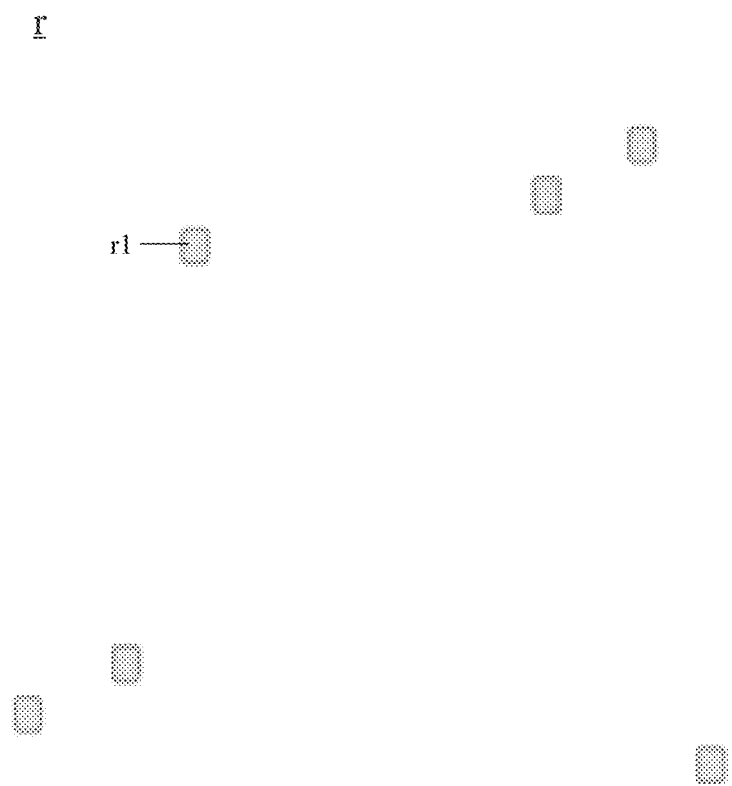
FIG. 41 is a schematic partial structural diagram of a third planarization layer in a display panel according to some embodiments of the present disclosure.
Figure 42:
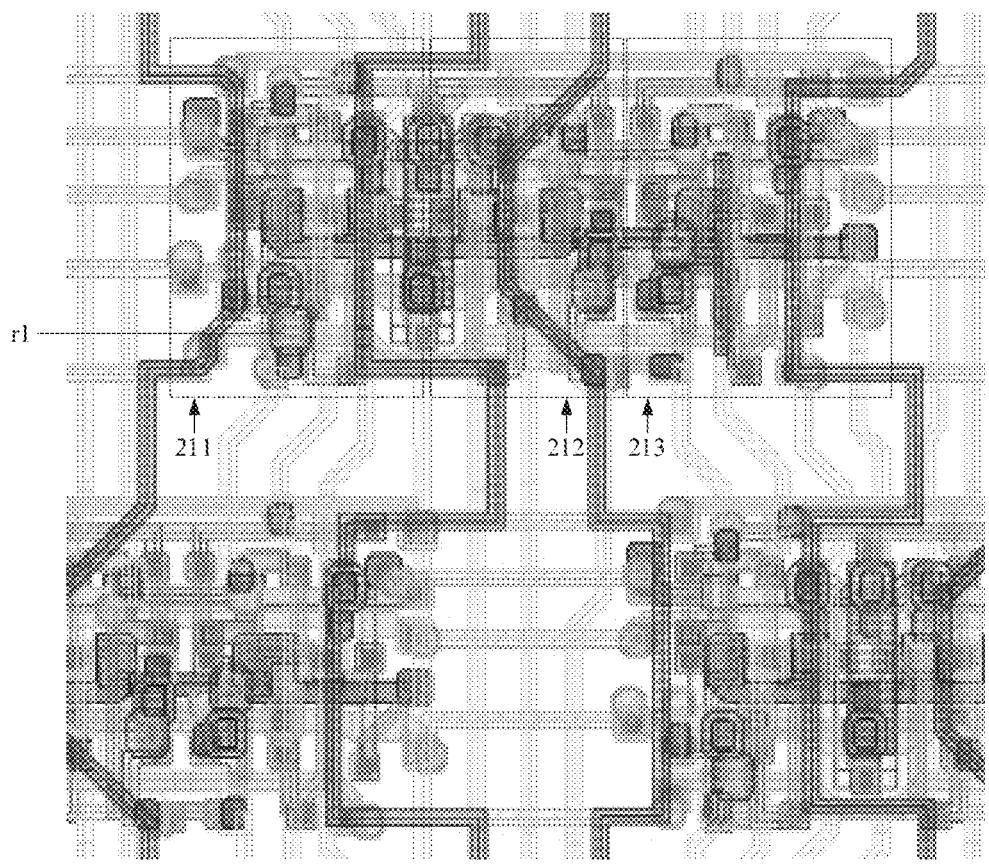
FIG. 42 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, second planarization layer, a second source-drain layer and a third planarization layer in a display panel according to some embodiments of the present disclosure.

FIG. 41 is a schematic partial diagram of a third planarization layer r in a display panel according to some embodiments of the present disclosure, and FIG. 42 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k, a first planarization layer m, a second transparent wiring layer n, a second planarization layer p, a second source-drain layer q and a third planarization layer r in a display panel according to some embodiments of the present disclosure. The third planarization layer r is disposed on a side of the second source-drain layer q distal from the base substrate 1.

To conveniently show each sixth via hole r1 in the third planarization layer r, in FIGS. 41 and 42, the sixth via holes r1 are represented by filled patterns, and other regions without filled patterns are configured to represent regions where the third planarization layer r has a solid material. It should be noted that each sixth via hole r1 formed in the third planarization layer r is configured to connect a subsequently formed film layer to a film layer on a side of the third planarization layer r proximal to the base substrate 1. That is, each sixth via hole r1 is a via hole for connecting the film layers.

Figure 43:
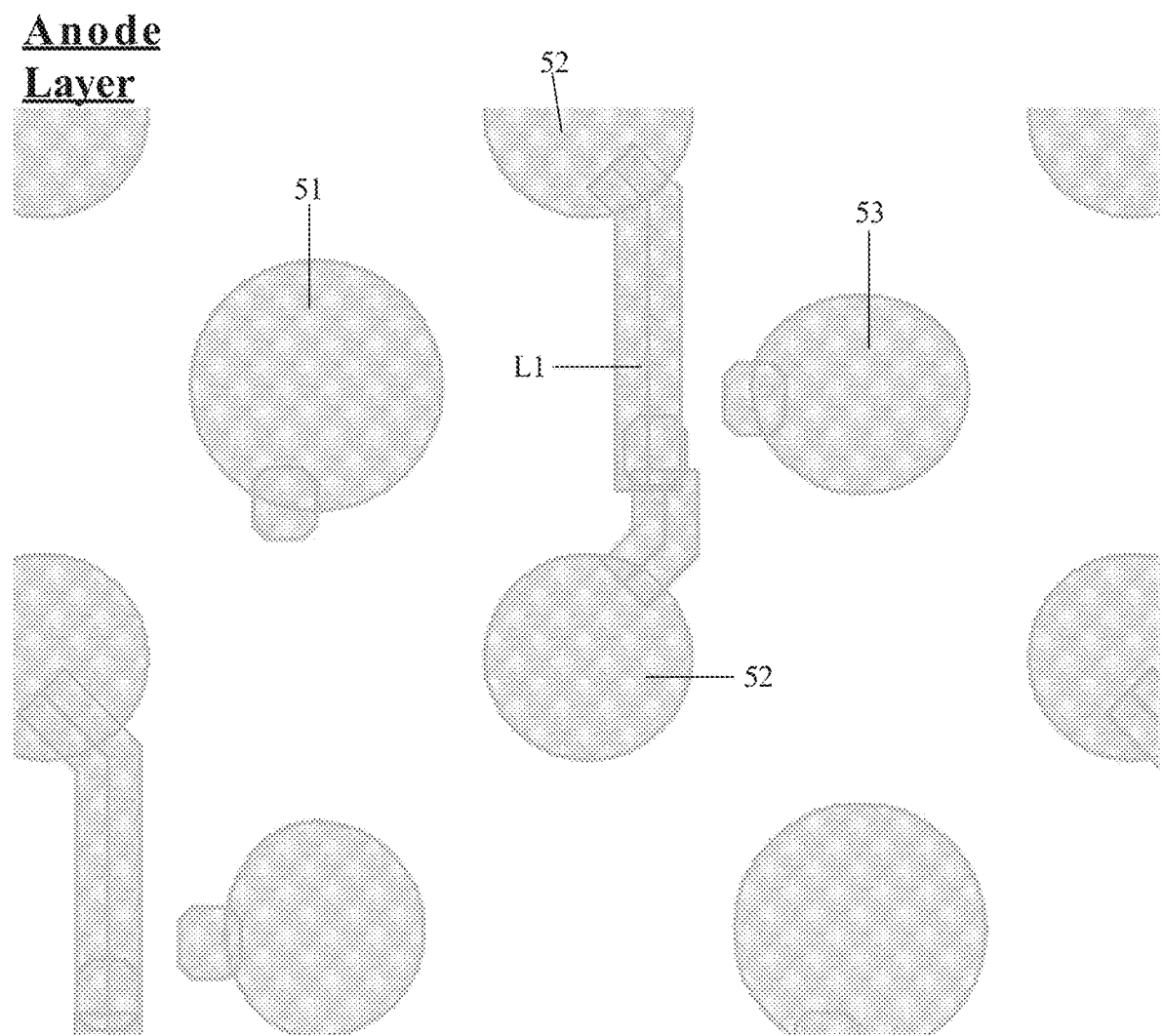
FIG. 43 is a schematic partial structural diagram of an anode layer in a display panel according to some embodiments of the present disclosure.
Figure 44:
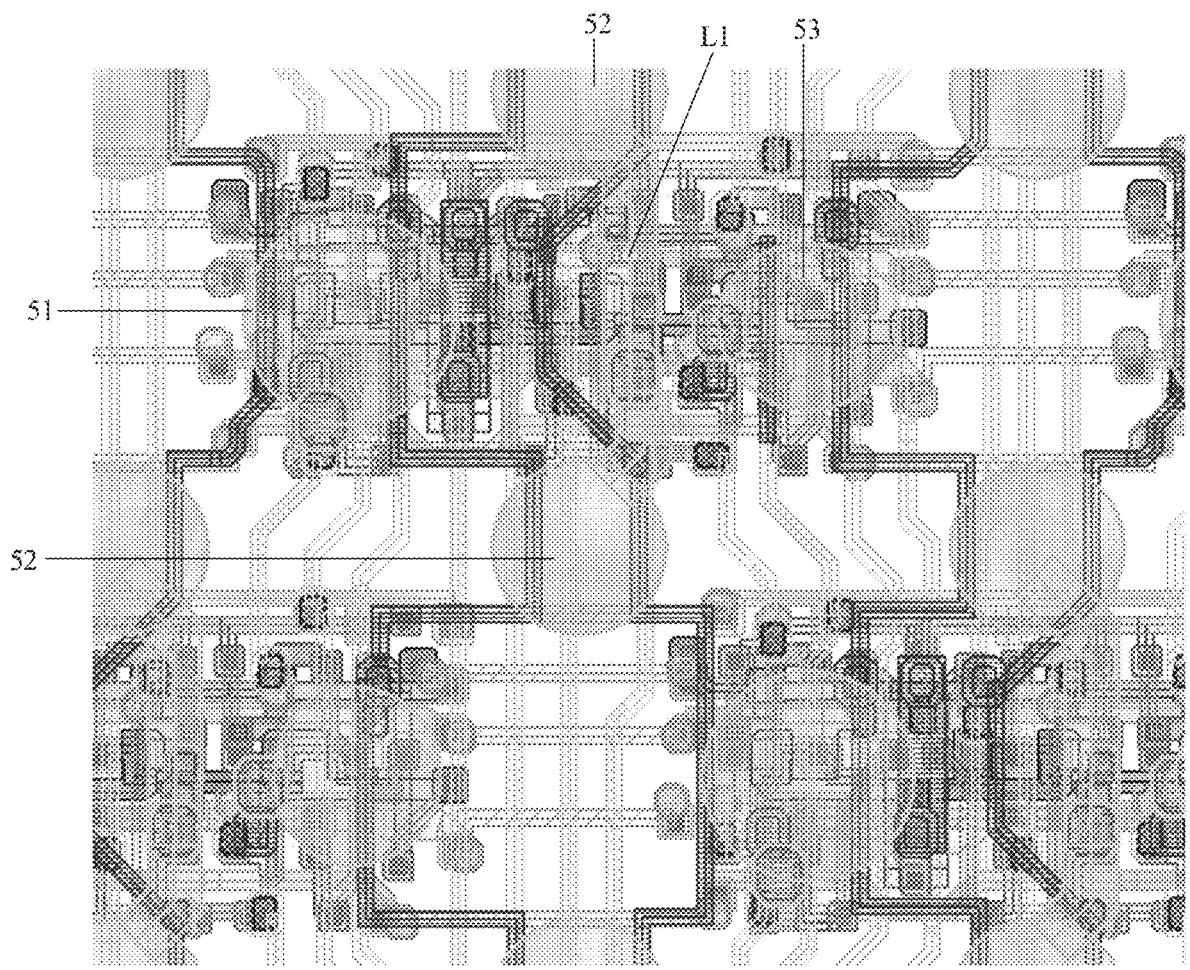
FIG. 44 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, a second planarization layer, a second source-drain layer, a third planarization layer and an anode layer in a display panel according to some embodiments of the present disclosure.

FIG. 43 is a schematic partial diagram of an anode layer in a display panel according to some embodiments of the present disclosure, and FIG. 44 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a first transparent wiring layer k, a first planarization layer m, a second transparent wiring layer n, a second planarization layer p, a second source-drain layer q, a third planarization layer r and an anode layer in a display panel according to some embodiments of the present disclosure. The anode layer is disposed on a side of the third planarization layer r distal from the base substrate 1.

Referring to FIGS. 43 and 44, the anode layer includes an anode 51 of a first light-emitting element, anodes 52 of second light-emitting elements, an anode 53 of a third light-emitting element, and a first connecting line L1. The anode 51 of the first light-emitting element is connected to the fifteenth source-drain pattern q1 disposed on the second source-drain layer q; two ends of the first connecting line L1 are connected to the anodes 52 of the two second light-emitting elements, and the first connecting line L1 is connected to the seventeenth source-drain pattern q3 disposed on the second source-drain layer q; and the anode 53 of the third light-emitting element is connected to the eighteenth source-drain pattern q4 disposed on the second source-drain layer q.

Referring to FIGS. 14 to 44, the first signal line 3 of some types include the data signal lines Data (including Data-1, Data-2, and Data-3), and are metal signal lines and transparent signal lines connected in parallel. That is, the data signal lines Data include the transparent signal lines disposed in the second transparent wiring layer n and the metal signal lines disposed in the second source-drain layer q.

The first signal lines 3 of other types include a first reset signal line Preset, a second reset signal line Preset_H, a first gate signal line Gate_N, a second gate signal line Gate_P, a light emission control signal line EM, first reset power supply lines vinit1 (including vinit1-1 and vinit1-2), second reset power supply lines vinit2 (including vinit2-1, vinit2-2 and vinit2-3), a third reset power supply line vinit3 and driving power supply lines VDD (including VDD-1 and VDD-2), and are all transparent signal lines. The first reset signal line Preset, the second reset signal line Preset_H, the first gate signal line Gate_N, the second gate signal line Gate_P, and the light emission control signal line EM are disposed in the first transparent wiring layer k. The first reset power supply lines vinit1 (including vinit1-1 and vinit1-2), the second reset power supply lines vinit2 (including vinit2-1, vinit2-2, and vinit2-3), the third reset power supply line vinit3 and the driving power supply lines VDD (including VDD-1 and VDD-2) are disposed in the second transparent wiring layer n.

Specially, the first pixel circuit 211 and the second pixel circuit 212 in the pixel circuit group 2 share one driving power supply line VDD-1. In order to reduce the resistance of the driving power supply line VDD-1, a metal line segment (the eighteenth source-drain pattern q2) is provided in the second source-drain layer q, and is connected in parallel with the driving power supply line VDD-1 disposed in the second transparent wiring layer n.

A second connecting line L2 for connecting the first reset power supply lines vinit1-1 and vinit1-2 and the second pixel circuits 212 is disposed in the first source-drain layer h, and a third connecting line L3 for connecting the third reset power supply line vinit3, the first pixel circuit 211 and the third pixel circuit 213 is disposed in the third gate layer e.

II. A solution that the first gate signal line Gate_N, the second gate signal line Gate_P, the light emission control signal line EM, the first reset signal line Preset and the second reset signal line Preset_H are all metal signal lines and the first signal lines 3 of the other types are transparent signal lines are taken an example for introduction.

In this case, the display panel includes an active layer a, a first gate insulating layer, a first gate layer b, a second gate insulating layer, a second gate layer c, a third gate insulating layer, an oxide layer d, a fourth gate insulating layer, a third gate layer e, a first interlayer dielectric layer f, a second interlayer dielectric layer g, a first source-drain layer h, a passivation layer i, a second transparent wiring layer n, a second planarization layer p, a second source-drain layer q and a third planarization layer r which constitute a pixel circuit 21 and are sequentially stacked in a direction distal from the base substrate 1.

It should be noted that the pixel circuit group 2 consisting of patterns of all film layers described below includes one pixel circuit unit. The pixel circuit unit includes a first pixel circuit 211, a second pixel circuit 212, and a third pixel circuit 213 arranged from left to right. In the arrangement direction of the first pixel circuit 211, the second pixel circuit 212, and the third pixel circuit 213, the orientation of the first pixel circuit 211 faces that of the second pixel circuit 212, and the orientation of the third pixel circuit 213 is the same as that of the first pixel circuit 211. The face-to-face arrangement means that at least part of a pattern of the first pixel circuit 211 and at least part of a pattern of the second pixel circuit 212 are symmetrical.

Figure 45:
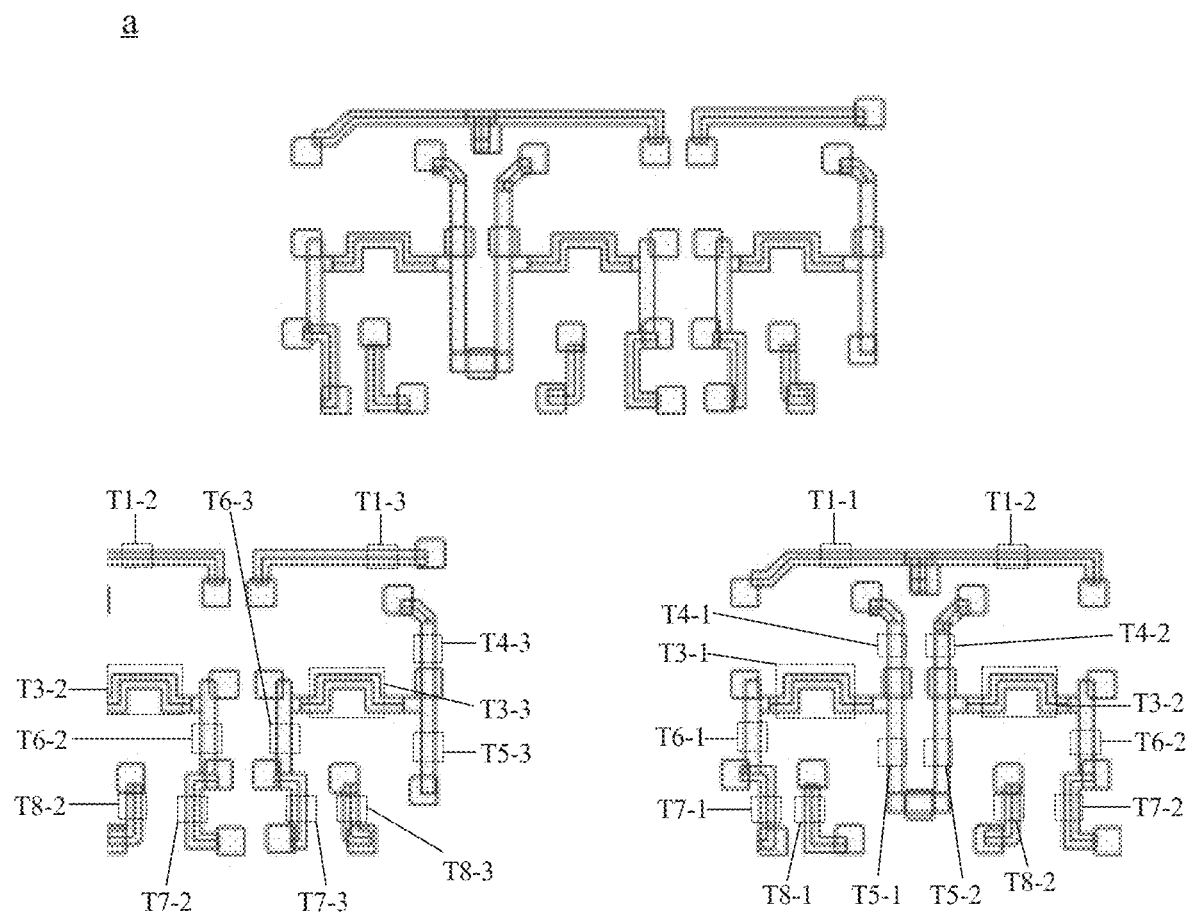
FIG. 45 is a schematic partial diagram of an active layer in another display panel according to some embodiments of the present disclosure.

FIG. 45 is a schematic partial diagram of an active layer a in a display panel according to some embodiments of the present disclosure. Referring to FIG. 45, the active layer a may have a curving or bending shape, and includes active patterns (channel regions) and doped region (source-drain doped region) patterns of the first transistor T1, the third transistor T3, the fourth transistor T4, the fifth transistor T5, the sixth transistor T6, the seventh transistor T7 and the eighth transistor T8, and the active patterns and the doped region patterns of the above all transistors in the same pixel circuit 21 are integrally arranged.

The first pixel circuit 211 includes active patterns (channel regions) and doped region (source-drain doped region) patterns of a first transistor T1-1, a third transistor T3-1, a fourth transistor T4-1, a fifth transistor T5-1, a sixth transistor T6-1, a seventh transistor T7-1 and an eighth transistor T8-1.

The second pixel circuit 212 includes active patterns (channel regions) and doped region (source-drain doped region) patterns of a first transistor T1-2, a third transistor T3-2, a fourth transistor T4-2, a fifth transistor T5-2, a sixth transistor T6-2, a seventh transistor T7-2 and an eighth transistor T8-2.

The third pixel circuit 213 includes active patterns (channel regions) and doped region (source-drain doped region) patterns of a first transistor T1-3, a third transistor T3-3, a fourth transistor T4-3, a fifth transistor T5-3, a sixth transistor T6-3, a seventh transistor T7-3 and an eighth transistor T8-3.

It should be noted that the active layer a includes an integrally formed low-temperature polysilicon layer, and a source region and a drain region are conductive by doping and the like to achieve electrical connection of all structures. In other words, a semiconductor layer of each transistor in each pixel circuit is an integral pattern formed by p-silicon; and each transistor in the same pixel circuit includes a doped region (i.e., the source region and the drain region) pattern and an active pattern, and active patterns of different transistors are separated.

The active layer a is made of amorphous silicon, polysilicon, an oxide semiconductor material, etc. It should be noted that the source region and the drain region are regions doped with n-type impurities or p-type impurities.

The display panel further includes a first gate insulating layer disposed on a side of the active layer a distal from the base substrate 1, and the first gate insulating layer is configured to insulate the above active layer a from a first gate layer b formed subsequently.

Figure 46:
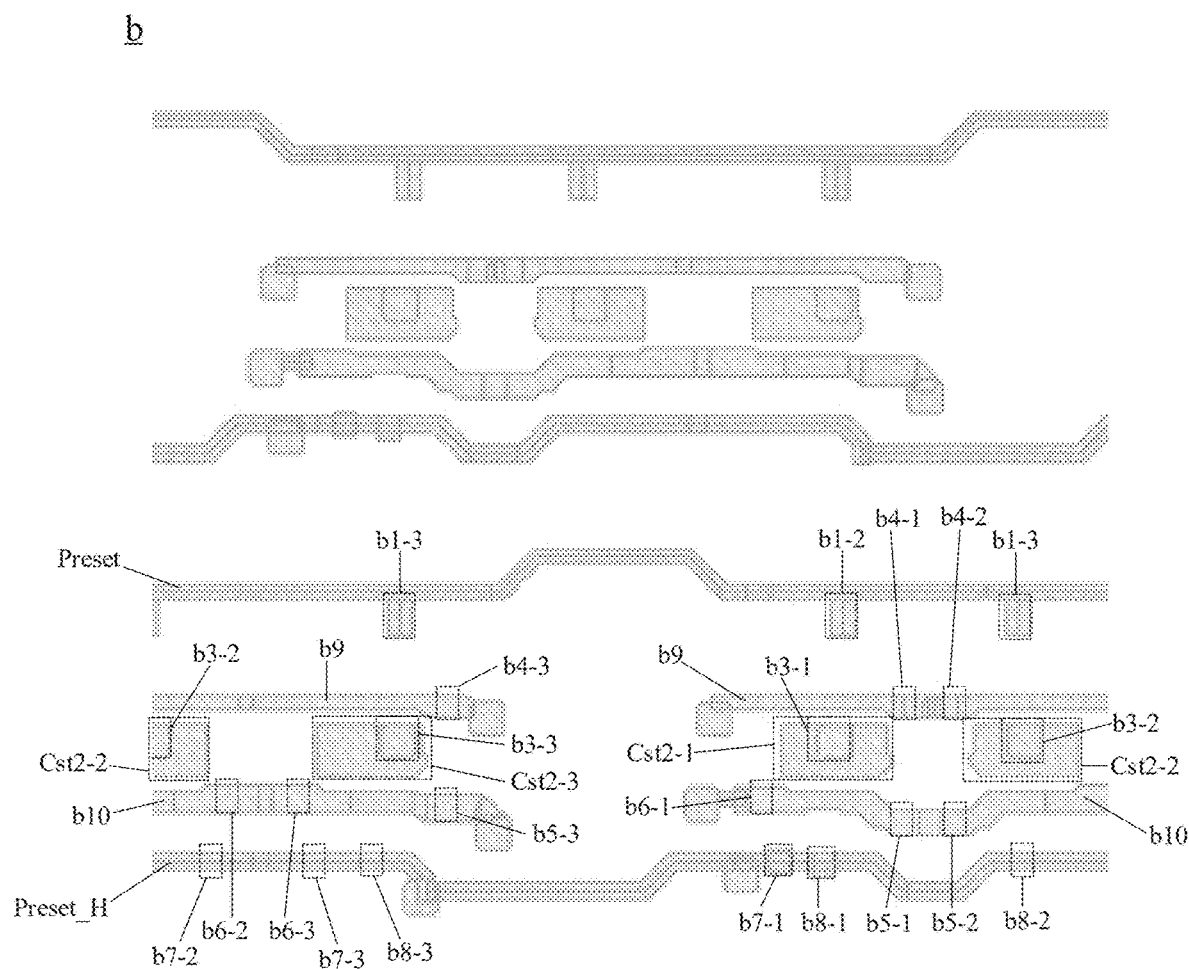
FIG. 46 is a schematic partial structural diagram of a first gate layer in another display panel according to some embodiments of the present disclosure.
Figure 47:
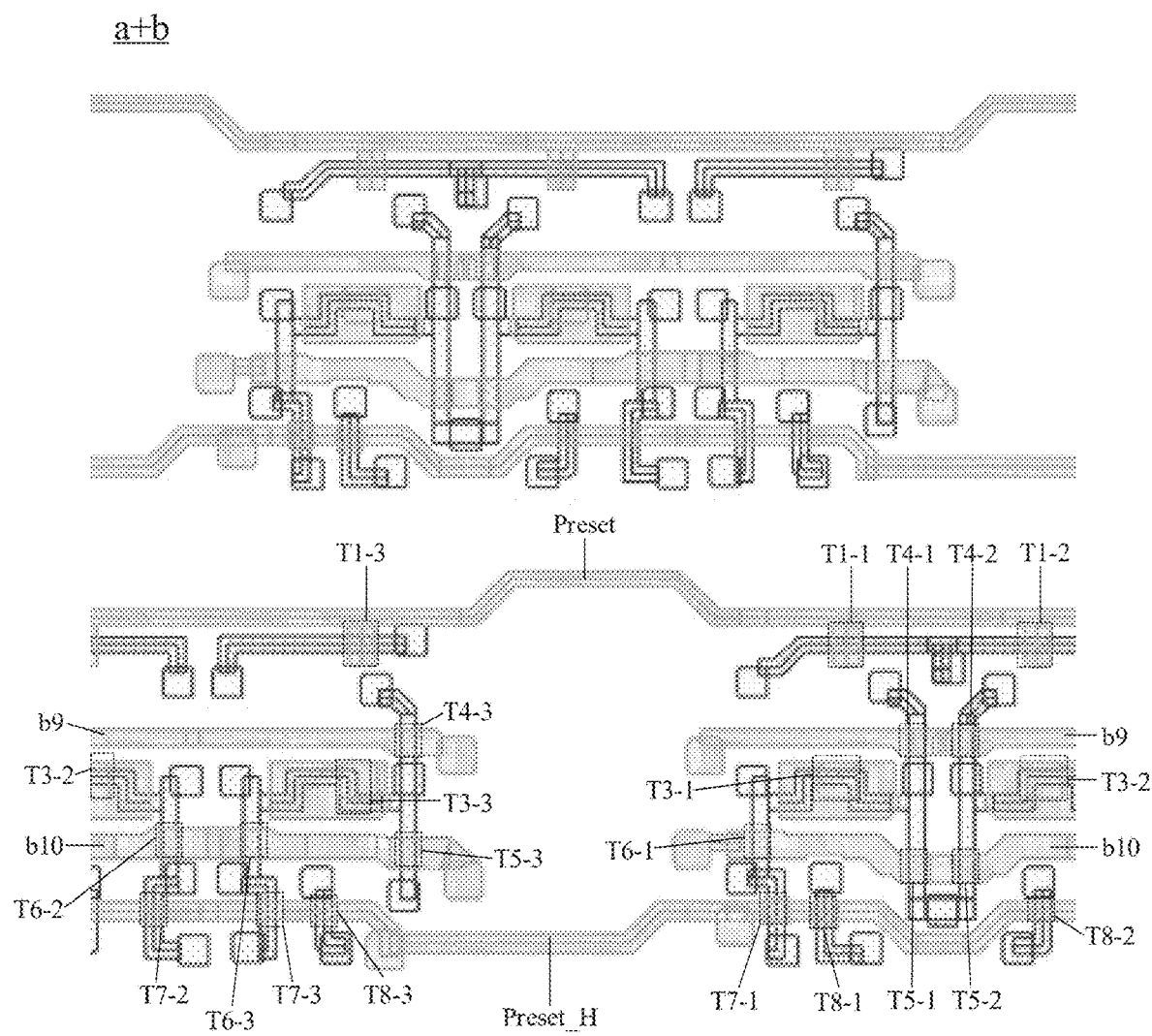
FIG. 47 is a schematic diagram of partial superposition of an active layer and a first gate layer in another display panel according to some embodiments of the present disclosure.

FIG. 46 is a schematic partial diagram of a first gate layer b in a display panel according to some embodiments of the present disclosure, and FIG. 47 is a schematic diagram of partial superposition of an active layer a and a first gate layer b in a display panel according to some embodiments of the present disclosure. The first gate layer b is disposed on a side of the first gate insulating layer distal from the base substrate 1. Referring to FIGS. 46 and 47, the first gate layer b includes:

a first reset signal line Preset and a second reset signal line Preset_H;

a second capacitor plate Cst2, a first gate pattern b1 of the first transistor T1, a third gate pattern b3 of the third transistor T3, a fourth gate pattern b4 of the fourth transistor T4, a fifth gate pattern b5 of the fifth transistor T5, a sixth gate pattern b6 of the sixth transistor T6, a seventh gate pattern b7 of the seventh film transistor T7 and an eighth gate pattern b8 of the eighth transistor T8, wherein the third gate pattern b3 of the third transistor T3 and the second capacitor plate Cst2 are considered as an integrated structure, the first reset signal line Preset and the first gate pattern b1 of the first transistor T1 are of an integrated structure, the second reset signal line Preset_H, the seventh gate pattern b7 of the seventh film transistor T7 and the eighth gate pattern b8 of the eighth transistor T8 are of an integrated structure, and the fifth gate pattern b5 of the fifth transistor T5 and the sixth gate pattern b6 of the sixth transistor T6 are of an integrated structure;

a ninth gate pattern b9, configured to connect a gate of the fourth transistor T4 and the second gate signal line Gate_P disposed in the first source-drain layer h to be introduced later, wherein the ninth gate pattern b9 and the fourth gate pattern b4 (including b4-1, b4-2 and b4-3 described below) of the fourth transistor T4 are of an integrated structure, and the second gate signal line Gate_P is disposed between two adjacent pixel circuit groups 2 in the same row, and in a plurality of pixel circuit groups 2 disposed in the same row, the ninth gate pattern b9 in each pixel circuit group 2 connects the second gate signal lines Gate_P disposed between every two adjacent pixel circuit groups 2, thereby forming the second gate signal line Gate_P that runs through the plurality of pixel circuit groups 2 of this row; and a tenth gate pattern b10, configured to connect the fifth gate pattern b5 of the fifth transistor T5, the sixth gate pattern b6 of the sixth transistor T6, and the light emission control signal line EM disposed in the first source-drain layer h to be introduced later, wherein the tenth gate pattern b10, the fifth gate pattern b5 (including b5-1, b5-2 and b5-3 described below) of the fifth transistor T5 and the sixth gate pattern b6 (including b6-1, b6-2 and b6-3 described below) of the sixth transistor T6 are of an integrated structure, and the light emission control signal line EM is disposed between two adjacent pixel circuit groups 2 in the same row, and in a plurality of pixel circuit groups 2 disposed in the same row, the tenth gate pattern b10 in each pixel circuit group 2 connects the light emission control signal lines EM between every two adjacent pixel circuit groups 2, thereby forming the light emission control signal line EM that runs through the plurality of pixel circuit groups 2 of this row.

The first pixel circuit 211 includes a second capacitor plate Cst2-1, a first gate pattern b1-1 of the first transistor T1-1, a third gate pattern b3-1 of the third transistor T3-1, a fourth gate pattern b4-1 of the fourth transistor T4-1, a fifth gate pattern b5-1 of the fifth transistor T5-1, a sixth gate pattern b6-1 of the sixth transistor T6-1, a seventh gate pattern b7-1 of the seventh film transistor T7-1 and an eighth gate pattern b8-1 of the eighth transistor T8-1. The third gate pattern b3-1 of the third transistor T3-1 and the second capacitor plate Cst2-1 are considered as an integrated structure.

The second pixel circuit 212 includes a second capacitor plate Cst2-2, a first gate pattern b1-2 of the first transistor T1-2, a third gate pattern b3-2 of the third transistor T3-2, a fourth gate pattern b4-2 of the fourth transistor T4-2, a fifth gate pattern b5-2 of the fifth transistor T5-2, a sixth gate pattern b6-2 of the sixth transistor T6-2, a seventh gate pattern b7-2 of the seventh film transistor T7-2 and an eighth gate pattern b8-2 of the eighth transistor T8-2. The third gate pattern b3-2 of the third transistor T3-2 and the second capacitor plate Cst2-2 are considered as an integrated structure.

The third pixel circuit 213 includes a second capacitor plate Cst2-3, a first gate pattern b1-3 of the first transistor T1-3, a third gate pattern b3-3 of the third transistor T3-3, a fourth gate pattern b4-3 of the fourth transistor T4-3, a fifth gate pattern b5-3 of the fifth transistor T5-3, a sixth gate pattern b6-3 of the sixth transistor T6-3, a seventh gate pattern b7-3 of the seventh film transistor T7-3 and an eighth gate pattern b8-3 of the eighth transistor T8-3. The third gate pattern b3-3 of the third transistor T3-3 and the second capacitor plate Cst2-3 are considered as an integrated structure.

It should be noted that each rectangular dashed frame in FIG. 47 shows each portion where the first gate layer b and the active layer a are overlapped. For the channel region of each transistor, the active layers a on two sides of each channel region are conductive by ion doping and other processes to be used as the first and second poles of each transistor. The source and drain of the transistor are symmetrical in structure, and thus, no difference may exist between the source and drain in physical structures. In the embodiments of the present disclosure, in order to distinguish the transistors, other than the gate as a control pole, one of poles is directly described as the first pole and the other pole as the second pole. Therefore, the first poles and the second poles of all or part of the transistors in the embodiments of the present disclosure may be interchangeable as required.

The display panel further includes a second gate insulating layer disposed on a side of the first gate layer b distal from the base substrate 1, and the second gate insulating layer is configured to insulate the first gate layer b from the second gate layer c formed subsequently.

Figure 48:
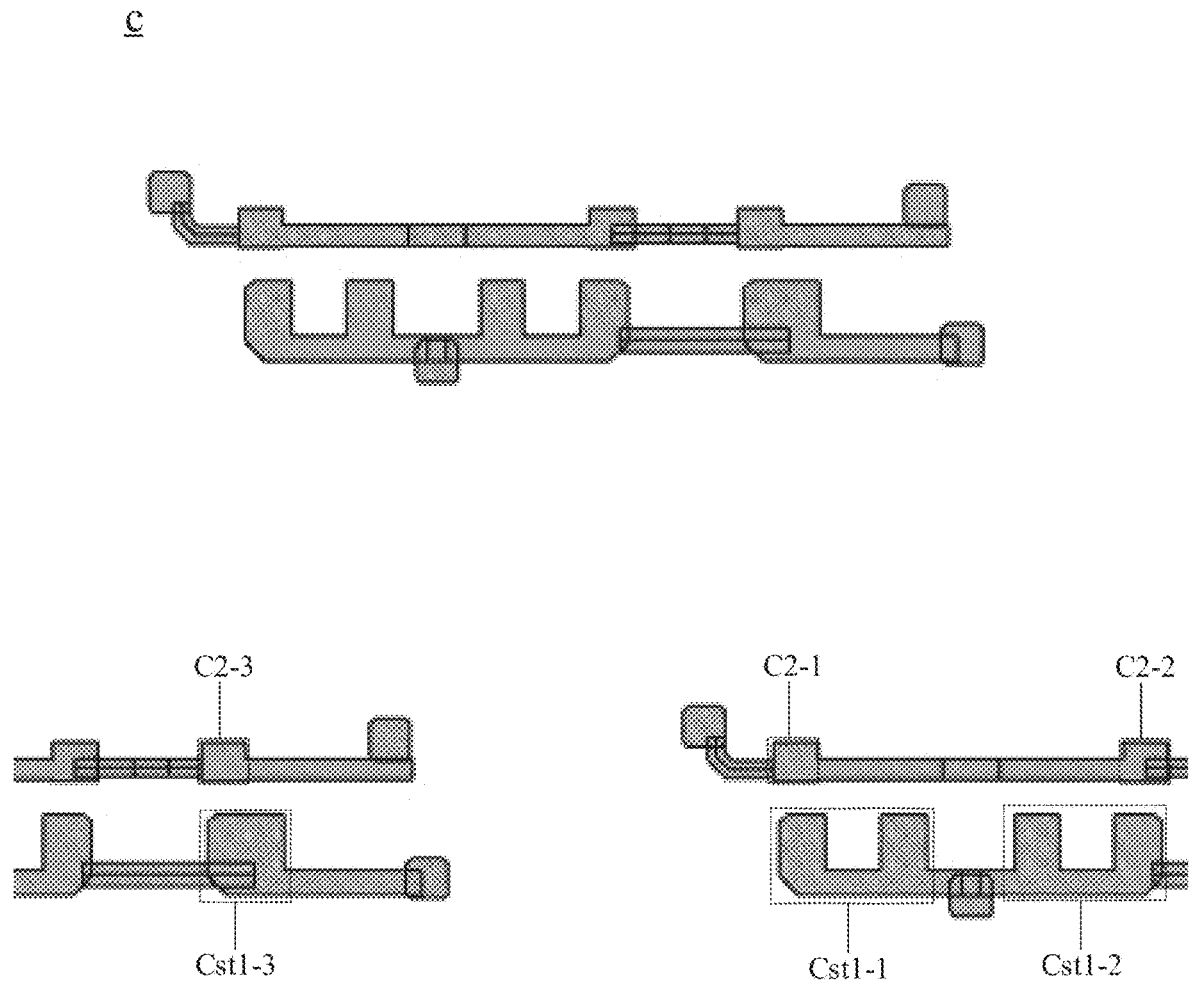
FIG. 48 is a schematic partial diagram of a second gate layer in another display panel according to some embodiments of the present disclosure.
Figure 49:
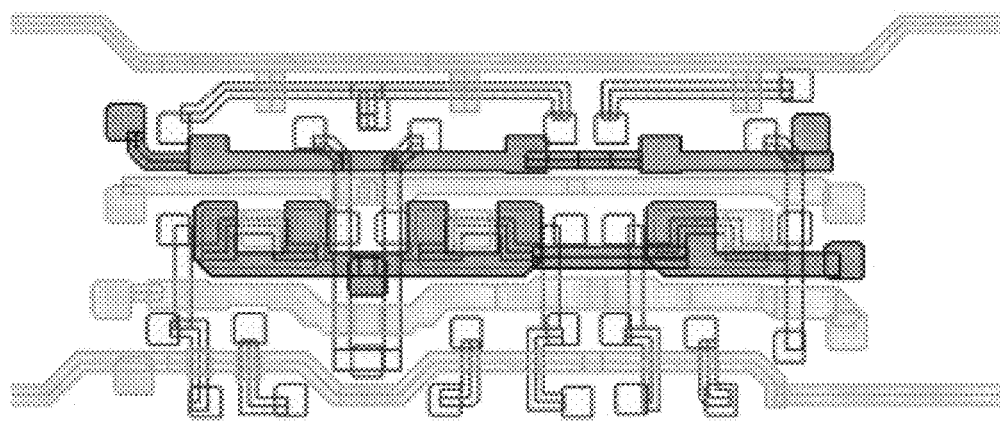
FIG. 49 is a schematic partial diagram of partial superposition of an active layer, a first gate layer, and a second gate layer in another display panel according to some embodiments of the present disclosure.
Figure 49:
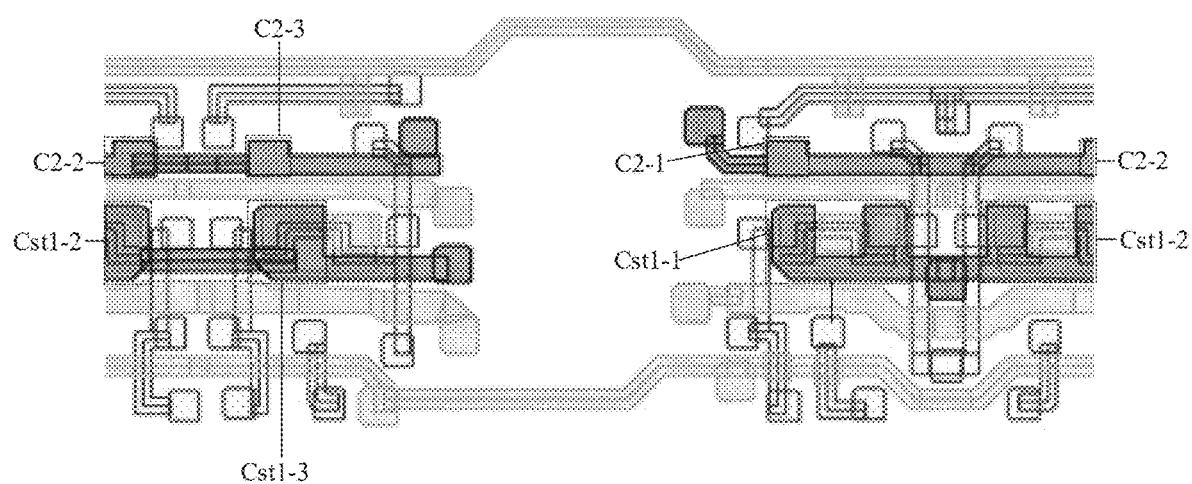

FIG. 48 is a schematic partial diagram of a second gate layer c in a display panel according to some embodiments of the present disclosure, and FIG. 49 is a schematic diagram of partial superposition of an active layer a, a first gate layer b, and a second gate layer c in a display panel according to some embodiments of the present disclosure. The second gate layer c is disposed on a side of the second gate insulating layer distal from the base substrate 1. Referring to FIGS. 48 and 49, the second gate layer c includes a first capacitor plate Cst1 and a bottom gate pattern c2 disposed on a second gate layer c in the second transistor T2.

The first pixel circuit 211 includes the first capacitor plate Cst1-1 and a bottom gate pattern c2-1 disposed on the second gate layer c in the second transistor T2-1. The storage capacitor Cst-1 is formed by at least partially overlapping the first capacitor plate Cst1-1 disposed in the second gate layer c with the second capacitor plate Cst2-1 disposed in the first gate layer b. The bottom gate pattern c2-1 is also used as a portion disposed on the second gate layer c in the first gate signal line Gate_N.

The second pixel circuit 212 includes the first capacitor plate Cst1-2 and a bottom gate pattern c2-2 disposed on the second gate layer c in the second transistor T2-2. The storage capacitor Cst-2 is formed by at least partially overlapping the first capacitor plate Cst1-2 disposed in the second gate layer c with the second capacitor plate Cst2-2 disposed in the first gate layer b. The bottom gate pattern c2-2 is also used as a portion disposed on the second gate layer c in the first gate signal line Gate_N.

The third pixel circuit 213 includes the first capacitor plate Cst1-3 and a bottom gate pattern c2-3 disposed on the second gate layer c in the second transistor T2-3. The storage capacitor Cst-3 is formed by at least partially overlapping the first capacitor plate Cst1-3 disposed in the second gate layer c with the second capacitor plate Cst2-3 disposed in the first gate layer b. The bottom gate pattern c2-3 is also used as a portion disposed on the second gate layer c in the first gate signal line Gate_N.

In addition, a third gate insulating layer is formed on the above second gate layer c, and is configured to insulate the second gate layer c from an oxide layer d formed subsequently.

Figure 50:
FIG. 50 is a schematic partial diagram of an oxide layer in another display panel according to some embodiments of the present disclosure.
Figure 50:
Figure 51:
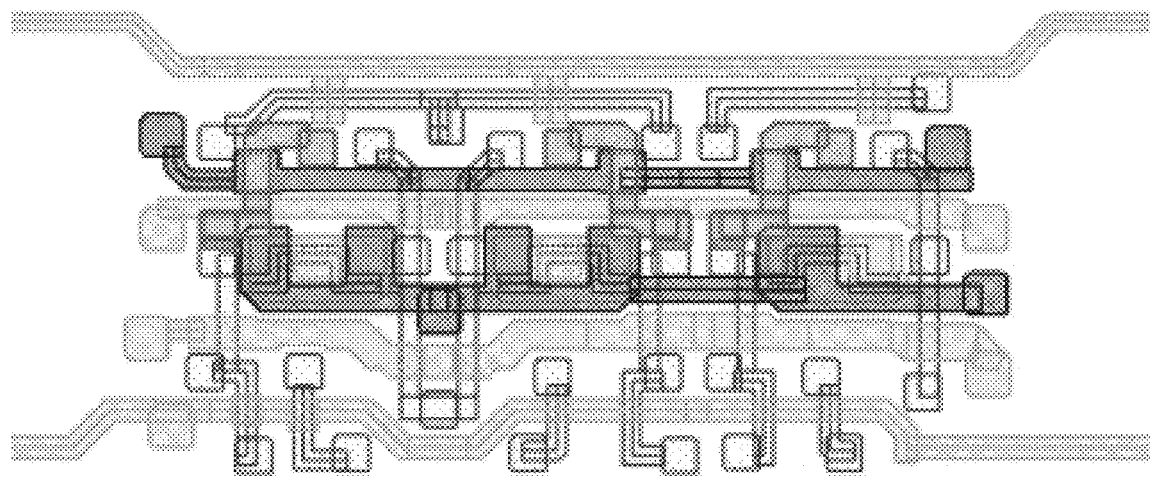
FIG. 51 is a schematic diagram of partial superposition of an active layer, a first gate layer, a second gate layer, and an oxide layer in another display panel according to some embodiments of the present disclosure.
Figure 51:
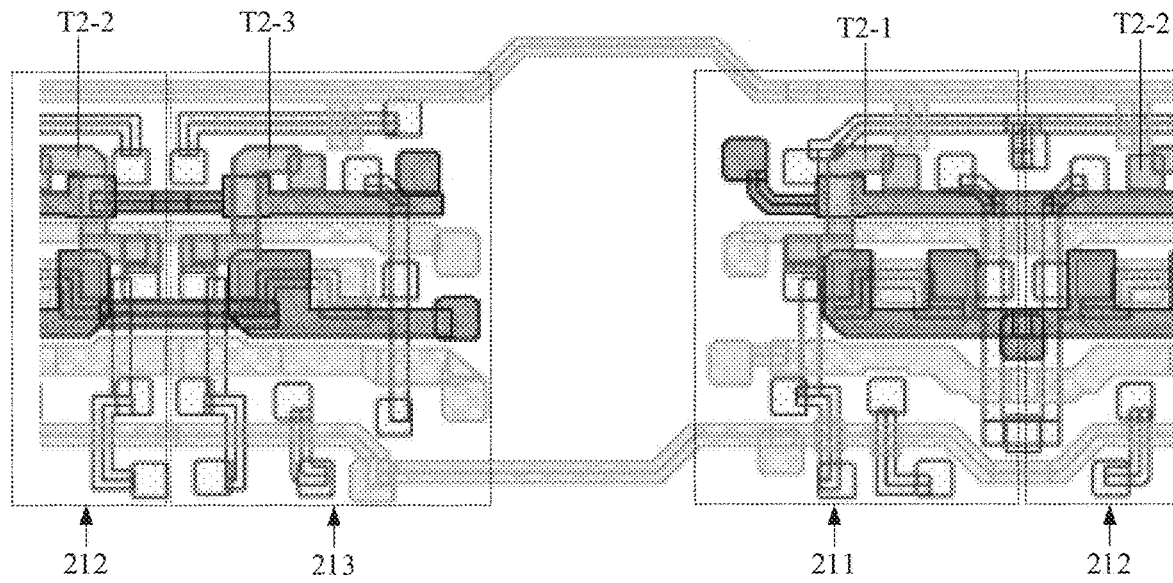

FIG. 50 is a schematic partial diagram of an oxide layer d in a display panel according to some embodiments of the present disclosure, and FIG. 51 is a schematic diagram of partial superposition of an active layer a, a first gate layer b, a second gate layer c, and an oxide layer d in a display panel according to some embodiments of the present disclosure. The oxide layer d is disposed on a side of the third gate insulating layer distal from the base substrate 1. Referring to FIGS. 50 and 51, the oxide layer d includes an oxide pattern for forming the second transistor T2-1 in the first pixel circuit 211, an oxide pattern for forming the second transistor T2-2 in the second pixel circuit 212, and an oxide pattern for forming the second transistor T2-3 in the third pixel circuit 213.

In addition, a fourth gate insulating layer is formed on the oxide layer d, and is configured to insulate the oxide layer d from a third gate layer e formed subsequently.

Figure 52:
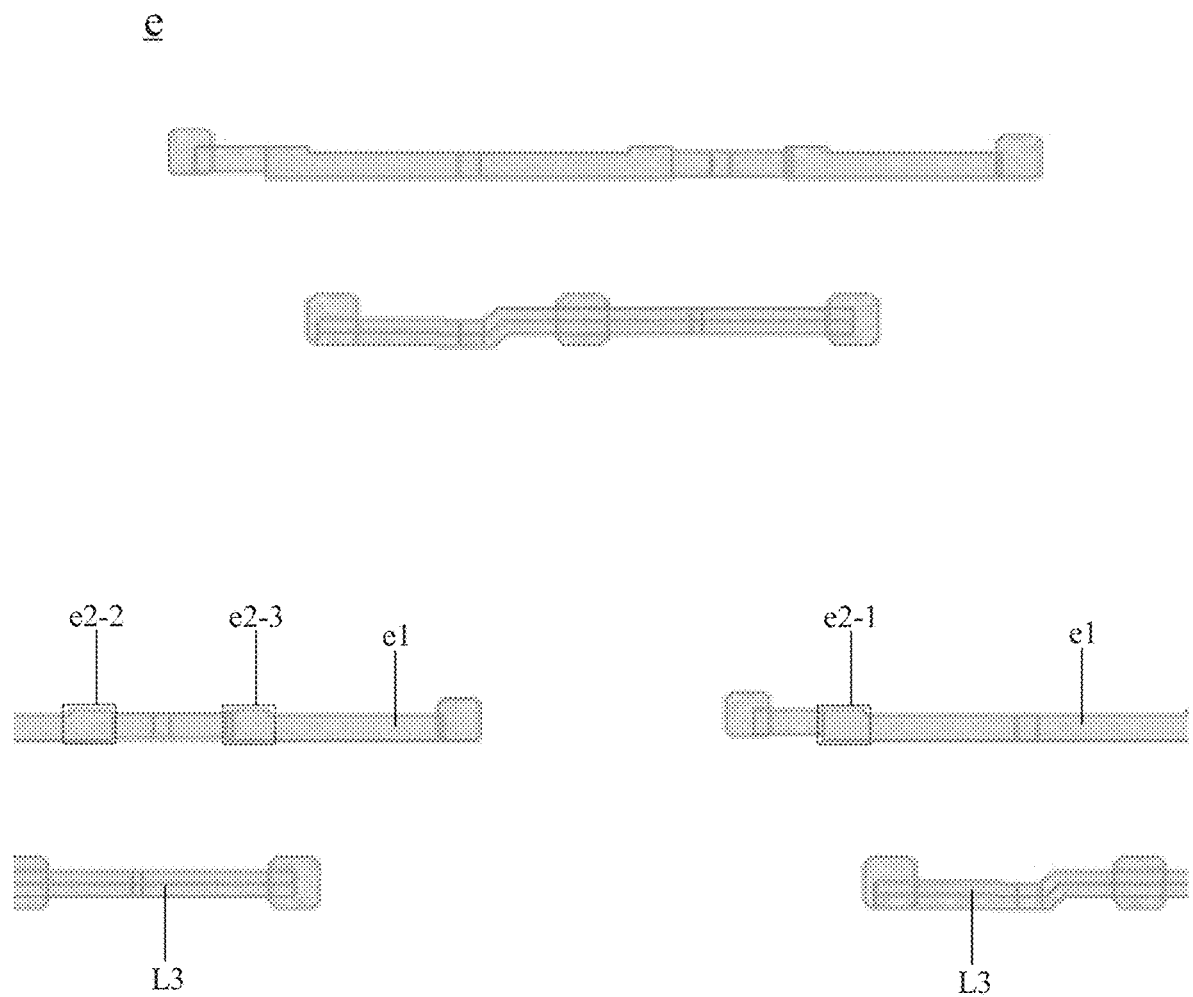
FIG. 52 is a schematic partial diagram of a third gate layer in another display panel according to some embodiments of the present disclosure.
Figure 53:
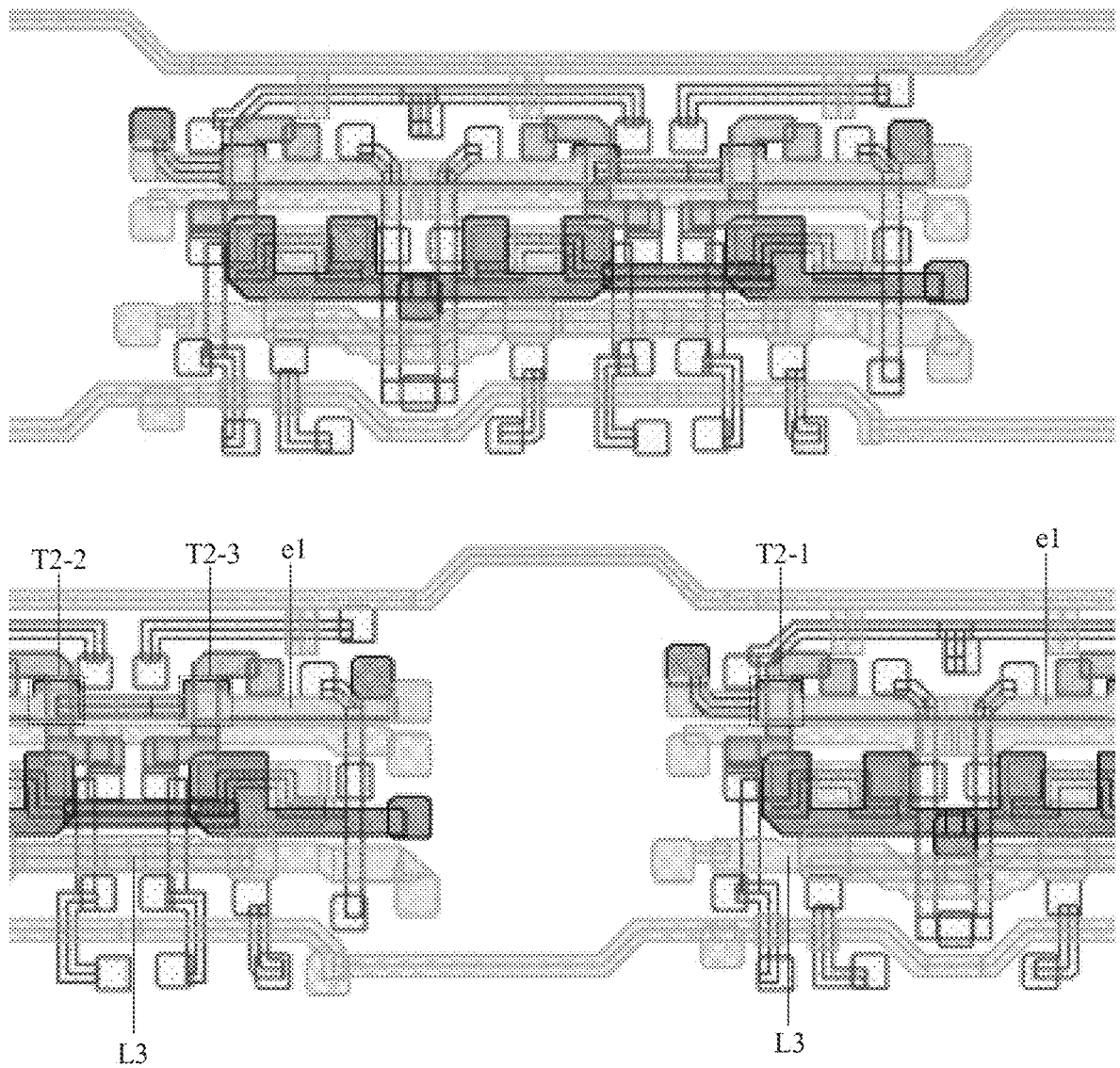
FIG. 53 is a schematic diagram of partial superposition of an active layer, a first gate layer, a second gate layer, an oxide layer, and a third gate layer in another display panel according to some embodiments of the present disclosure.

FIG. 52 is a schematic partial diagram of a third gate layer e in a display panel according to some embodiments of the present disclosure, and FIG. 53 is a schematic diagram of partial superposition of the active layer a, the first gate layer b, the second gate layer c, the oxide layer d, and the third gate layer e in a display panel according to some embodiments of the present disclosure. The third gate layer e is disposed on a side of the fourth gate insulating layer distal from the base substrate 1. Referring to FIGS. 52 and 53, the third gate layer e may include:

a third connecting line L3;

a top gate pattern e2 of the second transistor T2, wherein the top gate pattern e2 of the second transistor T2 includes a top gate pattern e2-1 of a second transistor T2-1 in the first pixel circuit 211, a top gate pattern e2-2 of a second transistor T2-2 in the second pixel circuit 212 and a top gate pattern e2-3 of a second transistor T2-3 in the third pixel circuit 213, the second transistor T2-1 in the first pixel circuit 211 is formed by at least partially overlapping the top gate pattern e2-1 of the second transistor T2-1 with the bottom gate pattern c2-1 disposed on the second gate layer c in the second transistor T2-1, the second transistor T2-2 in the second pixel circuit 212 is formed by at least partially overlapping the top gate pattern e2-2 of the second transistor T2-2 with the bottom gate pattern c2-2 disposed on the second gate layer c in the second transistor T2-2, and the second transistor T2-3 in the second pixel circuit 213 is formed by at least partially overlapping the top gate pattern e2-3 of the second transistor T2-3 with the bottom gate pattern c2-3 disposed on the second gate layer c of the second transistor T2-3; and an eleventh gate pattern e1, configured to connect a gate of the second transistor T2 and a first gate signal line Gate_N disposed in the first source-drain layer h to be introduced later, wherein the eleventh gate pattern e1, the top gate pattern e2-1, the top gate pattern e2-2 and the top gate pattern e2-3 are of an integrated structure, the first gate signal line Gate_N is disposed between two adjacent pixel circuit groups 2 in the same row, and in a plurality of pixel circuit groups 2 disposed in the same row, the eleventh gate pattern e1 in each pixel circuit group 2 connects the first gate signal lines Gate_N disposed between every two adjacent pixel circuit groups 2, thereby forming the first gate signal line Gate_N that runs through the plurality of pixel circuit groups 2 of this row.

In addition, two interlayer dielectric layers, namely, a first interlayer dielectric layer f and a second interlayer dielectric layer g, are formed on the third gate layer e, and are configured to insulate the third gate layer e from a first source-drain layer h formed subsequently.

Figure 54:
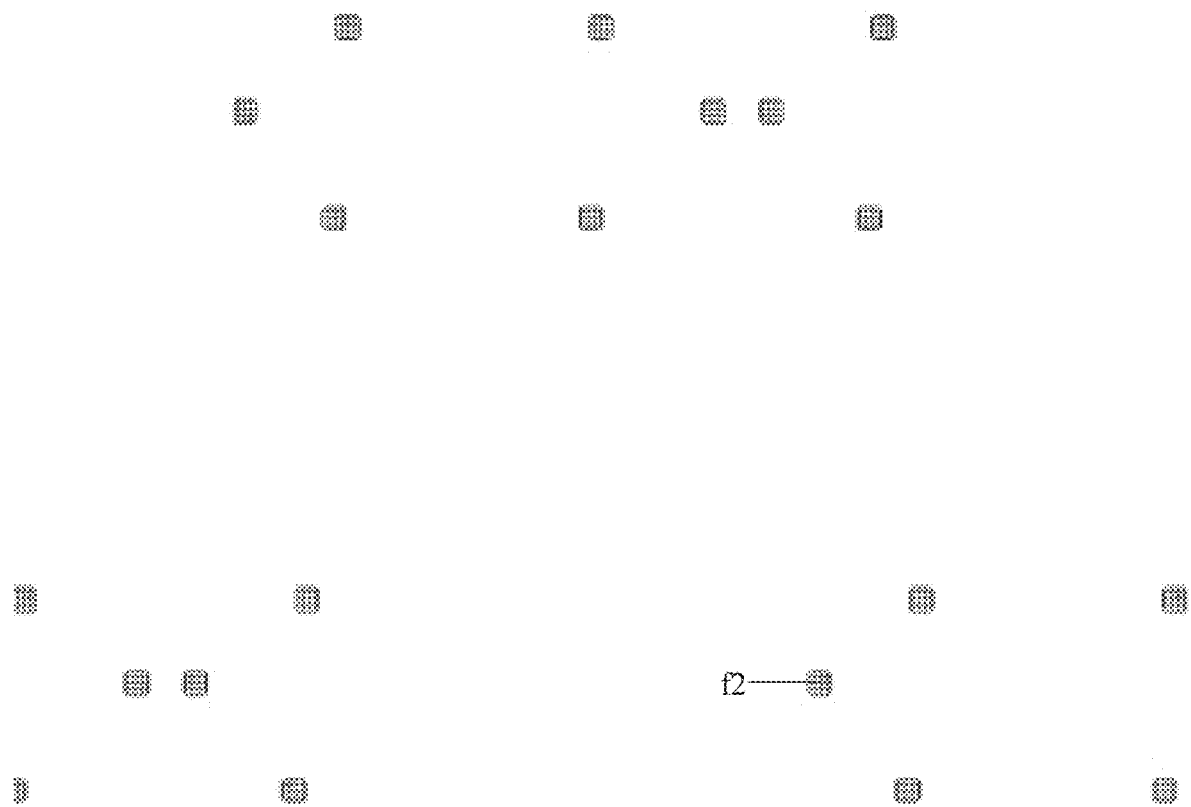
FIG. 54 is a schematic partial structural diagram of a first interlayer dielectric layer in another display panel according to some embodiments of the present disclosure.
Figure 55:
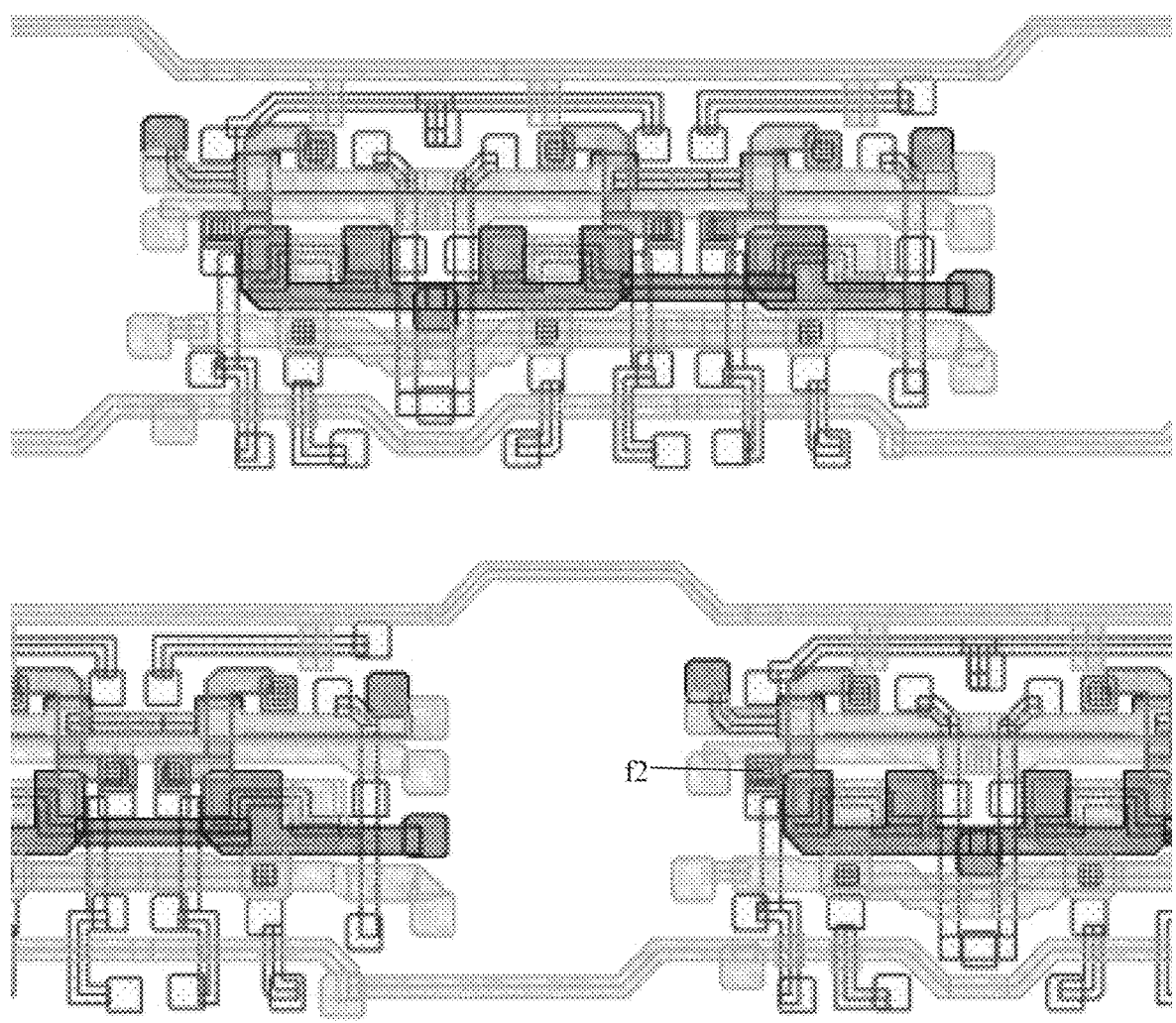
FIG. 55 is a schematic diagram of partial superposition of an active layer, a first gate layer, a second gate layer, an oxide layer, a third gate layer, and a first interlayer dielectric layer in another display panel according to some embodiments of the present disclosure.

FIG. 54 is a schematic partial diagram of a first interlayer dielectric layer f in a display panel according to some embodiments of the present disclosure, and FIG. 55 is a schematic diagram of partial superposition of an active layer a, a first gate layer b, a second gate layer c, an oxide layer d, a third gate layer e, and a first interlayer dielectric layer f in a display panel according to some embodiments of the present disclosure.

Figure 56:
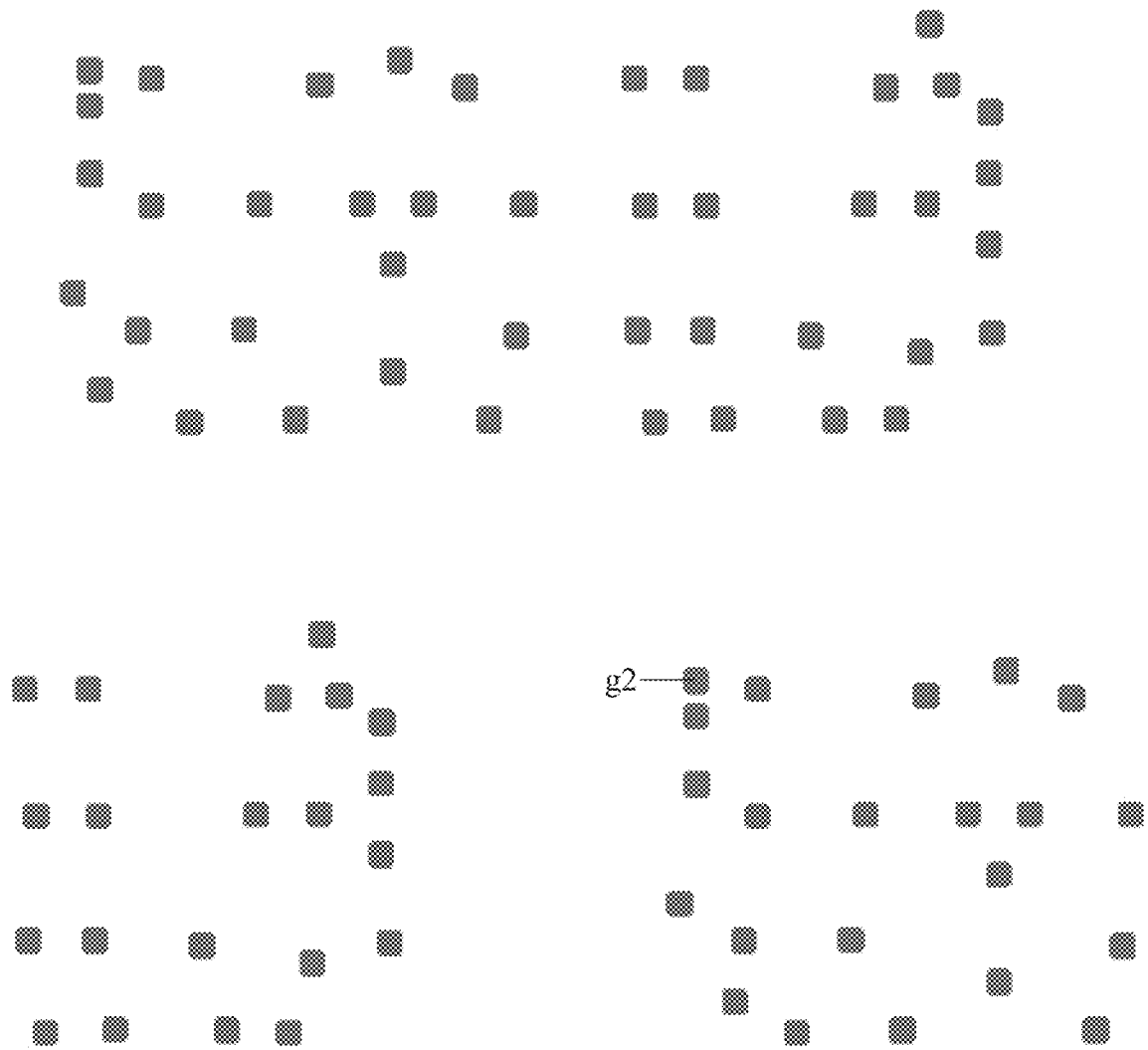
FIG. 56 is a schematic partial diagram of a second interlayer dielectric layer in another display panel according to some embodiments of the present disclosure.
Figure 57:
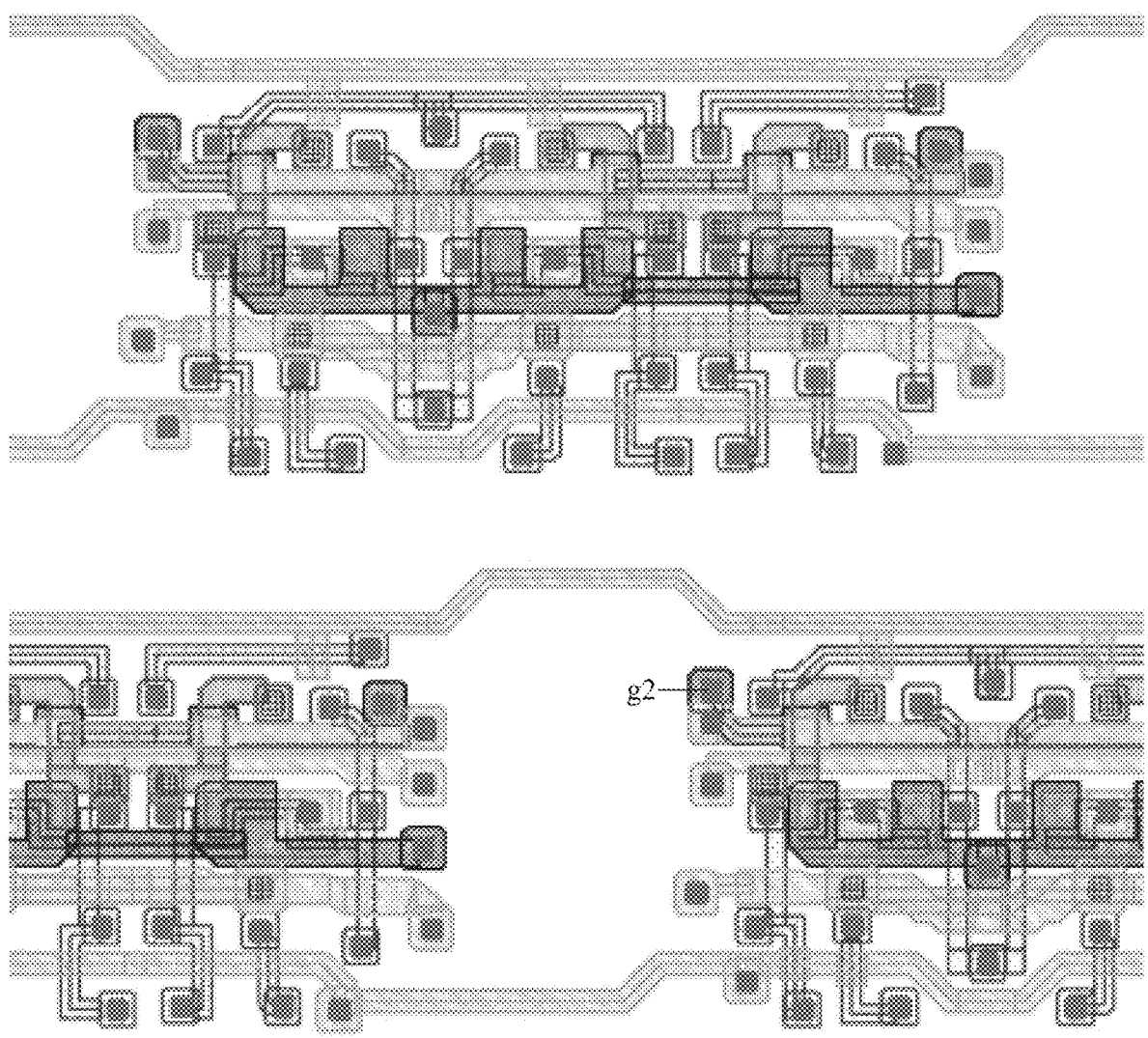
FIG. 57 is a schematic diagram of partial superposition of an active layer, a first gate layer, a second gate layer, an oxide layer, a third gate layer, a first interlayer dielectric layer, and a second interlayer dielectric layer in another display panel according to some embodiments of the present disclosure.

FIG. 56 is a schematic partial diagram of a second interlayer dielectric layer g in a display panel according to some embodiments of the present disclosure, and FIG. 57 is a schematic diagram of partial superposition of an active layer a, a first gate layer b, a second gate layer c, an oxide layer d, a third gate layer e, a first interlayer dielectric layer f, and a second interlayer dielectric layer g in a display panel according to some embodiments of the present disclosure.

To conveniently show each seventh via hole f2 in the first interlayer dielectric layer f and each eighth via hole g2 in the second interlayer dielectric layer g, in FIGS. 54 to 57, the seventh via holes f2 and the eighth via hole g2 are represented by filled patterns, and other regions without filled patterns are configured to represent regions where the first interlayer dielectric layer f and the second interlayer dielectric layer f have solid materials.

It should be noted that each via hole formed in the interlayer dielectric layer is configured to connect a subsequently formed film layer to a film layer on a side of the interlayer dielectric layer proximal to the base substrate 1. That is, each via hole is a via hole for connecting the film layers.

Figure 58:
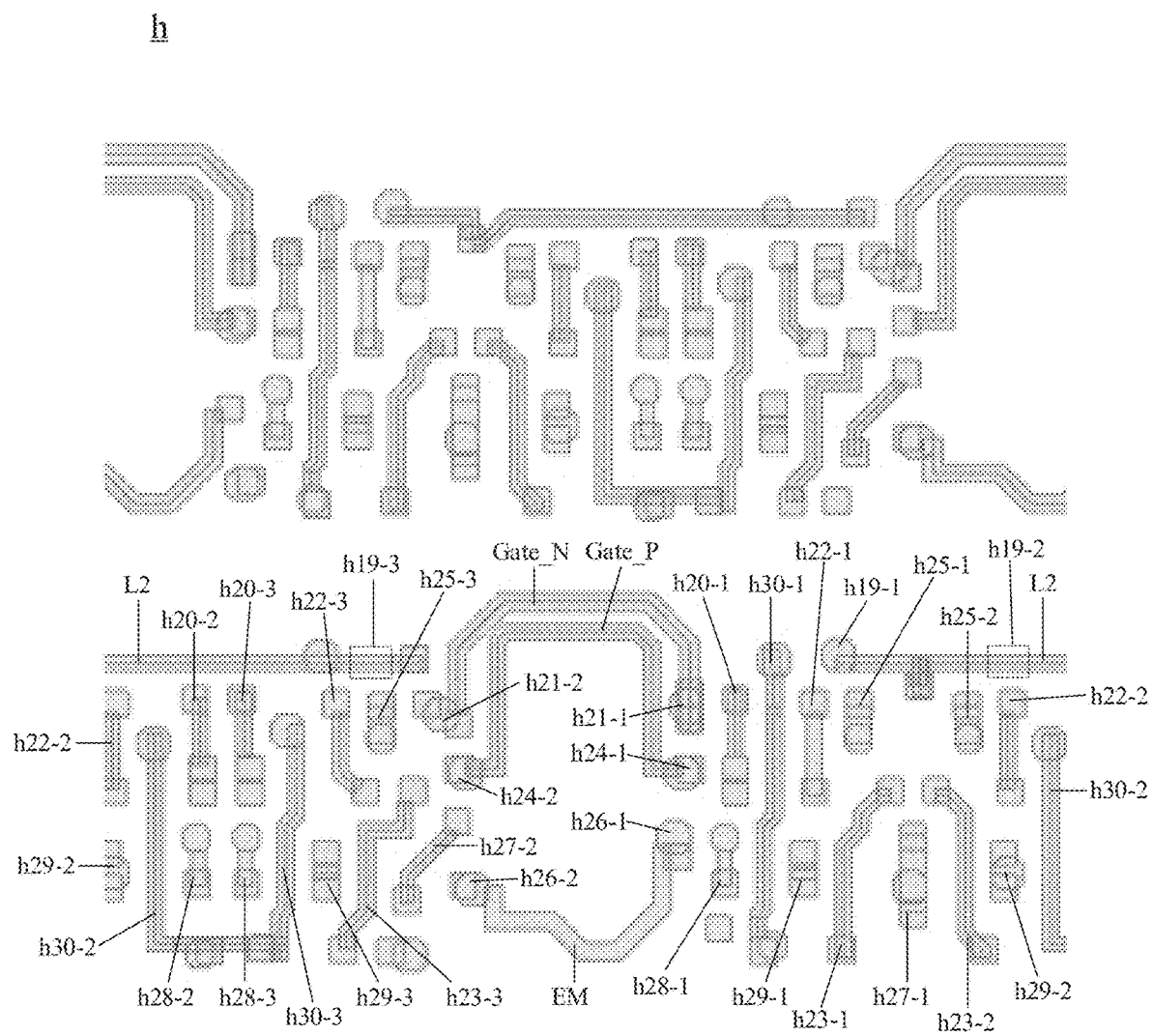
FIG. 58 is a schematic partial structural diagram of a first source-drain layer in another display panel according to some embodiments of the present disclosure.
Figure 59:
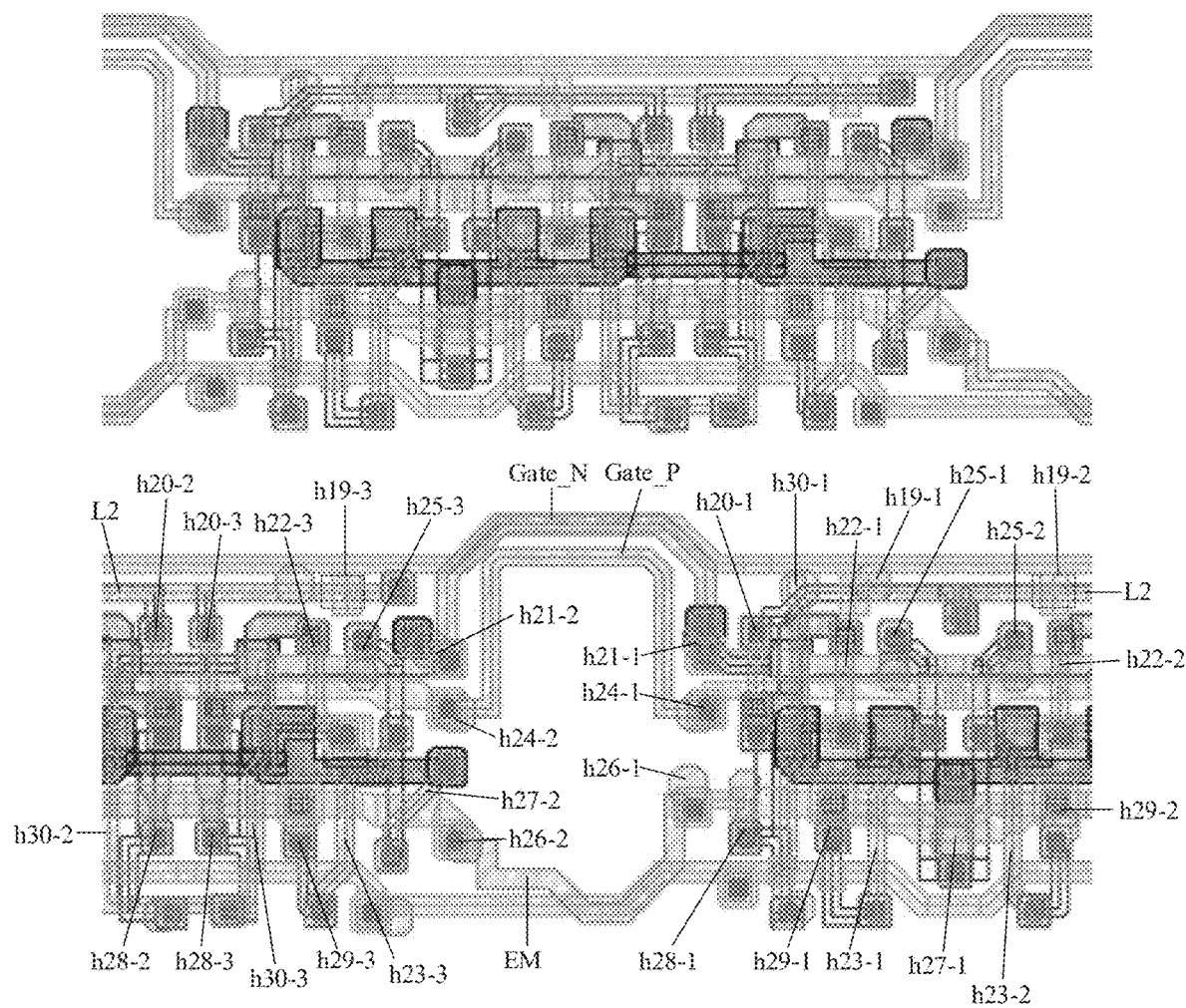
FIG. 59 is a schematic diagram of partial superposition of an active layer, a first gate layer, a second gate layer, an oxide layer, a third gate layer, a first interlayer dielectric layer, a second interlayer dielectric layer, and a first source-drain layer in another display panel according to some embodiments of the present disclosure.

FIG. 58 is a schematic partial diagram of a first source-drain layer h in a display panel according to some embodiments of the present disclosure, and FIG. 59 is a schematic diagram of partial superposition of an active layer a, a first gate layer b, a second gate layer c, an oxide layer d, a third gate layer e, a first interlayer dielectric layer f, a second interlayer dielectric layer g and a first source-drain layer h in a display panel according to some embodiments of the present disclosure. Referring to FIGS. 58 and 59, the first source-drain layer h includes:

a second connecting line L2, a first gate signal line Gate_N, a second gate signal line Gate_P and a light emission control signal line EM;

a nineteenth source-drain pattern h19-1, a twentieth source-drain pattern h20-1, a twenty-first source-drain pattern h21-1, a twenty-second source-drain pattern h22-1, a twenty-third source-drain pattern h23-1, a twenty-fourth source-drain pattern h24-1, a twenty-fifth source-drain pattern h25-1, a twenty-sixth source-drain pattern h26-1, a twenty-seventh source-drain pattern h27-1, a twenty-eighth source-drain pattern h28-2, a twenty-ninth source-drain pattern h29-2 and a thirtieth source-drain pattern h30-1 which are included in the first pixel circuit 211;

a nineteenth source-drain pattern h19-2, a twentieth source-drain pattern h20-2, a twenty-second source-drain pattern h22-2, a twenty-third source-drain pattern h23-2, a twenty-fifth source-drain pattern h25-2, a twenty-seventh source-drain pattern h27-1, a twenty-eighth source-drain pattern h28-2, a twenty-ninth source-drain pattern h29-2 and a thirtieth source-drain pattern h30-2 which are included in the second pixel circuit 212; and a nineteenth source-drain pattern h19-3, a twentieth source-drain pattern h20-3, a twenty-first source-drain pattern h21-2, a twenty-second source-drain pattern h22-3, a twenty-third source-drain pattern h23-3, a twenty-fourth source-drain pattern h24-2, a twenty-fifth source-drain pattern h25-3, a twenty-sixth source-drain pattern h26-2, a twenty-seventh source-drain pattern h27-2, a twenty-eighth source-drain pattern h28-3, a twenty-ninth source-drain pattern h29-3 and a thirtieth source-drain pattern h30-3 which are included in the third pixel circuit 213.

For the first pixel circuit 211, the nineteenth source-drain pattern h19-1 is configured to connect the first pole of the first transistor T1-1, the second connecting line L2, and a first reset power supply line vinit1-1 disposed in the second transparent wiring layer n to be introduced later, wherein the nineteenth source-drain pattern h19-1 and the second connecting line L2 are of an integrated structure;

the twentieth source-drain pattern h20-1 is configured to connect the second pole of the first transistor T1-1, the first pole of the second transistor T2-1, the first pole of the third transistor T3-1 and the first pole of the sixth transistor T6-1;

the twenty-first source-drain pattern h21-1 is configured to connect a bottom gate pattern c2-1 disposed on the second gate layer c in the second transistor T2-1, a top gate pattern e2-1 disposed on the third gate layer e in the second transistor T2-1 and the first gate signal line Gate_N, wherein the twenty-first source-drain pattern h21-1 and the first gate signal line Gate_N are of an integrated structure;

the twenty-second source-drain pattern h22-1 is configured to connect the second pole of the second transistor T2-1, the second capacitor plate Cst2-1 of the storage capacitor Cst-1 disposed in the first gate layer b, and a third gate pattern b3-1 of the third transistor T3-1 disposed on the first gate layer b;

the twenty-third source-drain pattern h23-1 is configured to connect the second pole of the third transistor T3-1, the second pole of the fourth transistor T4-1, the first pole of the fifth transistor T5-1 and the second pole of the eighth transistor T8-1;

the twenty-fourth source-drain pattern h24-1 is configured to connect a fourth gate pattern b4-1 of the fourth transistor T4-1 disposed in the first gate layer b and the second gate signal line Gate_P, wherein the twenty-fourth source-drain pattern h24-1 and the second gate signal line Gate_P are of an integrated structure;

the twenty-fifth source-drain pattern h25-1 is configured to connect the first pole of the fourth transistor T4-1 and the data signal line Data-1 disposed in the second transparent wiring layer n to be introduced later;

the twenty-sixth source-drain pattern h26-1 is configured to connect the fifth gate pattern b5-1 of the fifth transistor T5-1 disposed in the second gate layer B, the sixth gate pattern b6-1 of the sixth transistor T6-1 disposed in the first gate layer b and the light emission control signal EM, wherein the twenty-sixth source-drain pattern h26-1 and the light emission control signal EM are of an integrated structure;

the twenty-seventh source-drain pattern h27-1 is configured to connect the second pole of the fifth transistor T5-1, a first capacitor plate Cst1-1 of the storage capacitor Cst-1 disposed in the second gate layer c, and a driving power supply line VDD-1 disposed in the second transparent wiring layer n to be introduced later;

the twenty-eighth source-drain pattern h28-1 is configured to connect the second pole of the sixth transistor T6-1, the second pole of the seventh transistor T7-1 and a twentieth transparent wiring pattern n4 disposed in the second transparent wiring layer n to be introduced later;

the twenty-ninth source-drain pattern h29-1 is configured to connect the first pole of the eighth transistor T8-1 and the third connecting line L3 disposed in the third gate layer e; and the thirtieth source-drain pattern h30-1 is configured to connect the first pole of the seventh transistor T7-1 and two second reset power supply lines vinit2-1 disposed in the second transparent wiring layer n to be introduced later, wherein the two second reset power supply lines vinit2-1 are disposed between two adjacent pixel circuit groups 2 in the same column; in a plurality of pixel circuit groups 2 disposed in the same column, the thirtieth source-drain pattern h30-1 in each pixel circuit group 2 may connect the second reset power supply lines vinit2-1 between every two adjacent pixel circuit groups 2, thereby forming the second reset power supply lines vinit2-1 that run through the plurality of pixel circuit groups 2 in this column.

For the second pixel circuit 212, the nineteenth source-drain pattern h19-2 is configured to connect the first pole of the first transistor T1-2 and the second connecting line L2, wherein the nineteenth source-drain pattern h19-1 and the second connecting line L2 are of an integrated structure;

the twentieth source-drain pattern h20-2 is configured to connect the second pole of the first transistor T1-2, the first pole of the second transistor T2-2, the first pole of the third transistor T3-2 and the first pole of the sixth transistor T6-2;

the twenty-second source-drain pattern h22-2 is configured to connect the second pole of the second transistor T2-2, the second capacitor plate Cst2-2 of the storage capacitor Cst-2 disposed in the first gate layer b, and a third gate pattern b3-2 of the third transistor T3-2 disposed on the first gate layer b;

the twenty-third source-drain pattern h23-2 is configured to connect the second pole of the third transistor T3-2, the second pole of the fourth transistor T4-2, the first pole of the fifth transistor T5-2 and the second pole of the eighth transistor T8-2;

the twenty-fifth source-drain pattern h25-2 is configured to connect the first pole of the fourth transistor T4-2 and the data signal line Data-2 disposed in the second transparent wiring layer n to be introduced later;

the twenty-seventh source-drain pattern h27-1 is configured to connect the second pole of the fifth transistor T5-2, a first capacitor plate Cst1-2 of the storage capacitor Cst-2 disposed in the second gate layer c, and a driving power supply line VDD-1 disposed in the second transparent wiring layer n to be introduced later;

the twenty-eighth source-drain pattern h28-2 is configured to connect the second pole of the sixth transistor T6-2, the second pole of the seventh transistor T7-2 and a twenty-first transparent wiring pattern n5 disposed in the second transparent wiring layer n to be introduced later;

the twenty-ninth source-drain pattern h29-2 is configured to connect the first pole of the eighth transistor T8-2 and the third connecting line L3 disposed in the third gate layer e; and the thirtieth source-drain pattern h30-2 is configured to connect the first pole of the seventh transistor T7-2 and two second reset power supply lines vinit2-2 disposed in the second transparent wiring layer n to be introduced later, wherein the two second reset power supply lines vinit2-2 are disposed between two adjacent pixel circuit groups 2 in the same column; in a plurality of pixel circuit groups 2 disposed in the same column, the thirtieth source-drain pattern h30-2 in each pixel circuit group 2 may connect the second reset power supply lines vinit2-2 between every two adjacent pixel circuit groups 2, thereby forming the second reset power supply lines vinit2-2 that run through the plurality of pixel circuit groups 2 in this column.

For the third pixel circuit 213, the nineteenth source-drain pattern h19-3 is configured to connect the first pole of the first transistor T1-3, the second connecting line L2, and a first reset power supply line vinit1-2 disposed in the second transparent wiring layer n to be introduced later, wherein the nineteenth source-drain pattern h19-3 and the second connecting line L2 are of an integrated structure;

the twentieth source-drain pattern h20-3 is configured to connect the second pole of the first transistor T1-3, the first pole of the second transistor T2-3, the first pole of the third transistor T3-3 and the first pole of the sixth transistor T6-3;

the twenty-first source-drain pattern h21-2 is configured to connect a bottom gate pattern c2-3 disposed on the second gate layer c in the second transistor T2-3, a top gate pattern e2-3 disposed on the third gate layer e in the second transistor T2-3 and the first gate signal line Gate_N, wherein the twenty-first source-drain pattern h21-1 and the first gate signal line Gate_N are of an integrated structure;

the twenty-second source-drain pattern h22-3 is configured to connect the second pole of the second transistor T2-3, the second capacitor plate Cst2-3 of the storage capacitor Cst-1 disposed in the first gate layer b, and a third gate pattern b3-3 of the third transistor T3-3 disposed on the first gate layer b;

the twenty-third source-drain pattern h23-3 is configured to connect the second pole of the third transistor T3-3, the second pole of the fourth transistor T4-3, the first pole of the fifth transistor T5-3 and the second pole of the eighth transistor T8-3;

the twenty-fourth source-drain pattern h24-2 is configured to connect a fourth gate pattern b4-3 of the fourth transistor T4-3 disposed in the first gate layer b and the second gate signal line Gate_P, wherein the twenty-fourth source-drain pattern h24-2 and the second gate signal line Gate_P are of an integrated structure;

the twenty-fifth source-drain pattern h25-3 is configured to connect the first pole of the fourth transistor T4-3 and the data signal line Data-3 disposed in the second transparent wiring layer n to be introduced later;

the twenty-sixth source-drain pattern h26-2 is configured to connect the fifth gate pattern b5-3 of the fifth transistor T5-3 disposed in the second gate layer B, the sixth gate pattern b6-3 of the sixth transistor T6-3 disposed in the first gate layer b and the light emission control signal EM, wherein the twenty-sixth source-drain pattern h26-2 and the light emission control signal EM are of an integrated structure;

the twenty-seventh source-drain pattern h27-2 is configured to connect the second pole of the fifth transistor T5-3, a first capacitor plate Cst1-3 of the storage capacitor Cst-3 disposed in the second gate layer c, and a driving power supply line VDD-2 disposed in the second transparent wiring layer n to be introduced later;

the twenty-eighth source-drain pattern h28-3 is configured to connect the second pole of the sixth transistor T6-3, the second pole of the seventh transistor T7-3, and a twenty-second transparent wiring pattern n6 disposed in the second transparent wiring layer n to be introduced later;

the twenty-ninth source-drain pattern h29-3 is configured to connect the first pole of the eighth transistor T8-3 and the third connecting line L3 disposed in the third gate layer e; and the thirtieth source-drain pattern h30-3 is configured to connect the first pole of the seventh transistor T7-3 and two second reset power supply lines vinit2-3 disposed in the second transparent wiring layer n to be introduced later, wherein the two second reset power supply lines vinit2-3 are disposed between two adjacent pixel circuit groups 2 in the same column; in a plurality of pixel circuit groups 2 disposed in the same column, the thirtieth source-drain pattern h30-3 in each pixel circuit group 2 may connect the second reset power supply lines vinit2-3 between every two adjacent pixel circuit groups 2, thereby forming the second reset power supply lines vinit2-3 that run through the plurality of pixel circuit groups 2 in this column.

In addition, a passivation layer i is formed on the first source-drain layer h, and is configured to insulate the first source-drain layer h from the second transparent wiring layer n formed subsequently.

Figure 60:
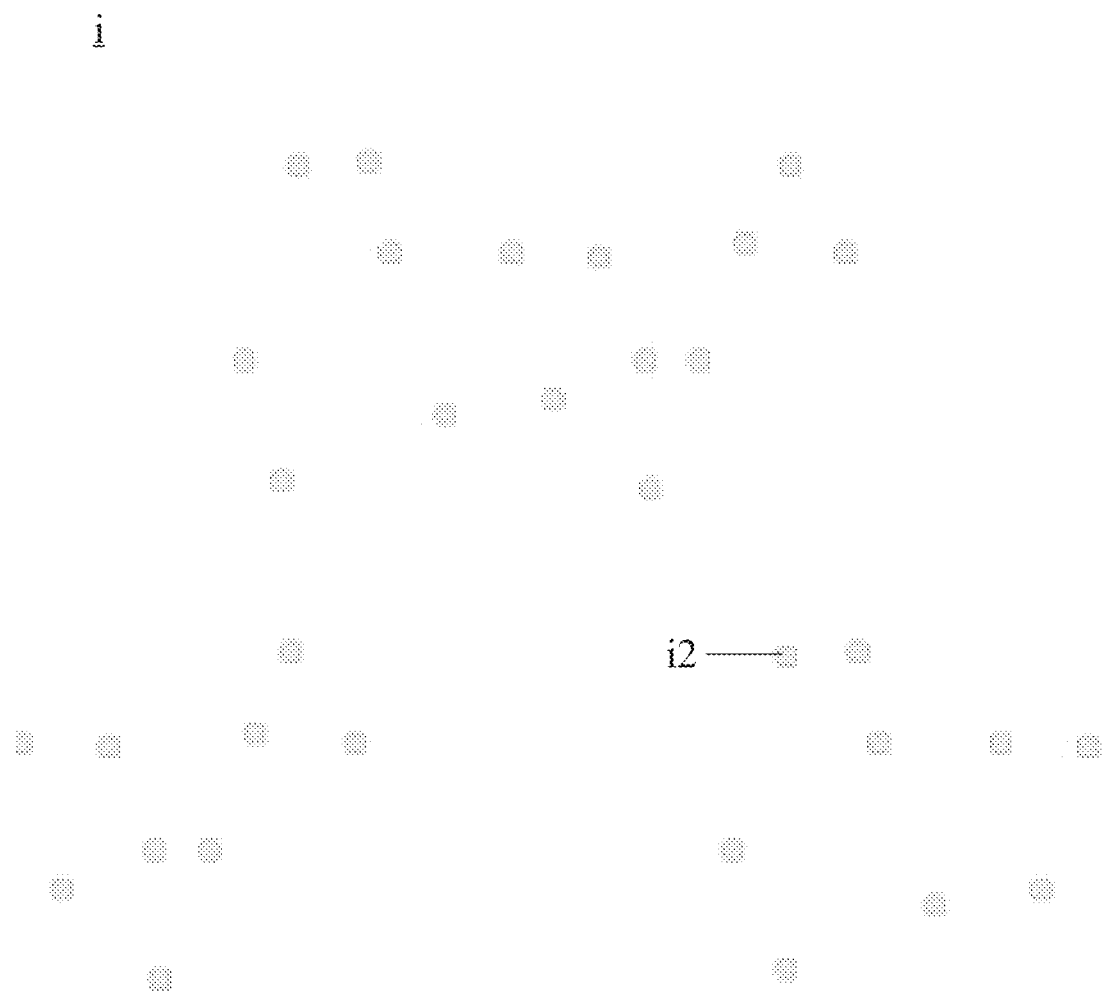
FIG. 60 is a schematic partial diagram of a passivation layer in another display panel according to some embodiments of the present disclosure.
Figure 61:
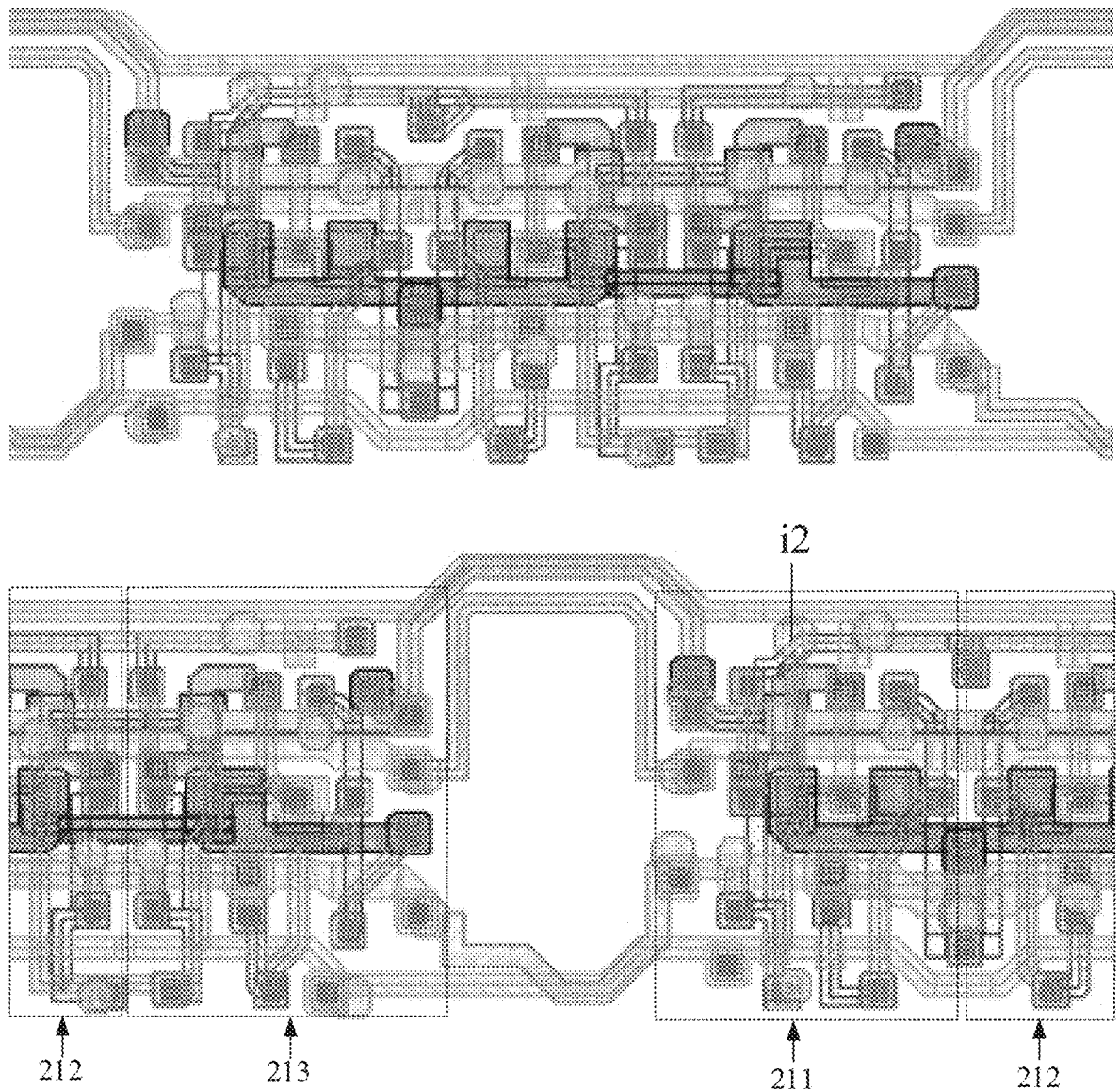
FIG. 61 is a schematic diagram of partial superposition of an active layer, a first gate layer, a second gate layer, an oxide layer, a third gate layer, a first interlayer dielectric layer, a second interlayer dielectric layer, a first source-drain layer and a passivation layer in another display panel according to some embodiments of the present disclosure.

FIG. 60 is a schematic partial diagram of a passivation layer i in a display panel according to some embodiments of the present disclosure, and FIG. 61 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h and a passivation layer i in a display panel according to some embodiments of the present disclosure. The passivation layer i is disposed on a side of the first source-drain layer h distal from the base substrate 1.

To conveniently show each ninth via hole i2 in the passivation layer, in FIGS. 60 and 61, the via holes are represented by filled patterns, and other regions without filled patterns are configured to represent regions where the passivation layer has a solid material. It should be noted that each ninth via hole i2 formed in the passivation layer is configured to connect a subsequently formed film layer to a film layer on a side of the passivation layer proximal to the base substrate 1. That is, each ninth via hole i2 is a via hole for connecting the film layers.

Figure 62:
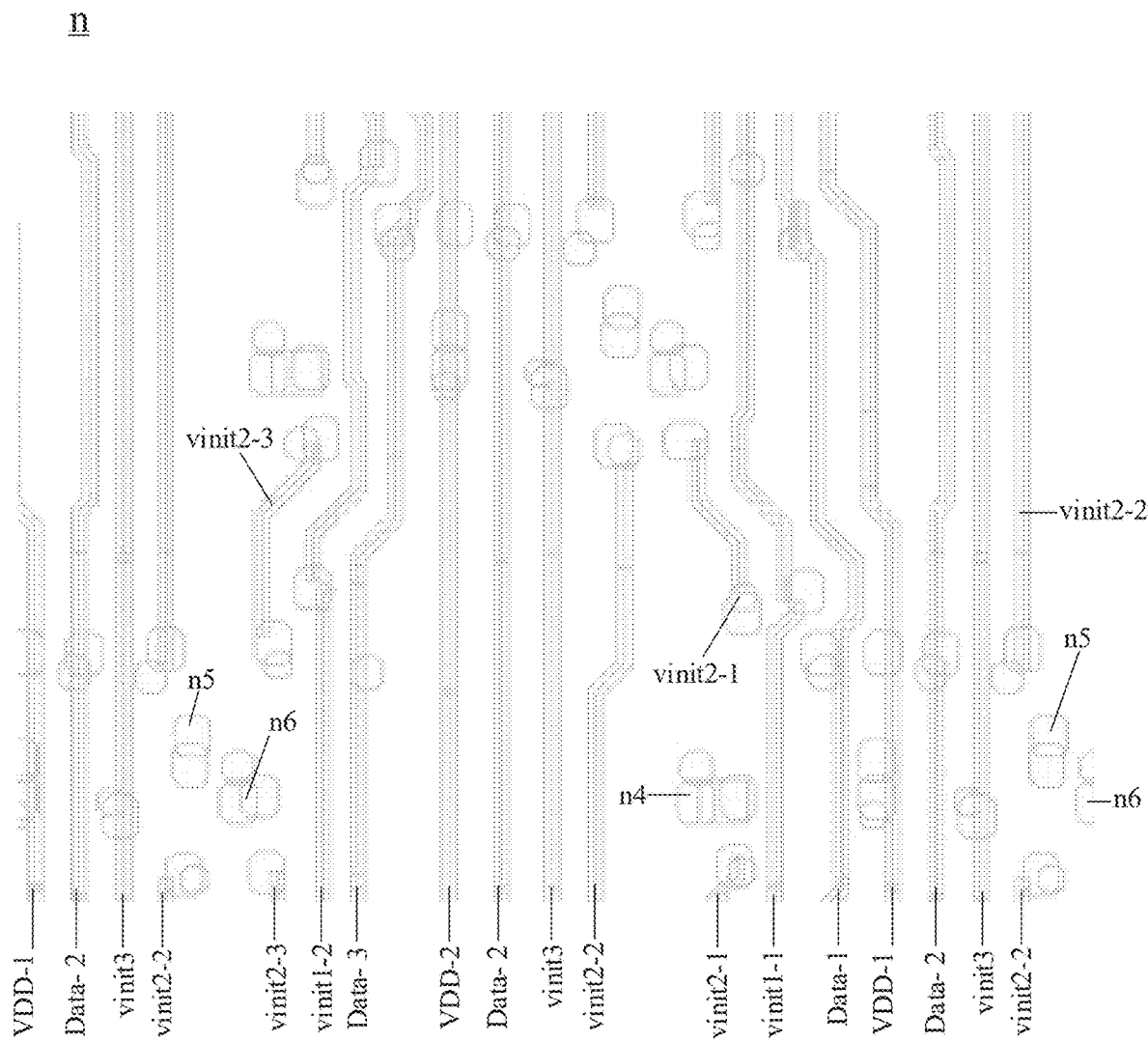
FIG. 62 is a schematic partial structural diagram of a second transparent wiring layer in another display panel according to some embodiments of the present disclosure.
Figure 63:
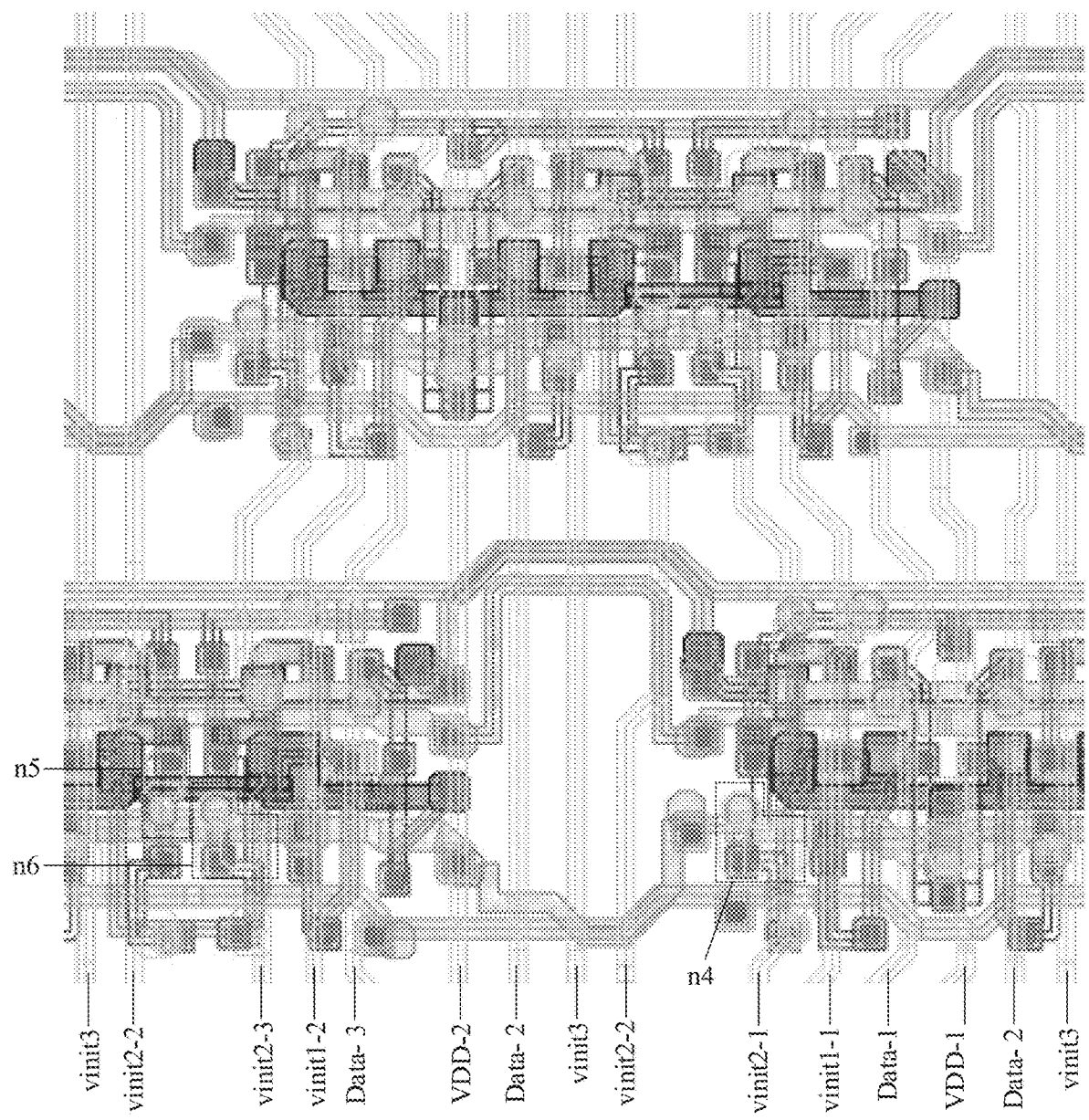
FIG. 63 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer and a second transparent wiring layer in another display panel according to some embodiments of the present disclosure.

FIG. 62 is a schematic partial diagram of a second transparent wiring layer n in a display panel according to some embodiments of the present disclosure, and FIG. 63 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i and a second transparent wiring layer n in a display panel according to some embodiments of the present disclosure. The second transparent wiring layer n is disposed on a side of the passivation layer i distal from the base substrate 1. Referring to FIGS. 62 and 63, the second transparent wiring layer n includes:

first reset power supply lines vinit1, including vinit1-1 and vinit1-2, wherein vinit1-1 and vinit1-2 are connected by the second connecting line L2 in the first source-drain layer h, vinit1-1 is connected to the first pixel circuit 211, vinit1-2 is connected to the third pixel circuit 213, and the second connecting line L2 is connected to the second pixel circuit 212;

second reset power supply lines vinit2, including vinit2-1, vinit2-2 and vinit2-3, wherein vinit2-1 is connected to the first pixel circuit 211, vinit2-2 is connected to the second pixel circuit 212, and vinit2-3 is connected to the third pixel circuit 213;

a third reset power supply line vinit3 connected to the second pixel circuit 212 and the third connecting line L3, wherein the third connecting line L3 is connected to the first pixel circuit 211 and the third pixel circuit 213;

driving power supply lines VDD, including VDD-1 and VDD-2, wherein VDD-1 is connected to the first pixel circuit 211 and the second pixel circuit 212, and VDD-2 is connected to the third pixel circuit 213;

data signal lines Data, including Data-1, Data-2 and Data-3, wherein Data-1 is connected to the first pixel circuit 211, Data-2 is connected to the second pixel circuit 212, and Data-3 is connected to the third pixel circuit 213;

the twentieth transparent wiring pattern n4 is configured to connect the twenty-eighth source-drain pattern h28-1 disposed on the first source-drain layer h and a thirty-first source-drain pattern q5 disposed on the second source-drain layer q to be introduced later;

the twenty-first transparent wiring pattern n5 is configured to connect the twenty-eighth source-drain pattern h28-2 disposed on the first source-drain layer h and a thirty-third source-drain pattern q7 disposed in the second source-drain layer q to be described later; and the twenty-second transparent wiring pattern n6 is configured to connect the twenty-eighth source-drain pattern h28-3 disposed on the first source-drain layer h and a thirty-fourth source-drain pattern q8 disposed in the second source-drain layer q to be described later.

It can be understood that in the first reset power supply lines vinit1 (including vinit1-1 and vinit1-2), the second reset power supply lines vinit2 (including vinit2-1, vinit2-2 and vinit2-3), the third reset power supply line vinit3, the driving power supply lines VDD (including VDD-1 and VDD-2) and the data signal line Data shown in FIGS. 62 and 63, multiple repeated first signal lines 3 of the same type are connected to different pixel circuit groups 2, respectively.

In addition, a second planarization layer p is formed on the second transparent wiring layer n, and is configured to insulate the second transparent wiring layer n from the second source-drain layer q formed subsequently.

Figure 64:
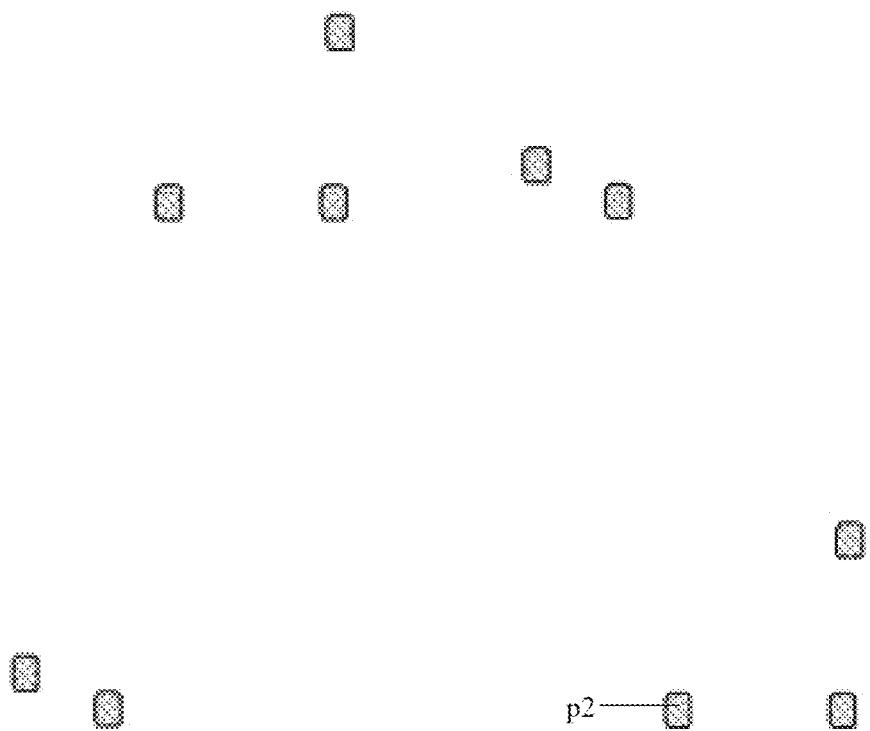
FIG. 64 is a schematic partial structural diagram of a second planarization layer in another display panel according to some embodiments of the present disclosure.
Figure 65:
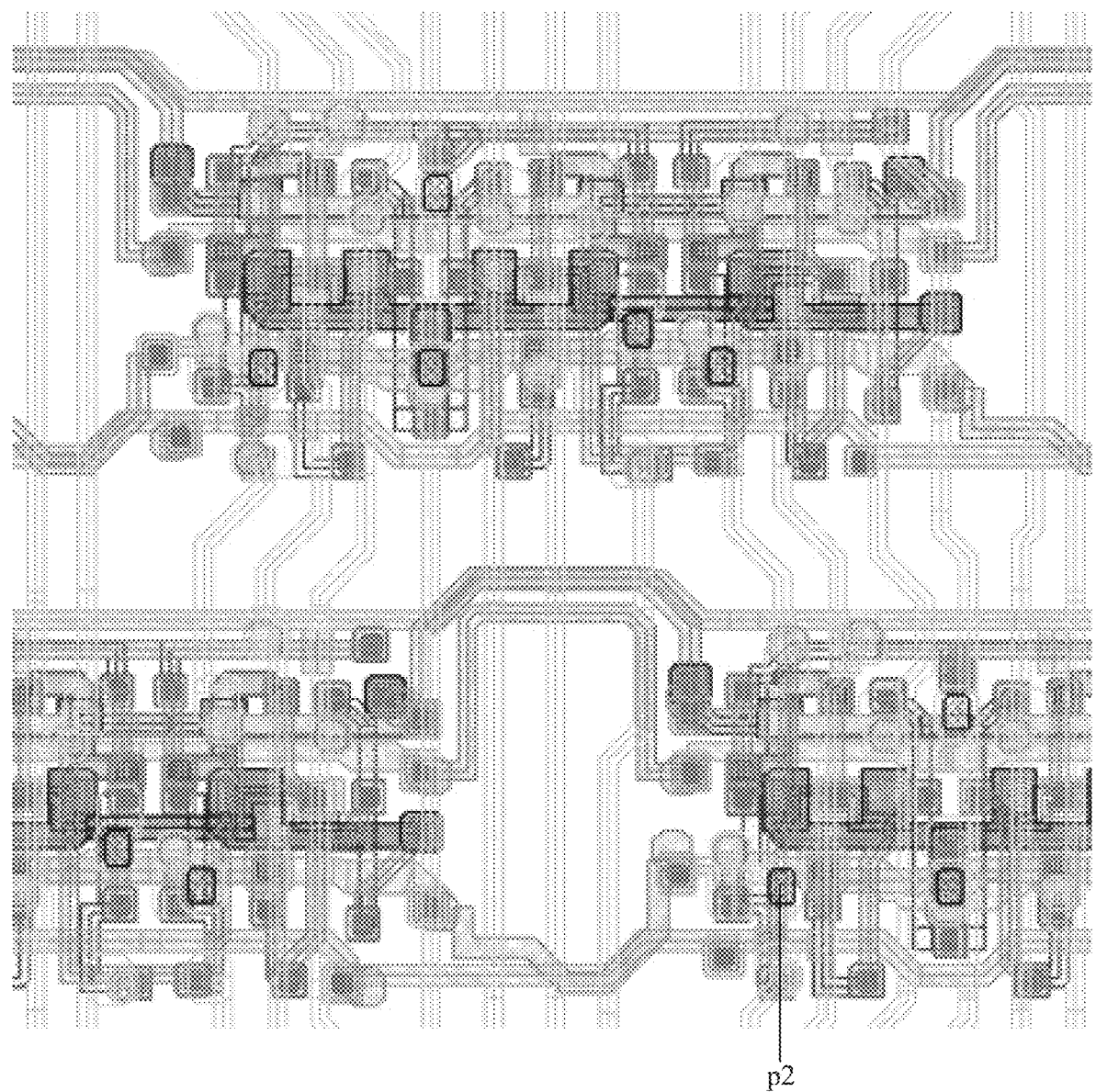
FIG. 65 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer and a second planarization layer in another display panel according to some embodiments of the present disclosure.

FIG. 64 is a schematic partial diagram of the second planarization layer p in a display panel according to some embodiments of the present disclosure, and FIG. 65 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a second transparent wiring layer n and a second planarization layer p in a display panel according to some embodiments of the present disclosure. The second planarization layer p is disposed on a side of the second transparent wiring layer n distal from the base substrate 1.

To conveniently show each tenth via hole p2 in the second planarization layer p, in FIGS. 64 and 65, the tenth via holes p2 are represented by filled patterns, and other regions without filled patterns are configured to represent regions where the second planarization layer p has a solid material. It should be noted that each tenth via hole p2 formed in the second planarization layer p is configured to connect a subsequently formed film layer to a film layer on a side of the second planarization layer p proximal to the base substrate 1. That is, each tenth via hole p2 is a via hole for connecting the film layers.

Figure 66:
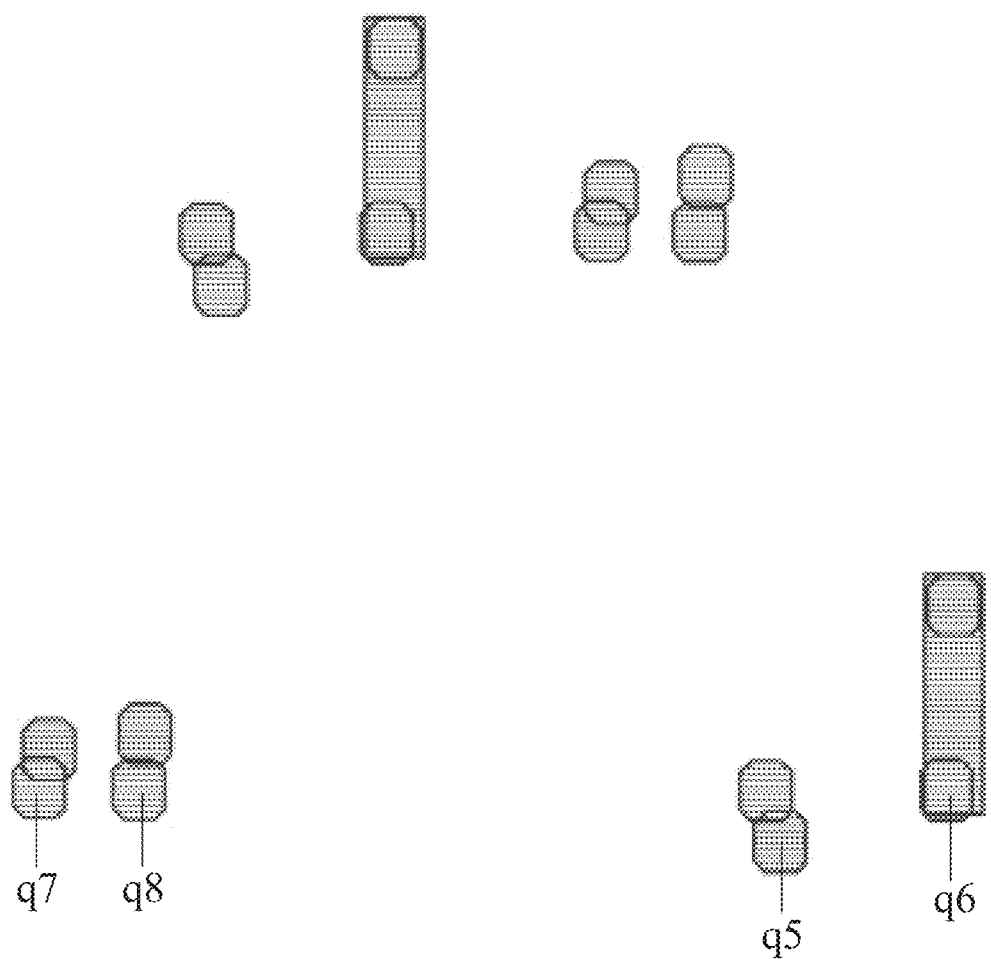
FIG. 66 is a schematic partial structural diagram of a second source-drain layer in another display panel according to some embodiments of the present disclosure.
Figure 67:
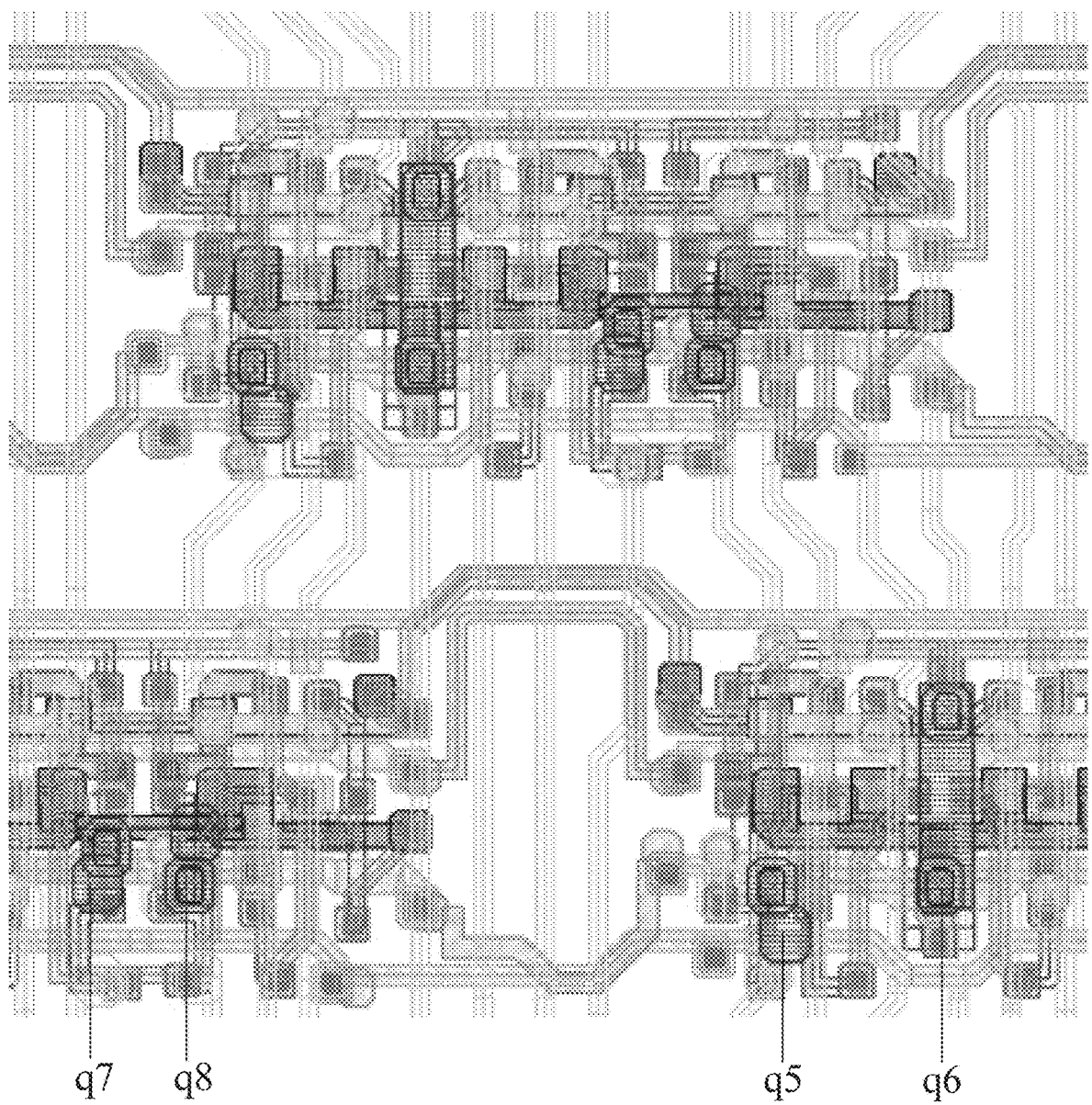
FIG. 67 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, a second planarization layer and a second source-drain layer in another display panel according to some embodiments of the present disclosure.

FIG. 66 is a schematic partial diagram of a second source-drain layer q in a display panel according to some embodiments of the present disclosure, and FIG. 67 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a second transparent wiring layer n, a second planarization layer p and a second source-drain layer q in a display panel according to some embodiments of the present disclosure. The second source-drain layer q is disposed on a side of the second planarization layer p distal from the base substrate 1. Referring to FIGS. 66 and 67, the second source-drain layer q includes:

a thirty-first source-drain pattern q5 is configured to connect the twentieth transparent wiring pattern n4 disposed on the second transparent wiring layer n and the anode 51 of the first light-emitting element disposed in the anode layer to be introduced later;

a thirty-second source-drain pattern q6, wherein the thirty-second source-drain pattern q6 is configured to be connected to the driving power signal line VDD-1 disposed in the second transparent wiring layer n to achieve the parallel connection of a section of circuit, such that the resistance of the driving power signal line VDD-1 is reduced by connecting a section of metal signal line in parallel with the transparent signal line in the driving power signal line VDD-1, thereby reducing phenomena of defective via holes in the first display region 11 in the vertical direction and improving the display uniformity;

a thirty-third source-drain pattern q7, configured to connect the twenty-first transparent wiring pattern n5 disposed on the second transparent wiring layer n and the first connecting line L1 disposed in the anode layer, so as to achieve the connection, by first connecting line L1, between the thirty-third source-drain pattern q7 and the anode 52 of the second light-emitting element disposed in the anode layer to be described later; and a thirty-fourth source-drain pattern q8, configured to connect the twenty-second transparent wiring pattern n6 disposed on the second transparent wiring layer n and the anode 53 of the third light-emitting element disposed in the anode layer to be described later.

In addition, a third planarization layer r is formed on the second source-drain layer q, and is configured to insulate the above second source-drain layer q from the anode layer of the light-emitting element.

Figure 68:
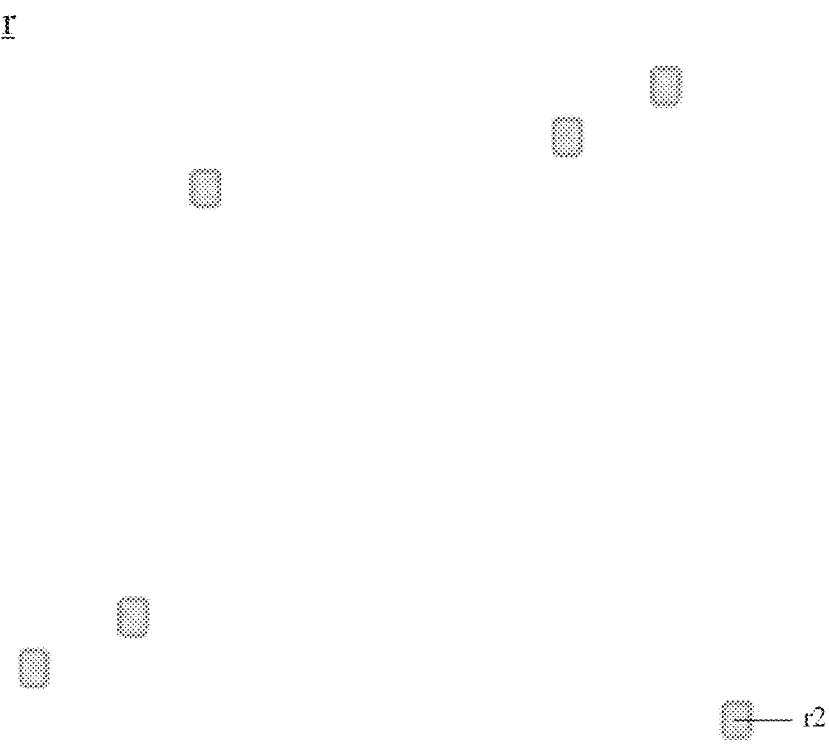
FIG. 68 is a schematic partial structural diagram of a third planarization layer in another display panel according to some embodiments of the present disclosure.
Figure 69:
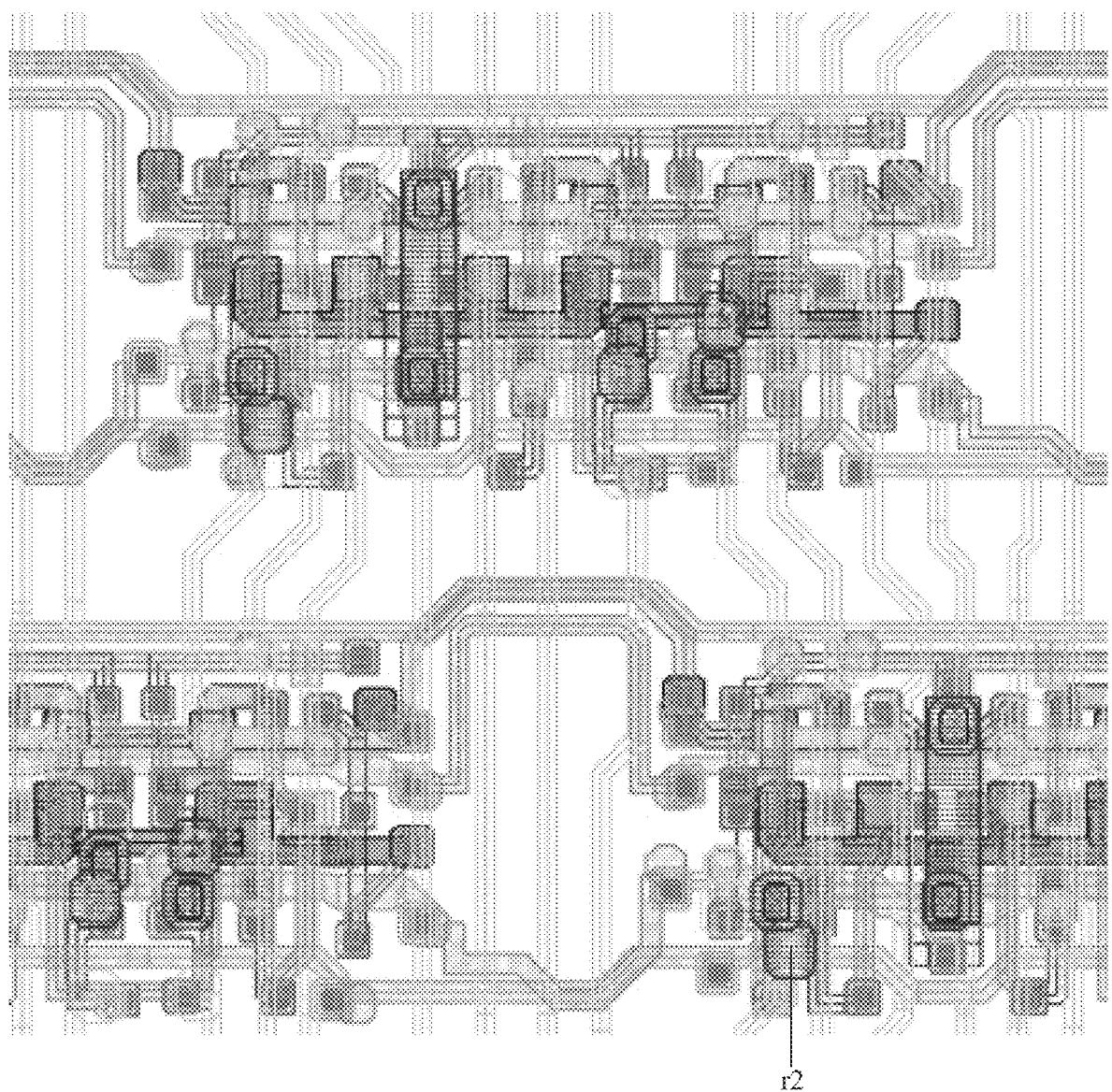
FIG. 69 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, a second planarization layer, a second source-drain layer and a third planarization layer in another display panel according to some embodiments of the present disclosure.

FIG. 68 is a schematic partial diagram of a third planarization layer r in a display panel according to some embodiments of the present disclosure, and FIG. 69 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a second transparent wiring layer n, a second planarization layer p, the second source-drain layer q and a third planarization layer r in a display panel according to some embodiments of the present disclosure. The third planarization layer r is disposed on a side of the second source-drain layer q distal from the base substrate 1.

To conveniently show each eleventh via hole r2 in the third planarization layer r, in FIGS. 68 and 69, the eleventh via holes r2 are represented by filled patterns, and other regions without filled patterns are configured to represent regions where the third planarization layer r has a solid material. It should be noted that each eleventh via hole r2 formed in the third planarization layer r is configured to connect a subsequently formed film layer to a film layer on a side of the third planarization layer r proximal to the base substrate 1. That is, each eleventh via hole r2 is a via hole for connecting the film layers.

Figure 70:
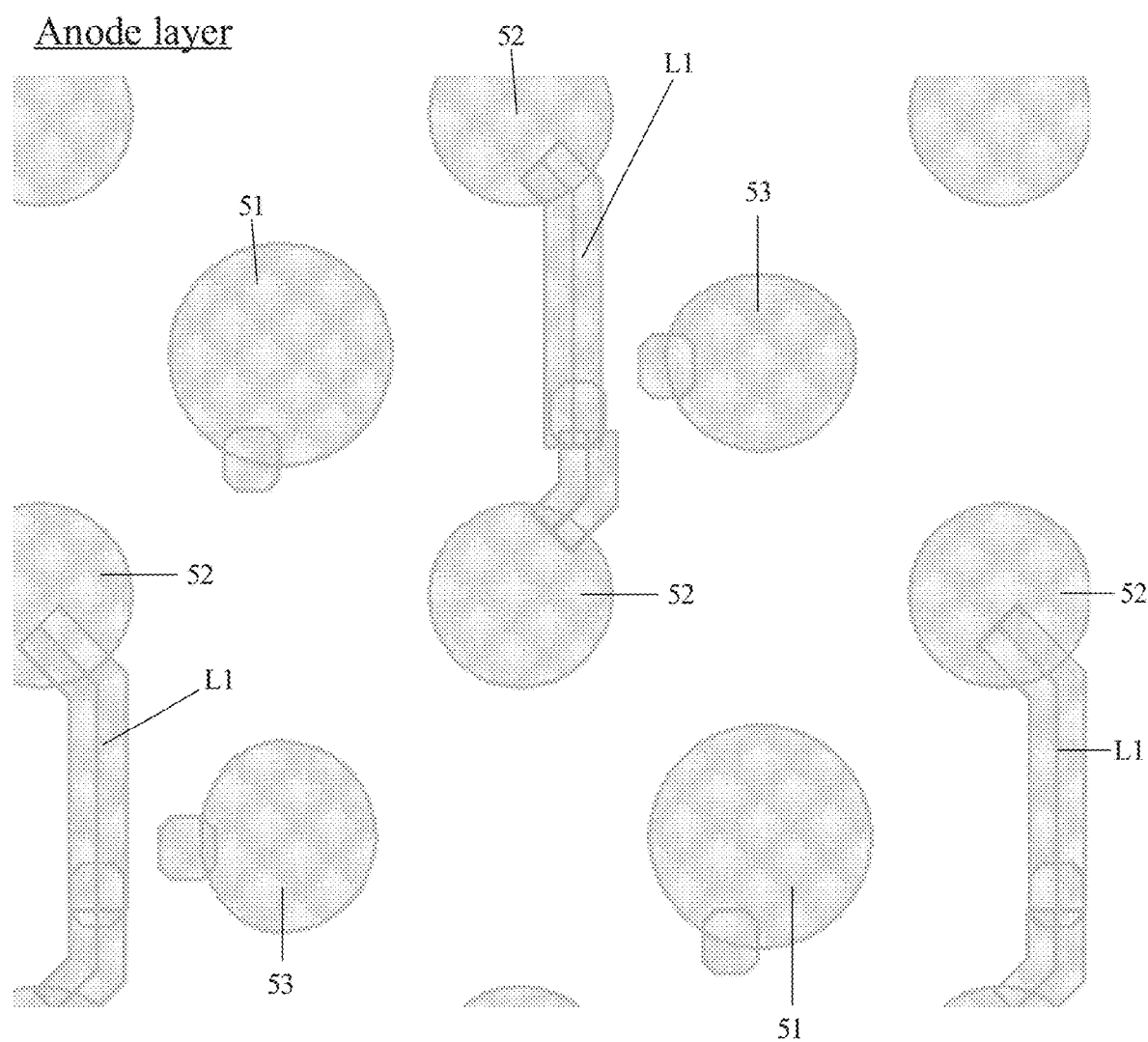
FIG. 70 is a schematic partial structural diagram of an anode layer in another display panel according to some embodiments of the present disclosure.
Figure 71:
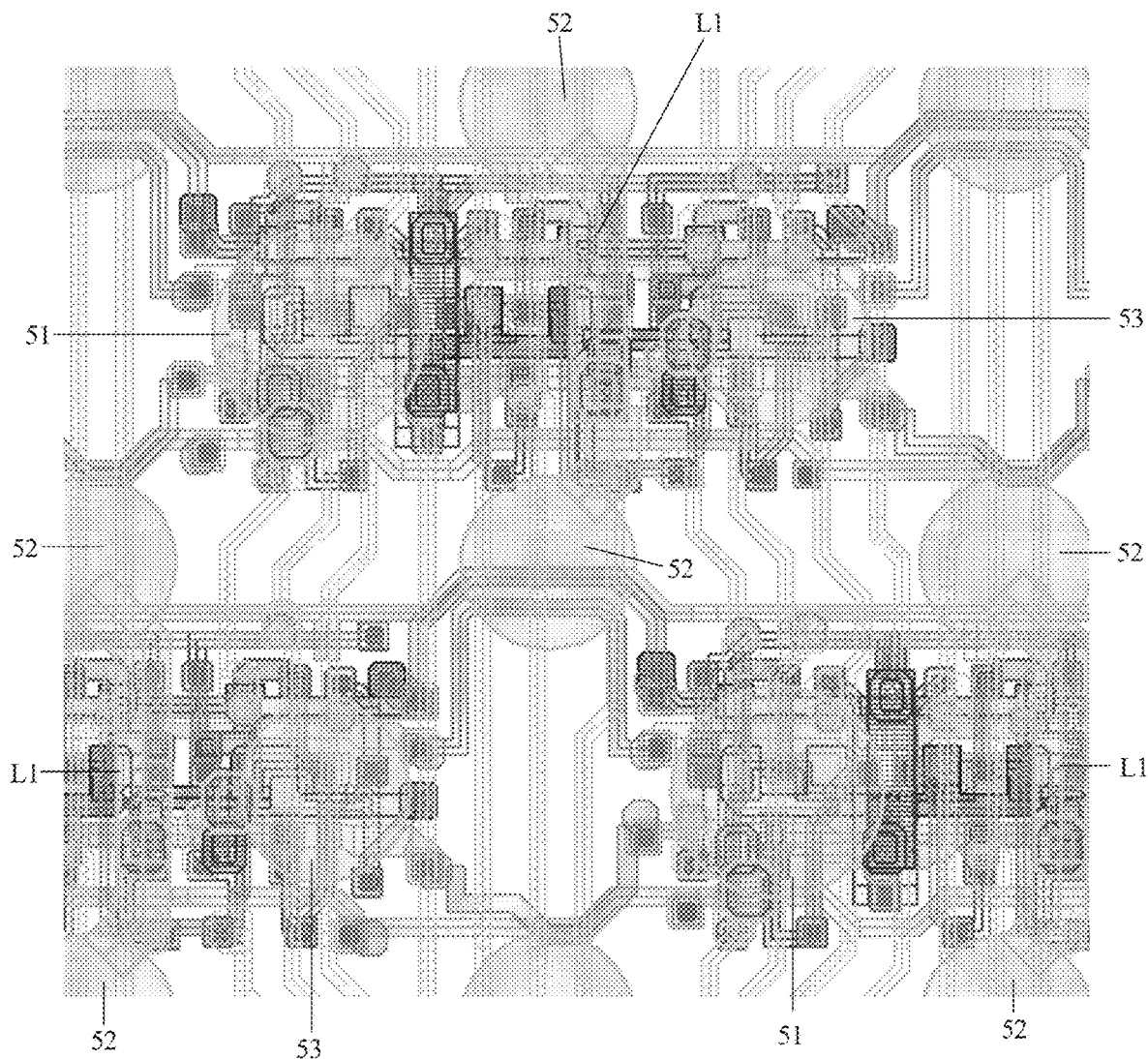
FIG. 71 is a schematic diagram of partial superposition of an active layer, a first gate layer, a second gate layer, an oxide layer, a third gate layer, a first interlayer dielectric layer, a second interlayer dielectric layer, a first source-drain layer, a passivation layer, a first transparent wiring layer, a first planarization layer, a second transparent wiring layer, a second planarization layer, a second source-drain layer, a third planarization layer and an anode layer in another display panel according to some embodiments of the present disclosure.

FIG. 70 is a schematic partial diagram of an anode layer in a display panel according to some embodiments of the present disclosure, and FIG. 71 is a schematic diagram of partial superposition of an active layer a, a first gate layer b, a second gate layer c, an oxide layer d, a third gate layer e, a first interlayer dielectric layer f, a second interlayer dielectric layer g, a first source-drain layer h, a passivation layer i, a second transparent wiring layer n, a second planarization layer p, a second source-drain layer q, a third planarization layer r and an anode layer in a display panel according to some embodiments of the present disclosure. The anode layer is disposed on a side of the third planarization layer r distal from the base substrate 1.

Referring to FIGS. 70 and 71, the anode layer includes an anode 51 of the first light-emitting element, anodes 52 of the second light-emitting elements, an anode 53 of the third light-emitting element, and a first connecting line L1. The anode 51 of the first light-emitting element is connected to the thirty-first source-drain pattern q5 disposed on the second source-drain layer q; two ends of the first connecting line L1 are connected to the anodes 52 of the two second light-emitting elements, and the first connecting line L1 is connected to the thirty-third source-drain pattern q7 disposed on the second source-drain layer q; and the anode 53 of the third light-emitting element is connected to the thirty-fourth source-drain pattern q8 disposed on the second source-drain layer q.

Referring to FIGS. 44 to 71, the first signal lines 3 of some types include the first reset signal line Preset, the second reset signal line Preset_H, the first gate signal line Gate_N, the second gate signal line Gate_P, and the light emission control signal line EM, and are metal signal lines. That is, the first reset signal line Preset and the second reset signal line Preset_H are disposed in the first gate layer b; and the first gate signal line Gate_N, the second gate signal line Gate_P and the light emission control signal line EM are disposed in the first source-drain layer h. Specially, a plurality of first gate signal lines Gate_N in the same row is required to be connected to the eleventh gate patterns e1 disposed on the third gate layer e in a plurality of pixel circuit groups 2 in this row; a plurality of second gate signal lines Gate_P in the same row is required to be connected to the ninth gate patterns b9 on the first gate layer b in a plurality of pixel circuit groups 2 in this row; and a plurality of light emission control signal lines EM in the same row is required to be connected to the tenth gate patterns b10 on the first gate layer b in a plurality of pixel circuit groups 2 in this row.

The first signal lines 3 of other types include first reset power supply lines vinit1 (including vinit1-1 and vinit1-2), second reset power supply lines vinit2 (including vinit2-1, vinit2-2 and vinit2-3), a third reset power supply line vinit3, driving power supply lines VDD (including VDD-1 and VDD-2) and data signal lines data (including Data-1, Data-2 and Data-3), and are all transparent signal lines. That is, the first reset power supply lines vinit1 (including vinit1-1 and vinit1-2), the second reset power supply lines vinit2 (including vinit2-1, vinit2-2 and vinit2-3), the third reset power supply line vinit3 and the driving power supply lines VDD (including VDD-1) are disposed on the second transparent wiring layer n.

Specially, the first pixel circuit 211 and the second pixel circuit 212 in the pixel circuit group 2 share one driving power supply line VDD-1. In order to reduce the resistance of the driving power supply line VDD-1, a metal line segment (the thirty-second source-drain pattern q4) is provided in the second source-drain layer q, and is connected in parallel with the driving power supply line VDD-1 disposed in the second transparent wiring layer n.

A second connecting line L2 for connecting the first reset power supply lines vinit1-1 and vinit1-2 and the second pixel circuits 212 is disposed in the first source-drain layer h, and a third connecting line L3 for connecting the third reset power supply line vinit3, the first pixel circuit 211 and the third pixel circuit 213 is disposed in the third gate layer e.

In summary, the display panel is provided according to the embodiments of the present disclosure. In the first signal lines 3 of the plurality of types, the first signal lines 3 of some types that have a relatively great influence on the display brightness are set to include the metal signal lines, and the resistance of the first signal lines 3 is reduced by the metal signal lines. In this way, a difference value between the resistance of the first signal lines 3 in the first display region 11 and the resistance of the signal lines in a display region other than the first display region 11 in the display panel can be reduced, such that via hole defects around the first display region 11 are effectively reduced, thereby improving the display uniformity of the display panel.

In the embodiments of the present disclosure, referring to FIGS. 3 and 5, the display panel includes a base substrate 1, a plurality of pixel circuit groups 2, a plurality of first signal lines 3 and a plurality of light-emitting units.

The base substrate 1 is provided with a first display region 11, in which an optical sensor is provided. In some embodiments, the optical sensor is a front camera, and the first display region 11 is a full display with camera (FDC) region. The base substrate 1 is also provided with a second display region 12 adjacent to the first display region 11. In some embodiments, the second display region 12 is a display region other than the first display region 11 in the base substrate 1.

The first display region 11 includes a plurality of pixel circuit regions 111 and a light-transmitting region 112. Pixel circuit groups 2 is provided in each pixel circuit region 111. The light-transmitting region 112 is a region without the pixel circuit group 2, and has a light transmittance higher than that of the pixel circuit regions 111.

The plurality of pixel circuit groups 2 is disposed in the plurality of pixel circuit regions 111 in the first display region 11. As shown in FIG. 2, each pixel circuit group 2 includes a first number of pixel circuits 21 arranged in a first direction, and the minimum distance between adjacent pixel circuit groups 2 is greater than that between adjacent pixel circuits 21 in the pixel circuit group 2. In this way, compared with an arrangement mode that a plurality of pixel circuits is uniformly arranged in the second display region 12, gathering the plurality of pixel circuits 21 together in the first display region 11 to form the pixel circuit group 2 can reduce an area occupied by the plurality of pixel circuits 21, such that an area of the light-transmitting region 112 in the first display region 11 is increased, thereby improving the light transmittance of the first display region 11.

In some embodiments, the first direction is the row direction in which the pixel circuits are arranged or other directions, which is not limited by the embodiments of the present disclosure.

The plurality of first signal lines 3 is connected to pixel circuits 21 disposed in the first display region 11, so as to transmit signals to the pixel circuits 21. The first signal line 3 extends in a second direction, wherein the second direction intersects with the first direction, and an included angle formed between the two directions may be any angle, and for example, may be an acute angle, a right angle, or the like, which is not limited by the embodiments of the present disclosure.

At least one of the plurality of pixel circuit groups 2 in the first display region 11 is connected to a second number of first signal lines 3. For the second number of the first signal lines 3 connected to the same pixel circuit group 2, the second number of first signal lines 3 may be electrically connected to each other by a connecting line. That is, the connecting line connects the second number of first signal lines 3 in series. The second number is not greater than the first number, that is, the number of the first signal lines connected to the pixel circuit group 2 is not greater than the number of the pixel circuits 21 included in the pixel circuit group 2.

For each pixel circuit group 2, each of the second number of the first signal lines 3 is connected to at least one pixel circuit 21 in the pixel circuit group 2, and the connecting line is connected to the pixel circuit 21, connected to the first signal line 3, disposed in the pixel circuit group.

At least part of line segments in the first signal lines 3 are disposed in the light-transmitting region 112, and the connecting lines are disposed in the pixel circuit region 111. Thus, by adopting the present disclosure, the number of the first signal lines 3 required to be connected in each pixel circuit group 2 is reduced, and a shielding area of the first signal lines 3 to the light-transmitting region 112 is reduced, such that the light transmittance of the light-transmitting region 112 is improved, thereby improving the performance of the display panel.

The plurality of light-emitting units is disposed in the first display region 11, and the plurality of pixel circuit groups 2 is configured to drive the plurality of light-emitting units to emit light. An orthographic projection of at least part of the plurality of light-emitting units onto the base substrate 1 is overlapped with an orthographic projection of at least part of line segments in the first signal lines 3 onto the base substrate 1. In this way, the first signal lines 3 having a shielding effect on the light-transmitting region 112 are arranged below the light-emitting units which are also disposed in and also have a shielding effect on the light-transmitting region 112, such that the shielding area of the first signal lines 3 to the light-transmitting region 112 is reduced, thereby improving the light transmittance of the light-transmitting region 112 and further improving the performance of the display panel.

In some embodiments, referring to FIG. 5, in the embodiments of the present disclosure, the plurality of pixel circuit groups 2 includes a plurality of first pixel circuit groups 2A and a plurality of second pixel circuit groups 2B, the plurality of first pixel circuit groups 2A is arranged in rows, and the plurality of second pixel circuit groups 2B is arranged in rows. One row of second pixel circuit group 2B is arranged between any two adjacent rows of the first pixel circuit groups 2A. That is, in two adjacent rows of the pixel circuit groups 2 in the first display region 11, one row of the pixel circuit group 2 is the first pixel circuit group 2A, and the other row of the pixel circuit group 2 is the second pixel circuit group 2B. The plurality of rows of the first pixel circuit groups 2A and the plurality of rows of the second pixel circuit groups 2B are alternately arranged.

In addition, in any row of first pixel circuit group 2A and one row of second pixel circuit group 2B adjacent to this row of the first pixel circuit group 2A, the position of an interval region between any two adjacent first pixel circuit groups 2A corresponds to the position of one second pixel circuit group 2B.

Each pixel circuit group 2 in the above first pixel circuit groups 2A and second pixel circuit groups 2B has the following structure.

Each pixel circuit group 2 includes at least one pixel circuit unit. The pixel circuit unit includes one first pixel circuit 211, one second pixel circuit 212, and one third pixel circuit 213, that is, each pixel circuit group 2 includes one or more pixel circuit units. For example, the pixel circuit group 2 shown in FIG. 5 includes one pixel circuit unit including three pixel circuits (i.e., the first pixel circuit 211, the second pixel circuit 212, and the third pixel circuit 213). Or, the pixel circuit group may also include six pixel circuits, nine pixel circuits, and so on, which is not limited by the embodiments of the present disclosure.

In each pixel circuit unit, the second pixel circuit 212 is disposed between the first pixel circuit 211 and the third pixel circuit 213. The first pixel circuit 211, the second pixel circuit 212 and the third pixel circuit 213 are arranged in the first direction.

FIG. 6 is a schematic structural diagram of a pixel circuit group 2 according to some embodiments of the present disclosure. Referring to FIG. 6, the pixel circuit group 2 includes a pixel circuit unit, namely, includes one first pixel circuit 211, one second pixel circuit 212, and one third pixel circuit 213.

Each light-emitting unit includes one first light-emitting element, two second light-emitting elements, and one third light-emitting element, and at least one light-emitting unit corresponds to one pixel circuit unit.

The first light-emitting element is connected to the first pixel circuit 211, that is, an anode of the first light-emitting element is connected to the first pixel circuit 211, and the first pixel circuit 211 drives the first light-emitting element to emit light. In the embodiments of the present disclosure, an orthographic projection of the anode 51 of the first light-emitting element onto the base substrate 1 is at least partially overlapped with the orthographic projection, onto the base substrate 1, of the pixel circuit group 2 where the first pixel circuit 211 is disposed.

The two second light-emitting elements are both connected to the second pixel circuit 212. That is, the anodes 52 of the two second light-emitting elements are connected to the second pixel circuit 212.

In addition, orthographic projections of the anodes 52 of the two second light-emitting elements onto the base substrate 1 are disposed on two opposite sides of the orthographic projection of the second pixel circuit 212 onto the base substrate 1, respectively. Referring to FIG. 6, the orthographic projections of the anodes 52 of the two second light-emitting elements onto the base substrate 1 are disposed on two side portions of the orthographic projection of the second pixel circuit 212 onto the base substrate 1. The orthographic projections of the anodes 52 onto the base substrate 1, the orthographic projection of the first pixel circuit 211 onto the base substrate 1 and the orthographic projection of the third pixel circuit 213 onto the base substrate 1 surround four side portions of the orthographic projection of the second pixel circuit 212 onto the base substrate 1. In some embodiments, the anodes 52 of the two second light-emitting elements is symmetrical, and a symmetry axis thereof is parallel to the first direction.

The third light-emitting element is connected to the third pixel circuit 213, that is, an anode 53 of the third light-emitting element is connected to the third pixel circuit 213, and the third pixel circuit 213 drives the third light-emitting element to emit light. In the embodiments of the present disclosure, an orthographic projection of the anode 53 of the third light-emitting element onto the base substrate 1 is at least partially overlapped with an orthographic projection, onto the base substrate 1, of the pixel circuit group 2 where the third pixel circuit 213 is disposed.

The orthographic projection of the anode 53 of the third light-emitting element onto the base substrate 1 is disposed in the orthographic projection of the third pixel circuit 213 onto the base substrate 1. Since the anode 53 of the third light-emitting element shields light, arranging the anode 53 in a region of the third pixel circuit 213 that also shields light can reduce the shielding influence of the anode 53 of the third light-emitting element on a transparent region in the first display region 11, thereby improving the light transmittance of the first display region 11.

Referring to FIG. 9, the pixel circuit 21 includes a first transistor T1, a second transistor T2, a third transistor T3, a fourth transistor T4, a fifth transistor T5, a sixth transistor T6, a seventh transistor T7, an eighth transistor T8 and a storage capacitor Cst.

The types of the first signal lines include a first reset signal line Preset, a second reset signal line Preset_H, a first reset power supply line vinit1, a second reset power supply line vinit2, a third reset power supply line vinit3, a first gate signal line Gate_N, a second gate signal line Gate_P, a data signal line Data, a light emission control signal line EM and a driving power supply line VDD.

A gate of the first transistor T1 is connected to the first reset signal line Preset, a first pole of the first transistor T1 is connected to the first reset power supply line vinit1, and a second pole of the first transistor T1 is connected to a first node N1. The first transistor T1 is also called a reset transistor.

A gate of the second transistor T2 is connected to the first gate signal line Gate_N, a first pole of the second transistor T2 is connected to the first node N1, and a second pole of the second transistor is connected to a second node N2. The second transistor T2 is also called a compensating transistor.

A gate of the third transistor T3 is connected to the second node N2, a first pole of the third transistor T3 is connected to the first node N1, and a second pole of the third transistor T3 is connected to a third node N3. The third transistor T3 is also called a driving transistor.

A gate of the fourth transistor T4 is connected to the second gate signal line Gate_P, a first pole of the fourth transistor T4 is connected to the data signal line Data, and a second pole of the fourth transistor T4 is connected to the third node N3. The fourth transistor T4 is a data-writing transistor in the pixel circuit.

A gate of the fifth transistor T5 is connected to the light emission control signal line EM, a first pole of the fifth transistor T5 is connected to the third node N3, and a second pole of the fifth transistor T5 is connected to the driving power supply line VDD. Since the gate of the fifth transistor T5 is connected to the light emission control signal line EM, the fifth transistor T5 may also be called a light emission control transistor.

A gate of the sixth transistor T6 is connected to the light emission control signal line EM, a first pole of the sixth transistor T6 is connected to the first node N1, and a second pole of the sixth transistor T6 is connected to an anode of a light-emitting element. Since the gate of the sixth transistor T6 is connected to the light emission control signal line EM, the sixth transistor T6 is also called a light emission control transistor.

A gate of the seventh transistor T7 is connected to the second reset signal line Preset_H, a first pole of the seventh transistor T7 is connected to the second reset power supply line vinit2, and a second pole of the seventh transistor T7 is connected to the anode of the light-emitting element. The seventh transistor T7 is a reset transistor in the pixel circuit.

A gate of the eighth transistor T8 is connected to the second reset signal line Preset H, a first pole of the eighth transistor T8 is connected to the third reset power supply line vinit3, and a second pole of the eighth transistor T8 is connected to the third node N3. The eighth transistor T8 is a reset transistor in the pixel circuit.

Two ends of the storage capacitor Cst are connected to the driving power supply line VDD and the second node N2, respectively.

In some embodiments, referring to FIG. 10, the first signal lines 3 include a first reset power supply line vinit1. Correspondingly, the connecting line includes a second connecting line L2, wherein the second connecting line L2 is disposed in the pixel circuit region 111.

Each pixel circuit unit in the pixel circuit group 2 is connected to two first reset power supply lines vinit1 (including vinit1-1 and vinit1-2), respectively, and the two first reset power supply lines vinit1 is electrically connected by the second connecting line L2.

For each pixel circuit unit, orthographic projections of the two first reset power supply lines vinit1 onto the base substrate 1 are at least partially overlapped with the orthographic projection of the first pixel circuit 211 onto the base substrate 1 and the orthographic projection of the third pixel circuit 213 onto the base substrate 1, respectively; and the two first reset power supply lines vinit1 are connected to the first pixel circuit 211 and the third pixel circuit 213, respectively. That is, the first reset power supply line vinit1-1 and the first reset power supply line vinit1-2 run through the first pixel circuit 211 and the third pixel circuit 213, respectively, and are connected to the first pixel circuit 211 and the third pixel circuit 213 by via holes.

In addition, the second connecting line L2 is connected to the second pixel circuit 212. Two ends of the second connecting line L2 are connected to the first reset power supply lines vinit1 disposed on two sides of the second pixel circuit 212. The second connecting line L2 runs through and is connected to the second pixel circuit 212. The orthographic projections of the two first reset power supply lines vinit1 and an orthographic projection of the second connecting line L2 onto the base substrate 1 form an I shape.

In some embodiments, all the pixel circuit units included in the pixel circuit group 2 are connected to the same second connecting line L2, or are connected to different second connecting lines L2, respectively.

Specifically, when all the pixel circuit units included in the pixel circuit group 2 are connected to the same second connecting line L2, namely, the connecting line corresponding to each pixel circuit group 2 only including one second connecting line L2, a plurality of first reset power supply lines vinit1 connected to the plurality of pixel circuit units in the pixel circuit group 2 is connected to the second connecting line L2; and the second connecting line L2 is connected to all the second pixel circuits 212 in the plurality of pixel circuit units in the pixel circuit group 2.

Or, when all the pixel circuit units included in the pixel circuit group 2 are connected to the different second connecting lines L2, respectively, that is, the connecting lines corresponding to each pixel circuit group 2 include a plurality of second connecting lines L2, each pixel circuit unit included in the pixel circuit group 2 is connected to two first reset power supply lines vinit1 and one second connecting line L2. For each pixel circuit unit, the two first reset power supply lines vinit1 are connected to the first pixel circuit 211 and the third pixel circuit 213, respectively, and are both connected to the second connecting line L2, and the second connecting line L2 is connected to the second pixel circuit 212.

In this way, compared with the solution of providing three first reset power supply lines vinit1 in the related art, one first reset power supply line vinit1 is reduced in the embodiments of the present disclosure, such that the shielding area of the first reset power supply lines vinit1 to the light-transmitting region 112 is reduced, thereby improving the light transmittance of the light-transmitting region 112, and further improving the display performance of the display panel.

In some embodiments, referring to FIG. 10, the first signal lines 3 include a second reset power supply line vinit2. Correspondingly, the connecting line includes a fourth connecting line L4, wherein the fourth connecting line L4 is disposed in the pixel circuit region 111.

Each pixel circuit unit in the pixel circuit group 2 is connected to three second reset power supply lines vinit2 (including vinit2-1, vinit2-2, and vinit2-3). These three second reset power supply lines vinit2 are electrically connected by the fourth connecting line L4.

For each pixel circuit unit, orthographic projections of the three second reset power supply lines vinit2 onto the base substrate 1 are at least partially overlapped with the orthographic projection of the first pixel circuit 211 onto the base substrate 1, the orthographic projection of the second pixel circuit 212 onto the base substrate 1 and the orthographic projection of the third pixel circuit 213 onto the base substrate 1, respectively, and are connected to the first pixel circuit 211, the second pixel circuit 212 and the third pixel circuit 213, respectively. That is, the three second reset power supply lines vinit2 run through the first pixel circuit 211, the second pixel circuit 212 and the third pixel circuit 213, respectively, and are connected to the first pixel circuit 211, the second pixel circuit 212, and the third pixel circuit 213 by via holes, respectively.

By connecting the three second reset power supply lines vinit2 together by the fourth connecting line L4, the stability of signal transmission of the second reset power supply lines vinit2 can be improved. Moreover, the fourth connecting line L4 does not shield the light-transmitting region 112.

In some embodiments, the pixel circuit group 2 corresponds to one fourth connecting line L4, or corresponds to a plurality of fourth connecting lines L4 (that is, each pixel circuit unit included in the pixel circuit group 2 corresponds to one fourth connecting line L4).

Specifically, when the pixel circuit group 2 corresponds to one fourth connecting line L4, that is, the connecting line corresponding to each pixel circuit group 2 only includes one fourth connecting line L4, the second reset power supply lines vinit2 connected to the plurality of pixel circuit units in the pixel circuit group 2 are all connected to this fourth connecting line L4.

Or, when each pixel circuit unit included in the pixel circuit group 2 corresponds to one fourth connecting line L4, that is, the connecting line corresponding to each pixel circuit group 2 may include a plurality of fourth connecting lines L4, each pixel circuit unit included in the pixel circuit group 2 is connected to three second reset power supply lines vinit2. For each pixel circuit unit, these three second reset power supply lines vinit2 are all connected to one fourth connecting line L4, and while the second reset power supply lines vinit2 connected to the different pixel circuit units are connected to different fourth connecting lines L4.

In some embodiments, referring to FIG. 10, the first signal lines 3 include a third reset power supply line vinit3. Correspondingly, the connecting line includes a third connecting line L3, wherein the third connecting line L3 is disposed in the pixel circuit region 111.

Each pixel circuit unit in the pixel circuit group 2 is connected to one third reset power supply line vinit3, and the third reset power supply line vinit3 is connected to the third connecting line L3.

For each pixel circuit unit, the orthographic projection of the third reset power supply line vinit3 onto the base substrate 1 is at least partially overlapped with the orthographic projection of the second pixel circuit 212 onto the base substrate 1, and the third reset power supply line vinit3 is connected to the second pixel circuit 212. That is, the third reset power supply line vinit3 runs through the second pixel circuit 212 and is connected to the second pixel circuit 212 by a via hole.

In addition, the third connecting line L3 is connected to the first pixel circuit 211 and the third pixel circuit 213, wherein the extending direction of the third connecting line L3 intersects with the extending direction of the third reset power supply line vinit3. The third connecting lines L3 respectively extend in two directions perpendicular to and opposite to the extending direction of the third reset power supply lines vinit3, such that the orthographic projections of the third connecting lines L3 onto the base substrate 1 and the orthographic projection of the third reset power supply line vinit3 onto the base substrate 1 are cross-shaped.

The third connecting lines L3 are connected to the third reset power supply line vinit3, and meanwhile, two ends of each third connecting line L3 are connected to the first pixel circuit 211 and the third pixel circuit 213, respectively, such that the first pixel circuit 211, the second pixel circuit 212 and the third pixel circuit 213 can receive the same third reset power supply signal, thereby improving the stability of the third reset power supply signal received by each pixel circuit unit.

In some embodiments, all the pixel circuit units included in the pixel circuit group 2 are connected to the same third connecting line L3, or are connected to different third connecting lines L3, respectively.

Specifically, when all the pixel circuit units included in the pixel circuit group 2 are connected to the same third connecting line L3, namely, the connecting line corresponding to each pixel circuit group 2 only including one third connecting line L3, a plurality of third reset power supply lines vinit3 connected to the plurality of pixel circuit units in the pixel circuit group 2 is connected to this third connecting line L3; and this third connecting line L3 is connected to the first pixel circuits 211 and the third pixel circuits 213 in the plurality of pixel circuit units in the pixel circuit group 2.

Or, when all the pixel circuit units included in the pixel circuit group 2 are connected to the different third connecting lines L3, respectively, that is, the connecting lines corresponding to each pixel circuit group 2 includes a plurality of third connecting lines L3, each pixel circuit unit included in the pixel circuit group 2 is connected to one third reset power supply line vinit3 and one third connecting line L3. For each pixel circuit unit, the third reset power supply lines vinit3 are connected to the second pixel circuits 212, and are connected to the third connecting lines L3; and the third connecting lines L3 are connected to the first pixel circuit 211 and the third pixel circuit 213.

In this way, compared with the solution of providing three third reset power supply lines vinit3 in the related art, one third reset power supply line vinit3 is reduced in the embodiments of the present disclosure, such that the shielding area of the third reset power supply lines vinit3 to the light-transmitting region 112 is reduced, thereby improving the light transmittance of the light-transmitting region 112, and further improving the display performance of the display panel.

In some embodiments, referring to FIG. 10, the first signal line 3 includes driving power supply lines VDD. Correspondingly, the connecting line includes a fifth connecting line L5, wherein the fifth connecting line L5 is disposed in the pixel circuit region 111.

Each pixel circuit unit in the pixel circuit group 2 is connected to two driving power supply lines VDD, and the two driving power supply lines VDD are electrically connected by the fifth connecting line L5.

Correspondingly, referring to FIG. 11, a structural arrangement of the three pixel circuits 21 in the pixel circuit unit is as follows: in arrangement directions of the first pixel circuit 211, the second pixel circuit 212 and the third pixel circuit 213, an orientation of the first pixel circuit 211 faces that of the second pixel circuit 212. That is, at least a part of a pattern of the first pixel circuit 211 and at least a part of a pattern of the second pixel circuit 212 are symmetrical.

Referring to FIGS. 10 and 12, in this case, for each pixel circuit unit, an orthographic projection of one of the driving power supply lines VDD onto the base substrate 1 is at least partially overlapped with the orthographic projection of the first pixel circuit 211 onto the base substrate 1 and the orthographic projection of the second pixel circuit 212 onto the base substrate 1, and is connected to the first pixel circuit 211 and the second pixel circuit 212. That is, the driving power supply line VDD runs through the first pixel circuit 211 and the second pixel circuit 212, and is connected to the first pixel circuit 211 and the third pixel circuit 212 by via holes.

Since the orientation of the first pixel circuit 211 and the orientation of the second pixel circuit 212 are opposite to each other, the driving power supply line VDD is arranged between the first pixel circuit 211 and the second pixel circuit 212 to achieve a solution that one driving power supply line VDD drives the two pixel circuits 21. Therefore, the number of the driving power supply lines VDD is reduced, thereby improving the light transmittance of the first display region 11.

It can be understood that a connection point of the first pixel circuit 211 where the first pixel circuit 211 is connected to the driving power supply line VDD is required to be set to a position proximal to the second pixel circuit 212, and similarly, a connection point of the second pixel circuit 212 where the second pixel circuit 212 is connected to the driving power supply line VDD is required to be set to a position proximal to the first pixel circuit 211. In this way, the connection point on the first pixel circuit 211 and the connection point on the second pixel circuit 212 can be conveniently connected to the same driving power supply line VDD.

An orthographic projection of the other driving power supply line VDD onto the base substrate 1 is at least partially overlapped with the orthographic projection of the third pixel circuit 213 onto the base substrate 1, and the other driving power supply line VDD is connected to the third pixel circuit 213. That is, the other driving power supply line VDD runs through the third pixel circuit 213 and is connected to the third pixel circuit 213 by a via hole. In some embodiments, the orientation of the third pixel circuit 213 is the same as that of the first pixel circuit 211, or is the same as that of the second pixel circuit 212, which is not limited by the embodiments of the present disclosure.

By connecting the two driving power supply lines VDD together by the fifth connecting line L5, the first pixel circuit 211, the second pixel circuit 212 and the third pixel circuit 213 can receive the same driving power signal, thereby improving the stability of the driving power signal received by each pixel circuit unit.

In some embodiments, the pixel circuit group 2 corresponds to one fifth connecting line L5, or corresponds to a plurality of fifth connecting lines L5 (that is, each pixel circuit unit included in the pixel circuit group 2 corresponds to one fifth connecting line L5).

Specifically, when the pixel circuit group 2 corresponds to one fifth connecting line L5, that is, the connecting line corresponding to each pixel circuit group 2 only includes one fifth connecting line L5, the plurality of driving power supply lines VDD connected to the plurality of pixel circuit units in the pixel circuit group 2 are all connected to this fifth connecting line L5.

Or, when each pixel circuit unit included in the pixel circuit group 2 corresponds to one fifth connecting line L5, that is, the connecting line corresponding to each pixel circuit group 2 includes a plurality of fifth connecting lines L5, each pixel circuit unit included in the pixel circuit group 2 is connected to driving power supply lines VDD. For each pixel circuit unit, the two driving power supply lines VDD are both connected to one fifth connecting line L5, and while the driving power supply lines VDD connected to the different pixel circuit units are connected to different fifth connecting lines L5.

The above arrangement of the first reset power supply line vinit1, the second reset power supply line vinit2, the third reset power supply line vinit3 and the driving power supply line VDD not only improves the light transmittance of the light-transmitting region 112, but also improves the stability of a first reset power supply signal, a second reset power supply signal, a third reset power supply signal and a driving power supply signal received by each pixel circuit unit.

In some embodiments, the types of the first signal lines 3 include at least one of the first reset power supply line vinit1, the second reset power supply line vinit2, the third reset power supply line vinit3 and the driving power supply line VDD.

Other related features in the present embodiment are the same as those in the above embodiments, and thus, may refer to the detailed description of those in the above embodiments, which is not repeated herein.

Figure 72:
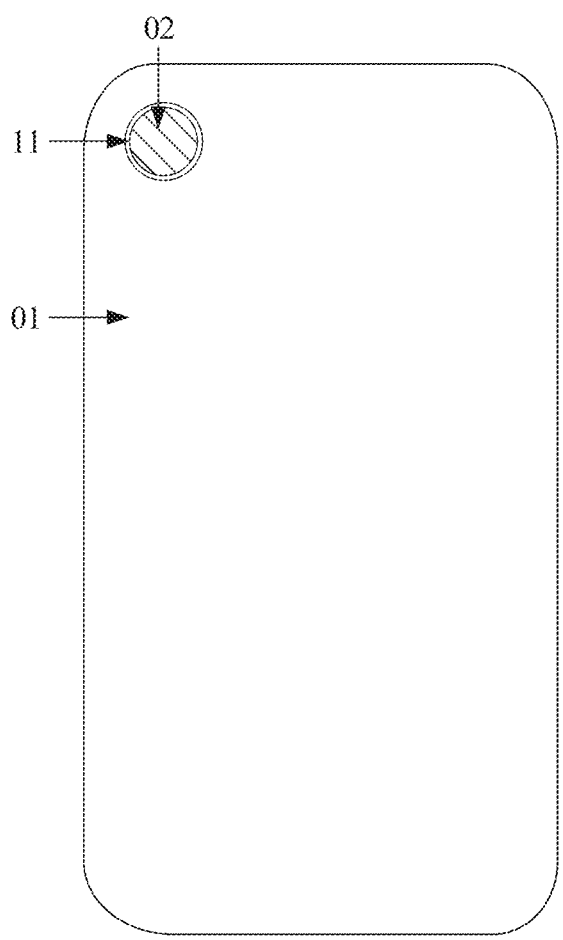
FIG. 72 is a schematic structural diagram of a display device according to some embodiments of the present disclosure.

FIG. 72 is a schematic structural diagram of a display device according to some embodiments of the present disclosure. Referring to FIG. 72, the display device may include any one of the display panels 01 according to the above embodiments, and an optical sensor 02, wherein an orthogonal projection of the optical sensor 02 onto the display panel 01 is at least partially overlapped with the first display region 11 in the display panel 01.

In the display device, the optical sensor 02 is usually mounted on a non-display surface side of the display panel 01, and a light-sensitive surface side of the optical sensor 02 faces the display panel 01. In the embodiments of the present disclosure, the optical sensor 02 includes a front camera, a proximity light sensor, a 3D sensing module and other optical sensors, and these optical sensors receive light from a display surface side of the display device to achieve their corresponding functions.

In the embodiments of the present disclosure, the display device may be any product or component with a display function, such as an active-matrix organic light-emitting diode (AMOLED) display device, a passive-matrix organic light-emitting diode (PMOLED) display device, a quantum dot light-emitting diodes (QLED) display device, electronic paper, a mobile phone, a tablet PC, a TV set, a display, a notebook computer, a digital photo frame, or a navigator.

Since the display device may have basically the same technical effect as the display panel described in the previous embodiments, for the sake of brevity, the technical effects of the display device are not repeated herein.

It should be understood that although the terms such as "first" and "second" may be configured to describe various elements, components, regions, layers and/or portions herein, these elements, components, regions, layers and/or portions should not be limited by these terms. These terms are only configured to distinguish one element, component, region, layer or portion from another element, component, region, layer or portion. Thus, a first element, component, region, layer or portion discussed above may be called as a second element, component, region, layer or portion without departing from the teachings of the present disclosure.

Spatial relative terms such as "below . . . ", "above . . . ", "left", "right" and the like may be configured to describe a relationship between one element or feature and another element or feature as shown in the figures for convenience of description. It should be understood that these spatial relative terms are intended to cover different orientations of devices in use or operation other than those depicted in the figures. For example, in the case a device in the figure is turned over, it is described that an orientation of an element "below other elements or features" is "above other elements or features". Thus, the exemplary terms may cover both the orientations of "below . . . " and "above . . . ". The device may be oriented in other ways (rotated by 90 degrees or in other orientations) and spatial relative descriptors used herein should be interpreted accordingly. In addition, it also should be understood that when a layer is called "between two layers", it may be the only layer between the two layers, or there may be one or more intermediate layers.

The terms used herein are for the purpose of describing particular embodiments only and are not intended to limit the present disclosure. As used herein, the singular forms "a", "an" and "this" are intended to include the plural forms, unless the context clearly indicates otherwise. It should be further understood that the terms "comprise/include" and/or "contain" when used in the Description specify the presence of said feature, integer, step, operation, element and/or component, but do not exclude the presence or addition of one or more other features, integers, steps, operations, elements, components and/or groups thereof. As used herein, the term "and/or" includes any and all combinations of one or more of the associated listed items. In the Description, the described specific features, structures, materials or characteristics may be combined in any one or more embodiments or examples in a suitable fashion. In addition, those skilled in the art can combine and compose different embodiments or examples and features of different embodiments or examples described in this Description without contradicting each other.

Those skilled in the art will appreciate that all terms (including technical and scientific terms) as used herein have the same meanings as commonly understood by those of ordinary skill in the art of the present disclosure, unless otherwise defined. It also should be understood that terms such as those defined in the general dictionary should be understood to have the meanings consistent with the meanings in the relevant fields and/or in the context of the Description, and should not be interpreted in an idealized or overly formal meaning unless specifically defined as herein.

The foregoing descriptions are merely optional embodiments of the present disclosure, and are not intended to limit the present disclosure. Within the spirit and principles of the present disclosure, any modifications, equivalent substitutions, improvements, etc., are within the protection scope of the present disclosure.

What is claimed is:

1. A display panel, comprising:
    a base substrate provided with a first display region, wherein the first display region comprises a plurality of pixel circuit regions and a light-transmitting region;
    a plurality of pixel circuit groups disposed in the plurality of pixel circuit regions, wherein each pixel circuit group comprises a plurality of pixel circuits and first signal lines of a plurality of types connected to the plurality of pixel circuits, a minimum distance between adjacent pixel circuit groups is greater than a minimum distance between adjacent pixel circuits in the pixel circuit group, the first signal lines of some types in the first signal lines of the plurality of types comprise metal signal lines, the first signal lines of other types comprise transparent signal lines, and at least part of line segments in the first signal lines of the plurality of types are disposed in the light-transmitting region; and
    a plurality of light-emitting units disposed in the first display region, wherein the plurality of pixel circuit groups is configured to drive the plurality of light-emitting units to emit light, and orthographic projections of at least part of the plurality of light-emitting units onto the base substrate are overlapped with orthographic projections, onto the base substrate, of the at least part of line segments in the first signal lines of the plurality of types disposed in the light-transmitting region,
    wherein the base substrate is further provided with a second display region adjacent to the first display region;
    the display panel further comprises second signal lines of a plurality of types disposed in the second display region; and
    for each type of a first reset signal line, a second reset signal line, a first reset power supply line, a second reset power supply line, a third reset power supply line, a first gate signal line, a second gate signal line, a data signal line, a light emission control signal line and a driving power supply line, at least one end of each second signal line of the type is connected to the first signal line of the type, wherein the second signal line is a metal signal line, and a width of the metal signal line comprised in the first signal line is less than a width of the second signal line.

2. The display panel according to claim 1, wherein at least part of line segments in the metal signal lines are disposed in the light-transmitting region, and the orthographic projections of at least part of the plurality of light-emitting units onto the base substrate are overlapped with orthographic projections of at least part of the line segments in the metal signal lines onto the base substrate.

3. The display panel according to claim 1, wherein at least part of line segments in the transparent signal lines are disposed in the light-transmitting region, and the orthographic projections of at least part of the plurality of light-emitting units onto the base substrate are overlapped with orthographic projections of at least part of the line segments in the transparent signal lines onto the base substrate.

4. The display panel according to claim 1, wherein the plurality of pixel circuit groups comprises a plurality of first pixel circuit groups and a plurality of second pixel circuit groups, the plurality of first pixel circuit groups is arranged in rows, and the plurality of second pixel circuit groups is arranged in rows; one row of the second pixel circuit group is arranged between any two adjacent rows of the first pixel circuit groups; and in any row of the first pixel circuit group and one row of the second pixel circuit group adjacent to the row of the first pixel circuit group, an interval region between any two adjacent first pixel circuit groups corresponds to one second pixel circuit group.

5. The display panel according to claim 4, wherein each of the pixel circuit groups comprises at least one pixel circuit unit, each pixel circuit unit comprises one first pixel circuit, one second pixel circuit, and one third pixel circuit, and the second pixel circuit is disposed between the first pixel circuit and the third pixel circuit;
- each of the light-emitting units comprises one first light-emitting element, two second light-emitting elements, and one third light-emitting element;
- the first light-emitting element is connected to the first pixel circuit, and an orthographic projection of an anode of the first light-emitting element onto the base substrate is at least partially overlapped with an orthographic projection, onto the base substrate, of the pixel circuit group where the first pixel circuit is disposed;
- the two second light-emitting elements are both connected to the second pixel circuit, and orthographic projections of anodes of the two second light-emitting elements onto the base substrate are disposed on two opposite sides of an orthographic projection, onto the base substrate, of the pixel circuit group where the second pixel circuit is disposed, respectively; and
- the third light-emitting element is connected to the third pixel circuit, and an orthographic projection of an anode of the third light-emitting element onto the base substrate is at least partially overlapped with an orthographic projection, onto the base substrate, of the pixel circuit group where the third pixel circuit is disposed.

6. The display panel according to claim 5, wherein the orthographic projection of the anode of the first light-emitting element onto the base substrate is disposed within the orthographic projection, onto the base substrate, of the pixel circuit group where the first pixel circuit is disposed;
- the orthographic projections of the anodes of the two second light-emitting elements onto the base substrate is not overlapped with an orthographic projection, onto the base substrate, of the pixel circuit group where the second pixel circuit is disposed; and
- the orthographic projection of the anode of the third light-emitting element onto the base substrate is disposed within the orthographic projection, onto the base substrate, of the pixel circuit group where the third pixel circuit is disposed.

7. The display panel according to claim 5, wherein the first light-emitting element, the second light-emitting element, and the third light-emitting element are a blue light-emitting element, a green light-emitting element, and a red light-emitting element, respectively, and the first pixel circuit, the second pixel circuit, and the third pixel circuit of the pixel circuit unit in the first pixel circuit group are a pixel circuit for driving the blue light-emitting element, a pixel circuit for driving the green light-emitting element and a pixel circuit for driving the red light-emitting element, respectively; and
the first pixel circuit, the second pixel circuit, and the third pixel circuit of the pixel circuit unit in the second pixel circuit group are a pixel circuit for driving the blue light-emitting element, a pixel circuit for driving the green light-emitting element, and a pixel circuit for driving the red light-emitting element, respectively; or,
the first pixel circuit, the second pixel circuit, and the third pixel circuit of the pixel circuit unit in the second pixel circuit group are a pixel circuit for driving the red light-emitting element, a pixel circuit for driving the green light-emitting element, and a pixel circuit for driving the blue light-emitting element, respectively.

8. The display panel according to claim 5, wherein each of the metal signal lines in the first signal lines comprises a first portion, a second portion, and a third portion disposed between the first portion and the second portion, and two ends of the third portion are connected to the first portion and the second portion, respectively; and
- the first portion and the second portion are connected to pixel circuits in two adjacent pixel circuit groups, respectively, and an orthographic projection of the third portion onto the base substrate is at least partially overlapped with the orthographic projections of the anodes of the second light-emitting elements onto the base substrate.

9. The display panel according to claim 8, wherein the orthographic projection of the anode of one of the second light-emitting elements onto the base substrate is at least partially overlapped with orthographic projections of the third portions of at least two of the metal signal lines onto the base substrate, and overlapping portions between the third portions of the at least two metal signal lines and the anode of the second light-emitting element are arranged symmetrically along a symmetry axis of the anode of the second light-emitting element.

10. The display panel according to claim 5, wherein shapes of the anodes of the first light-emitting element, the second light-emitting element, and the third light-emitting element are all circular.

11. The display panel according to claim 5, wherein the anodes of the two second light-emitting elements are connected by a first connecting line, and the first connecting line is connected to the second pixel circuit.

12. The display panel according to claim 5, wherein types of the first signal lines comprise a first reset signal line, a second reset signal line, a first reset power supply line, a second reset power supply line, a third reset power supply line, a first gate signal line, a second gate signal line, a data signal line, a light emission control signal line and a driving power supply line;
each of the pixel circuits comprises:
a first transistor, wherein a gate of the first transistor is connected to the first reset signal line, a first pole of the first transistor is connected to the first reset power supply line, and a second pole of the first transistor is connected to a first node;
a second transistor, wherein a gate of the second transistor is connected to the first gate signal line, a first pole of the second transistor is connected to the first node, and a second pole of the second transistor is connected to a second node;
a third transistor, wherein a gate of the third transistor is connected to the second node, a first pole of the third transistor is connected to the first node, and a second pole of the third transistor is connected to a third node;
a fourth transistor, wherein a gate of the fourth transistor is connected to the second gate signal line, a first pole of the fourth transistor is connected to the data signal line, and a second pole of the fourth transistor is connected to the third node;

a fifth transistor, wherein a gate of the fifth transistor is connected to the light emission control signal line, a first pole of the fifth transistor is connected to the third node, and a second pole of the fifth transistor is connected to the driving power supply line;

a sixth transistor, wherein a gate of the sixth transistor is connected to the light emission control signal line, a first pole of the sixth transistor is connected to the first node, and a second pole of the sixth transistor is connected to an anode of a light-emitting element;

a seventh transistor, wherein a gate of the seventh transistor is connected to the second reset signal line, a first pole of the seventh transistor is connected to the second reset power supply line, and a second pole of the seventh transistor is connected to the anode of the light-emitting element;

an eighth transistor, wherein a gate of the eighth transistor is connected to the second reset signal line, a first pole of the eighth transistor is connected to the third reset power supply line, and a second pole of the eighth transistor is connected to the third node; and a storage capacitor, wherein two ends of the storage capacitor are connected to the driving power supply line and the second node, respectively.

13. The display panel according to claim 12, wherein the second transistor is an N-type transistor, and the first transistor, the third transistor, the fourth transistor, the fifth transistor, the sixth transistor, the seventh transistor, and the eighth transistor are all P-type transistors; or the second transistor is an oxide thin-film transistor, and the first transistor, the third transistor, the fourth transistor, the fifth transistor, the sixth transistor, the seventh transistor, and the eighth transistor are all low-temperature polysilicon thin-film transistors.

14. The display panel according to claim 12, wherein each pixel circuit unit corresponds to two first reset power supply lines, three second reset power supply lines, and one third reset power supply line;

for each pixel circuit unit, orthographic projections of the two first reset power supply lines onto the base substrate are at least partially overlapped with an orthographic projection of the first pixel circuit onto the base substrate and an orthographic projection of the third pixel circuit onto the base substrate, respectively, and the two first reset power supply lines are connected to the first pixel circuit and the third pixel circuit, respectively; the two first reset power supply lines are connected by a second connecting line, and the second connecting line is connected to the second pixel circuit, wherein an extending direction of the second connecting line is perpendicular to an extending direction of the first reset power supply lines;

orthographic projections of the three second reset power supply lines onto the base substrate are at least partially overlapped with the orthographic projection of the first pixel circuit onto the base substrate, the orthographic projection of the second pixel circuit onto the base substrate and the orthographic projection of the third pixel circuit onto the base substrate, respectively, and the three second reset power supply lines are connected to the first pixel circuit, the second pixel circuit and the third pixel circuit, respectively; and an orthographic projection of the third reset power supply line onto the base substrate is at least partially overlapped with the orthographic projection of the second pixel circuit onto the base substrate, and the third reset power supply line is connected to the second pixel circuit, and is connected to the first pixel circuit and the third pixel circuit by a third connecting line, wherein an extending direction of the third connecting line is perpendicular to an extending direction of the third reset power supply line.

15. The display panel according to claim 12, wherein in arrangement directions of the first pixel circuit, the second pixel circuit, and the third pixel circuit, an orientation of the first pixel circuit faces an orientation of the second pixel circuit;

each pixel circuit unit corresponds to two driving power supply lines; and for each of the pixel circuit units, an orthographic projection of one of the driving power supply lines onto the base substrate is at least partially overlapped with the orthographic projection of the first pixel circuit onto the base substrate and the orthographic projection of the second pixel circuit onto the base substrate, and the driving power supply line is connected to the first pixel circuit and the second pixel circuit; and an orthographic projection of another driving power supply line onto the base substrate is at least partially overlapped with the orthographic projection of the third pixel circuit onto the base substrate, and the another driving power supply line is connected to the third pixel circuit.

16. The display panel according to claim 1, wherein types of the first signal lines comprise at least two of a gate signal line, a light emission control signal line, a first reset signal line, a second reset signal line, a data signal line, a reset power supply line, and a driving power supply line.

17. The display panel according to claim 1, wherein the first signal lines of some types comprise at least one of a data signal line, a gate signal line, and a light emission control signal line.

18. The display panel according to claim 1, wherein each first signal line in the first signal lines of some types is the metal signal line; or each first signal line in the first signal lines of some types comprises the metal signal line and the transparent signal line connected in parallel.

19. A display device, comprising an optical sensor and a display panel, wherein the display panel comprises:

a base substrate provided with a first display region, wherein the first display region comprises a plurality of pixel circuit regions and a light-transmitting region;

a plurality of pixel circuit groups disposed in the plurality of pixel circuit regions, wherein each pixel circuit group comprises a plurality of pixel circuits and first signal lines of a plurality of types connected to the plurality of pixel circuits, a minimum distance between adjacent pixel circuit groups is greater than a minimum distance between adjacent pixel circuits in the pixel circuit group, the first signal lines of some types in the first signal lines of the plurality of types comprise metal signal lines, the first signal lines of other types comprise transparent signal lines, and at least part of line segments in the first signal lines of the plurality of types are disposed in the light-transmitting region; and a plurality of light-emitting units disposed in the first display region, wherein the plurality of pixel circuit groups is configured to drive the plurality of light-emitting units to emit light, and orthographic projections of at least part of the plurality of light-emitting units onto the base substrate are overlapped with orthographic projections, onto the base substrate, of the at least part of line segments in the first signal lines of the plurality of types disposed in the light-transmitting region, wherein the base substrate is further provided with a second display region adjacent to the first display region;

the display panel further comprises second signal lines of a plurality of types disposed in the second display region; and for each type of a first reset signal line, a second reset signal line, a first reset power supply line, a second reset power supply line, a third reset power supply line, a first gate signal line, a second gate signal line, a data signal line, a light emission control signal line and a driving power supply line, at least one end of each second signal line of the type is connected to the first signal line of the type, wherein the second signal line is a metal signal line, and a width of the metal signal line comprised in the first signal line is less than a width of the second signal line, and wherein an orthogonal projection of the optical sensor onto the display panel is at least partially overlapped with the first display region in the display panel.

* * * * *